United States Patent
Nakamura

(10) Patent No.: US 9,188,313 B2
(45) Date of Patent: Nov. 17, 2015

(54) LUMINOUS FLUX CONTROL MEMBER AND ILLUMINATION DEVICE

(75) Inventor: Masato Nakamura, Saitama (JP)

(73) Assignee: ENPLAS Corporation, Saitama (JP)

( * ) Notice: Subject to any disclaimer, the term of this patent is extended or adjusted under 35 U.S.C. 154(b) by 277 days.

(21) Appl. No.: 13/809,024

(22) PCT Filed: Jul. 7, 2011

(86) PCT No.: PCT/JP2011/003914
§ 371 (c)(1),
(2), (4) Date: Jan. 8, 2013

(87) PCT Pub. No.: WO2012/005008
PCT Pub. Date: Jan. 12, 2012

(65) Prior Publication Data
US 2013/0114254 A1    May 9, 2013

(30) Foreign Application Priority Data

| Jul. 8, 2010 | (JP) | 2010-155745 |
| Mar. 4, 2011 | (JP) | 2011-047704 |
| Apr. 5, 2011 | (JP) | 2011-083719 |
| Jun. 10, 2011 | (JP) | 2011-129749 |

(51) Int. Cl.
*F21V 1/00* (2006.01)
*F21V 13/04* (2006.01)
*F21V 5/04* (2006.01)
(Continued)

(52) U.S. Cl.
CPC . *F21V 13/04* (2013.01); *F21V 5/04* (2013.01); *F21V 7/0016* (2013.01); *G02B 19/0028* (2013.01); *G02B 19/0061* (2013.01); *G02B 19/0066* (2013.01); *G02B 19/0071* (2013.01); *F21Y 2101/02* (2013.01); *F21Y 2105/001* (2013.01); *H01L 33/58* (2013.01); *H01L 33/60* (2013.01)

(58) Field of Classification Search
CPC .............. F21K 9/50; F21V 5/04; F21V 5/046; H01L 33/58
USPC ................... 362/311.01, 311.02, 311.09, 235
See application file for complete search history.

(56) References Cited

U.S. PATENT DOCUMENTS

| 6,796,698 B2 | 9/2004 | Sommers et al. |
| 2006/0083000 A1* | 4/2006 | Yoon et al. ................... 362/311 |

(Continued)

FOREIGN PATENT DOCUMENTS

| JP | 2007-034307 A | 2/2007 |
| JP | 2007-048883 A | 2/2007 |

(Continued)

*Primary Examiner* — Evan Dzierzynski
(74) *Attorney, Agent, or Firm* — Brundidge & Stanger, P.C.

(57) ABSTRACT

Disclosed is a luminous flux control member (3) comprising: a lid section (8) positioned, via an air layer, over one or two or more light-emitting elements (2) positioned on top of a substrate (4), and formed so as to intersect with the optical axis of the light-emitting elements (2); and side wall sections (6) that extend from the outer edge of the lid section (8) towards the substrate (4) side. The inner surface (10) of the lid section (8) is a concave surface with the center section thereof positioned closer to the light-emitting elements (2) than the outer peripheral section, and is covered by a transparent reflective film (13). The transparent reflective film (13) reflects some of the light from the light-emitting elements (2) towards the side wall sections (6) and allows the remaining light from the light-emitting elements (2) to pass through.

9 Claims, 74 Drawing Sheets

(51) Int. Cl.
*F21V 7/00* (2006.01)
*G02B 19/00* (2006.01)
*H01L 33/58* (2010.01)
*H01L 33/60* (2010.01)
*F21Y 105/00* (2006.01)
*F21Y 101/02* (2006.01)

(56) References Cited

U.S. PATENT DOCUMENTS

2007/0024990 A1  2/2007  Paek et al.
2007/0070530 A1*  3/2007  Seo et al. .................. 359/819
2008/0074901 A1*  3/2008  David et al. ............... 362/612
2009/0040627 A1  2/2009  Paek et al.
2011/0141734 A1*  6/2011  Li et al. .................... 362/235

FOREIGN PATENT DOCUMENTS

JP   2008-216540 A   9/2008
JP      3148721 U    2/2009
JP   2010-003941 A   1/2010

* cited by examiner

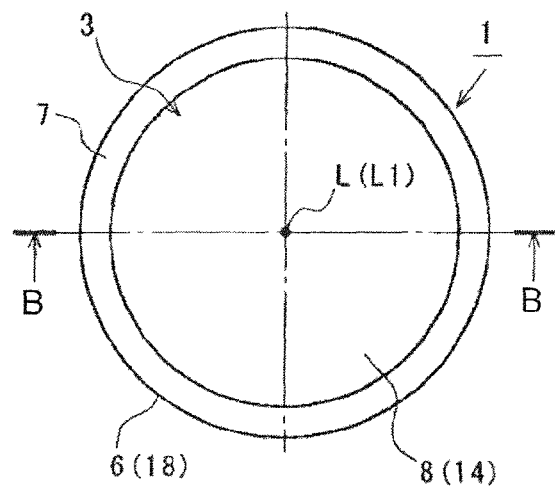
FIG.2A
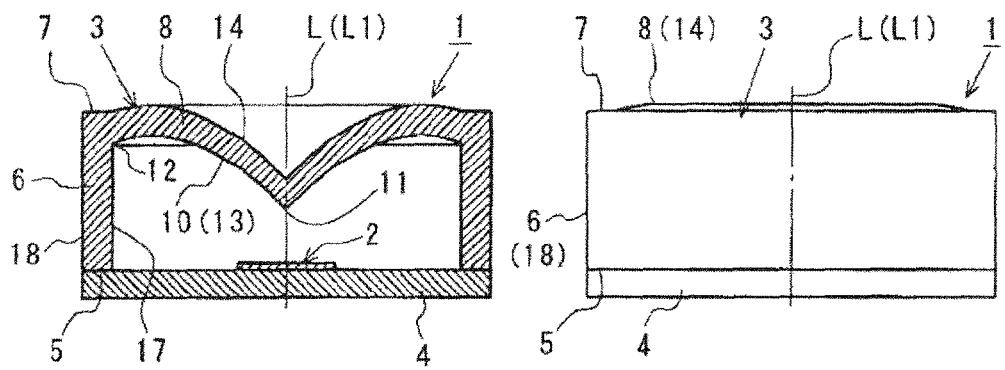
FIG.2C   FIB.2B
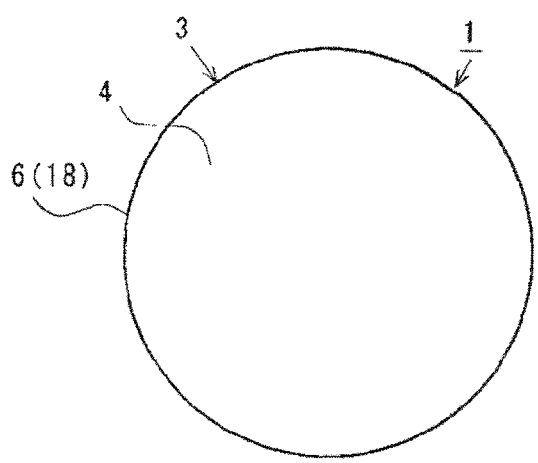
FIG.2D

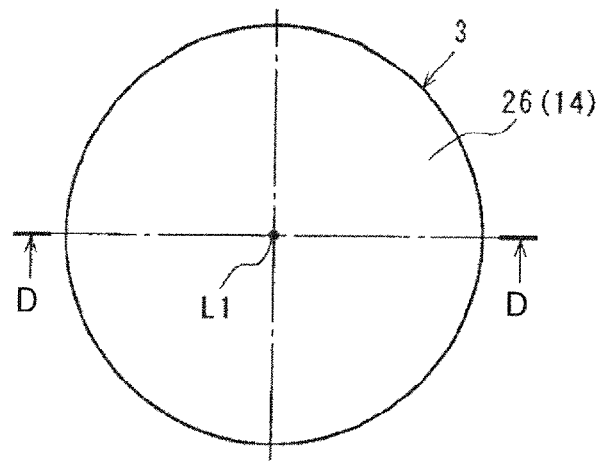
FIG.27B
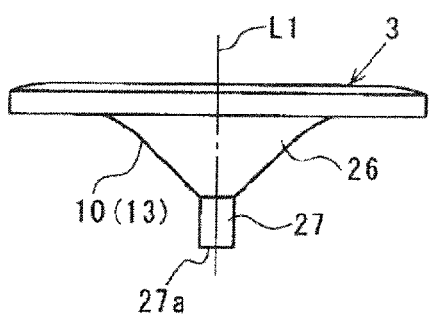     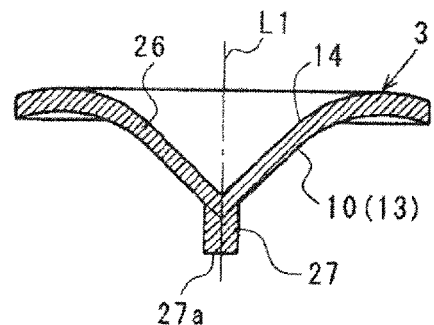
FIG.27A     FIG.27D
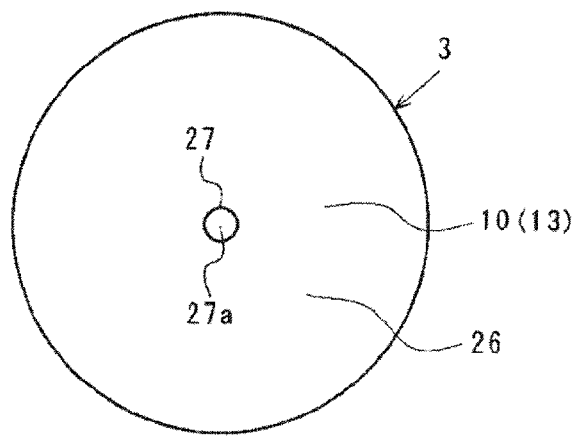
FIG.27C

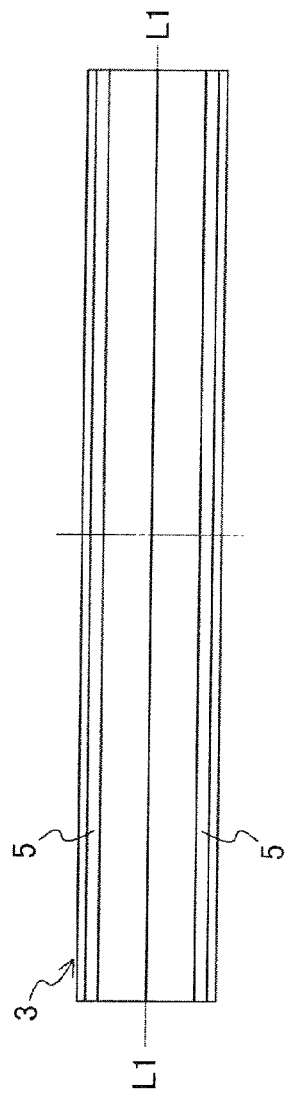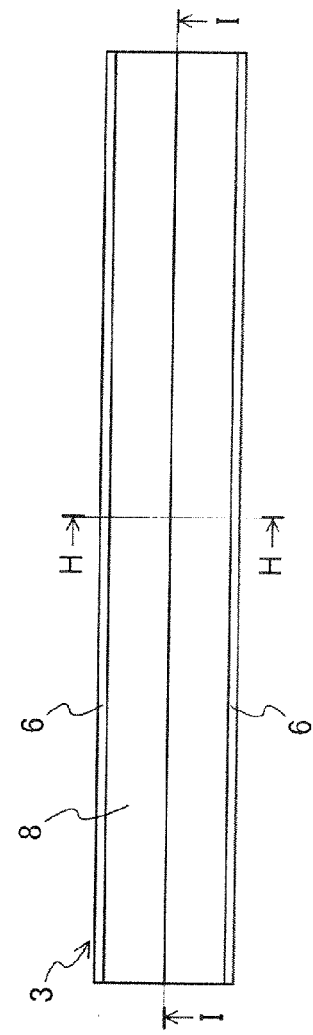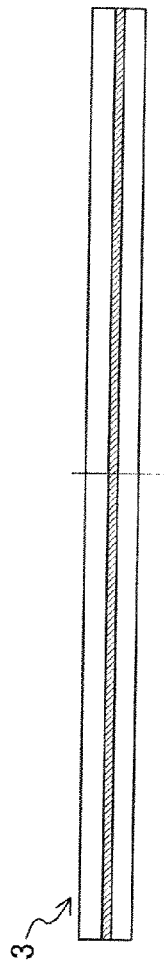

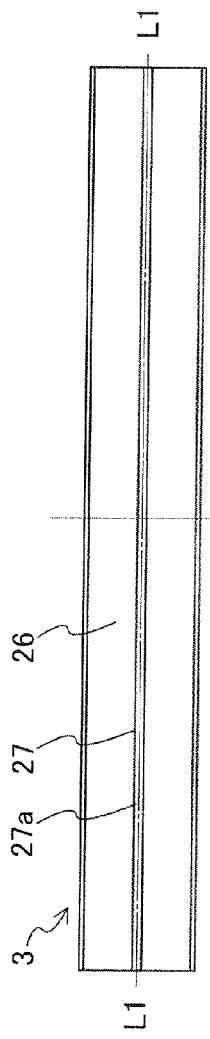
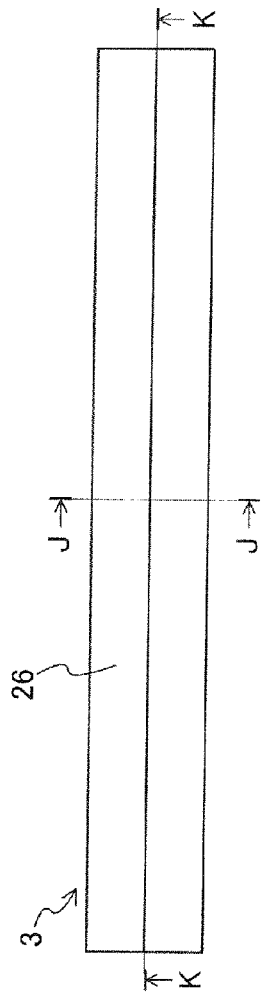
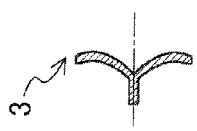
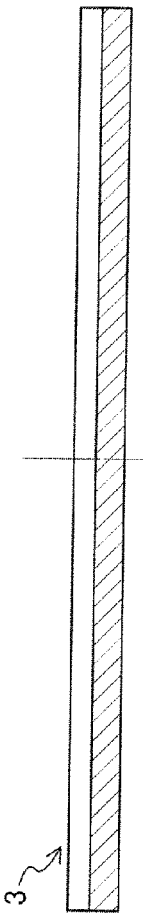
FIG.46A
FIG.46B
FIG.46C
FIG.46D

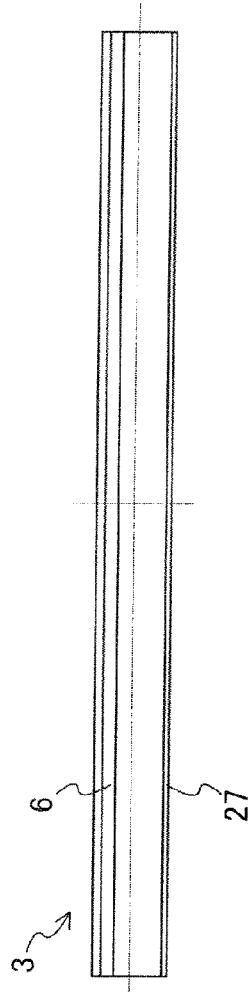
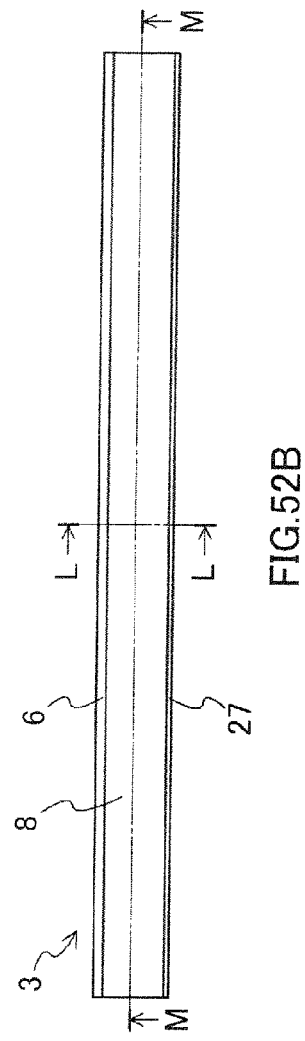
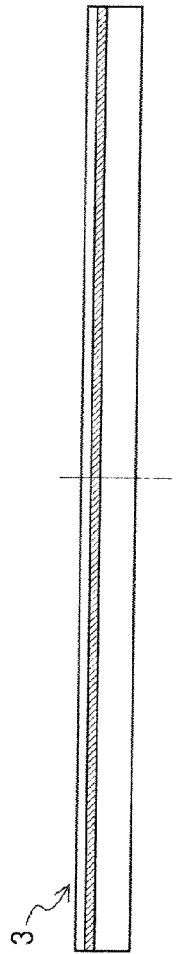

LUMINOUS FLUX CONTROL MEMBER AND ILLUMINATION DEVICE

TECHNICAL FIELD

The present invention relates to a light flux controlling member that controls the traveling direction of light emitted from a light emitting element. The present invention relates to an illumination device having the light flux controlling member, which can be used instead of an incandescent lamp or a fluorescent lamp.

BACKGROUND ART

Recently, from the viewpoint of energy saving or environmental conservation, illumination devices (such as LED bulbs or LED fluorescent lamps) using a light emitting diode (LED) as a light source have been used instead of incandescent lamps or fluorescent lamps.

However, a conventional illumination device using an LED as a light source can emit light only in the forward direction but cannot emit light in all directions like an incandescent lamp Or a fluorescent lamp. Accordingly, the conventional illumination device cannot extensively illuminate a room using reflected light from a ceiling or walls.

In order to make light distribution characteristics of such a conventional illumination device using an LED as a light source close to the light distribution characteristics of an incandescent lamp or a fluorescent lamp, it has been proposed that the traveling direction of light emitted from the LED is controlled by the use of a light flux controlling member (for example, see Patent Documents 1 to 3).

FIG. 1 is a diagram illustrating the configuration of a light direction converting element (light flux controlling member) described in Patent Document 1. FIG. 1A is a plan view of the light direction converting element and FIG. 1B is a cross-sectional view taken along line A-A of FIG. 1A. As shown in the drawing, light direction converting element 101 reflects light from LED 100 by the use of surface B (paraboloid of revolution) 102 and surface E (beveled inclined surface) 103, further reflects the light reflected by surface B 102 and surface E 103 by the use of surface D 104 (the surface of a board having LED 100 mounted thereon), and emits the light reflected by surface D 104 from surface B 102. Light direction converting element 101 emits the light reflected by surface B 102 and arriving at surface C 105 to an external oblique rear side (downside).

By controlling the traveling direction of light from LED 100 by the use of light direction converting element 101, it is possible to obtain emitted light in the upward direction (forward direction) and the horizontal direction (the direction perpendicular to the forward direction). Therefore, it can be thought that the light distribution characteristics are made to be close to the light distribution characteristics of an incandescent lamp or a fluorescent lamp, by applying the light direction converting element 101 to the conventional illumination device using an LED as a light source.

CITATION LIST

Patent Literature

PTL 1
Japanese Patent Application Laid-Open No. 2008-216540
PTL 2
Japanese Patent Application Laid-Open No. 2007-034307
PTL 3
Japanese Patent Application Laid-Open No. 2007-048883

SUMMARY OF INVENTION

Technical Problem

However, light direction converting element 101 shown in FIG. 1, out of light emitted from LED 100, light satisfying the total reflection condition with respect to B surface 102 is reflected by B surface 102 and light not satisfying the total reflection condition with respect to B surface 102 is transmitted by B surface 102. Therefore, when light direction converting element 101 shown in FIG. 1 is used, the light not satisfying the total reflection condition with respect to B surface 102 is color-separated at the time of passing through B surface 102. As a result, irregularity in color is caused which degrades the quality of illumination. Particularly, when the light-emitting area of LED 100 is too large to consider as a point light source, the ratio of light not satisfying the total reflection condition with respect to B surface 102 increases and the irregularity in color of emitted light is more easily caused.

Therefore, an object of the invention is to provide a light flux controlling member which can make light distribution characteristics closer to those of an incandescent lamp or a fluorescent lamp and an illumination device having the light flux controlling member.

Solution to Problem

According to an aspect of the invention, there is provided a light flux controlling member including: a cap that is to be disposed over one or two or more light emitting elements disposed on a board with an air layer interposed therebetween and that is configured to intersect an optical axis of the light-emitting element; and a sidewall configured to extend from an outer rim of the cap to the board, wherein: the inner surface of the cap is a concave surface of which the central part is located closer to the light emitting element than the outer circumference is; an inner surface of the cap is covered with a transflective film; the transflective film is configured to reflect a part of light from the light emitting element to the sidewall and transmit the other part of the light from the light emitting element; an outer surface of the cap is configured to emit light incident through the transflective film to the outside; and the sidewall is configured to emit light reflected by the transflective film and arriving at the inner surface of the sidewall and light directly arriving at the inner surface of the sidewall from the light emitting element from the outer surface of the sidewall to the outside.

According to another aspect of the invention, there is provided a light flux controlling member which is to be disposed over one or two or more light emitting elements disposed on a board with an air layer interposed therebetween, wherein: a transflective film is formed on a surface intersecting partial light of light emitted from the light emitting element; and the transflective film is configured to reflect a part of the partial light and transmit the other part of the partial light.

According to still another aspect of the invention, there is provided an illumination device including: a board on which one or two or more light emitting elements are disposed; a transflective part that is configured to intersect partial light of light emitted from the light emitting element and that is configured to reflect a part of the partial light and transmit the other part of the partial light; and a transmissive part configured to emit light reflected by the transflective part and light arriving directly from the light emitting element to the outside.

Advantageous Effects of Invention

Since the light flux controlling member according to the invention reflects a part of light from the light emitting element by the use of the transflective film and does not reflect the light from the light emitting element by total reflection, it is possible to prevent irregularity in color from occurring in emitted light and to extensively emit light from the sidewall.

The illumination device according to the invention can make the light distribution characteristics of illumination light close to the light distribution characteristics of an incandescent lamp or a fluorescent lamp. The illumination device according to the invention can emit illumination light with high quality and without irregularity in color.

BRIEF DESCRIPTION OF DRAWINGS

FIG. 2A is a plan view of an illumination device according to Embodiment 1, FIG. 2B is a front view of the illumination device according to Embodiment 1, FIG. 2C is a cross-sectional view taken along line B-B of FIG. 2A, and FIG. 2D is a bottom view of the illumination device according to Embodiment 1;

FIG. 27A is a front view of the illumination device according to Embodiment 11, FIG. 27B is a plan view of the illumination device according to Embodiment 11, FIG. 27C is a bottom view of the illumination device according to Embodiment 11, and FIG. 27D is a cross-sectional view taken along line D-D of FIG. 27A;

FIG. 40A is a bottom view of a light flux controlling member of the illumination device according to Embodiment 14, FIG. 40B is a plan view of the light flux controlling member of the illumination device according to Embodiment 14, FIG. 40C is a cross-sectional view taken along line H-H of FIG. 40B, and FIG. 40D is a cross-sectional view taken along line I-I of FIG. 40B;

FIG. 46A is a bottom view of a light flux controlling member of the illumination device according to Embodiment 15, FIG. 46B is a plan view of the light flux controlling member of the illumination device according to Embodiment 15, FIG. 46C is a cross-sectional view taken along line J-J of FIG. 46B, and FIG. 46D is a cross-sectional view taken along line K-K of FIG. 46B;

FIG. 52A is a bottom view of a light flux controlling member of the illumination device according to Embodiment 16, FIG. 52B is a plan view of the light flux controlling member of the illumination device according to Embodiment 16, FIG. 52C is a cross-sectional view taken along line L-L of FIG. 52B, and FIG. 52D is a cross-sectional view taken along line M-M of FIG. 52B;

DESCRIPTION OF EMBODIMENTS

Now, embodiments of the invention will be described in detail with reference to the accompanying drawings. In the following description, an illumination device (Embodiments 1 to 12) which can be used instead of an incandescent lamp, an illumination device (Embodiments 13 to 17) which can be used instead of a straight tube fluorescent lamp, and an illumination device (Embodiments 18 and 19) which can be used instead of a circular fluorescent lamp will be described as representative examples of the invention.

(Embodiment 1)

Configuration of Illumination Device

FIG. 2 is a diagram illustrating illumination device 1 according to Embodiment 1 of the invention. FIG. 2A is a plan view of illumination device 1, FIG. 2B is a front view of illumination device 1, FIG. 2C is a cross-sectional view taken along line B-B of FIG. 2A, and FIG. 2D is a bottom view of illumination device 1. Illumination device 1 can be used instead of an incandescent lamp.

As shown in FIG. 2, illumination device 1 includes light emitting element 2, light flux controlling member 3, and board 4. Illumination device 1 emits light from light emitting element 2 (for example, an LED or an LED sealed by a sealing member) through light flux controlling member 3. Light emitting element 2 and light flux controlling member 3 correspond to each other in a one-to-one manner. One end (opening end) 5 of light flux controlling member 3 is fixed to board 4 on which light emitting element 2 is mounted with an adhesive. Central axis L1 of light flux controlling member 3 is located coaxial with optical axis L of light emitting element 2. Here, "optical axis L of light emitting element 2" means the traveling direction of light at the center of a three-dimensional light flux emitted from light emitting element 2.

Configuration of Light Flux Controlling Member

Figure 1A:
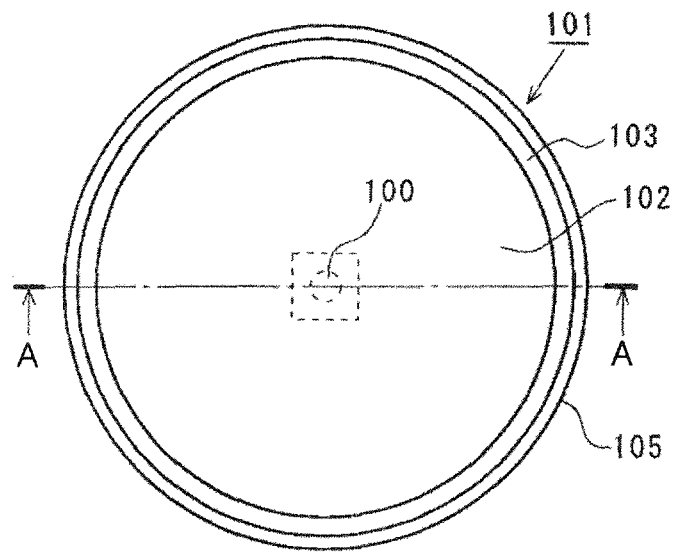
FIG. 1A is a plan view of a conventional light flux controlling member (light direction converting element) and FIG. 1B is a cross-sectional view taken along line A-A of FIG. 1A.
Figure 1B:
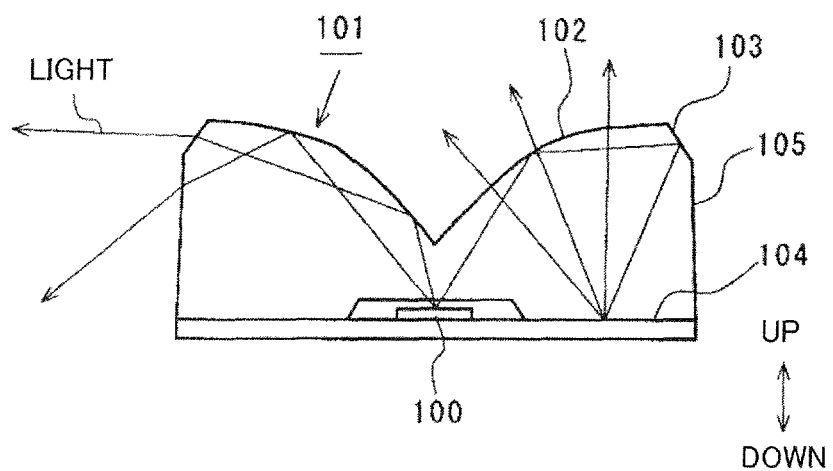
Figure 3A:
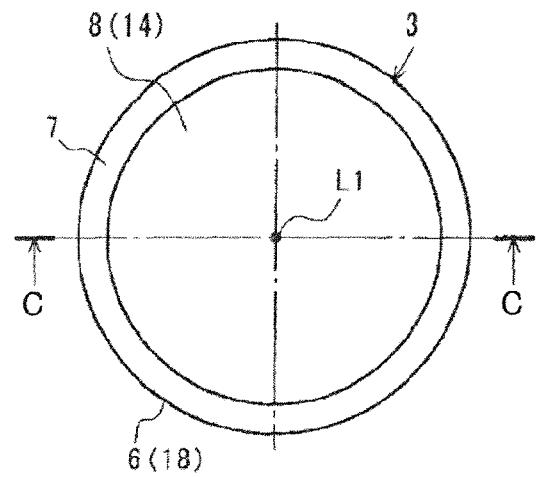
FIG. 3A is a plan view of a light flux controlling member of the illumination device according to Embodiment 1.
Figure 3C:
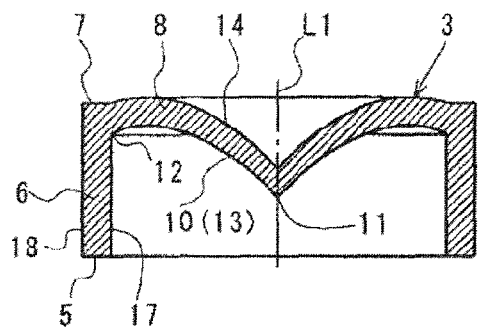
FIG. 3C is a cross-sectional view taken along line C-C of FIG. 3A.
Figure 3B:
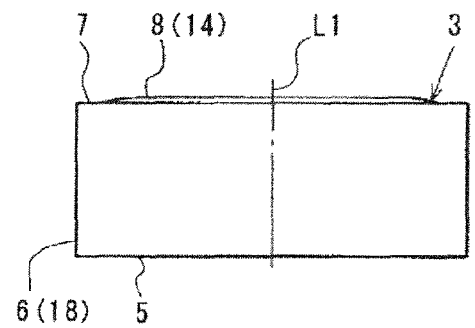
FIG. 3B is a front view of the light flux controlling member of the illumination device according to Embodiment 1.
Figure 3D:
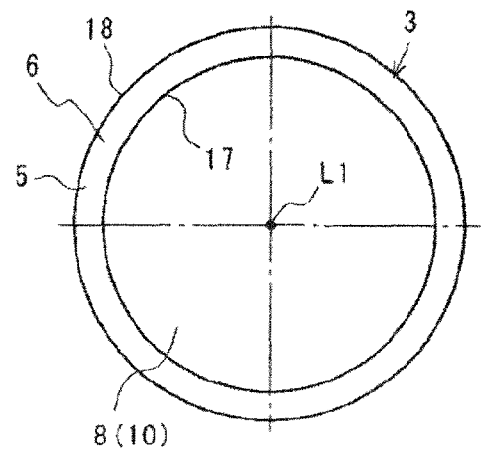
FIG. 3D is a bottom view of the light flux controlling member of the illumination device according to Embodiment 1.

FIG. 3A is a plan view of light flux controlling member 3, FIG. 3B is a front view of light flux controlling member 3, FIG. 3C is a cross-sectional view taken along line C-C of FIG. 3A, and FIG. 3D is a bottom view of light flux controlling member 3.

Light flux controlling member 3 is formed of a transparent resin material such as polymethylmethacrylate (PMMA), polycarbonate (PC), or epoxy resin (EP) or a transparent glass.

Light flux controlling member 3 is formed to have a circular planar shape. Central axis L1 of light flux controlling member 3 is matched with the drawing center of a planar shape. Light flux controlling member 3 includes cylindrical sidewall (supporting part: transmissive part) 6 of which one end 5 is fixed to board 4 and cap (light flux controlling member body: transflective part) 8 fixed to the other end 7 of sidewall 6.

Figure 4A:
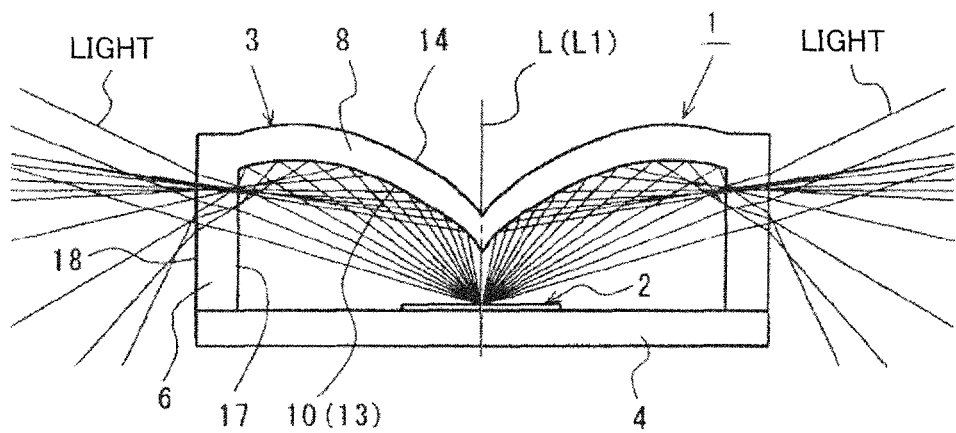
FIG. 4A is a schematic diagram illustrating a light reflecting function of a transflective film of the light flux controlling member and FIG. 4B is a schematic diagram illustrating a light transmitting function of the transflective film of the light flux controlling member.
Figure 4B:
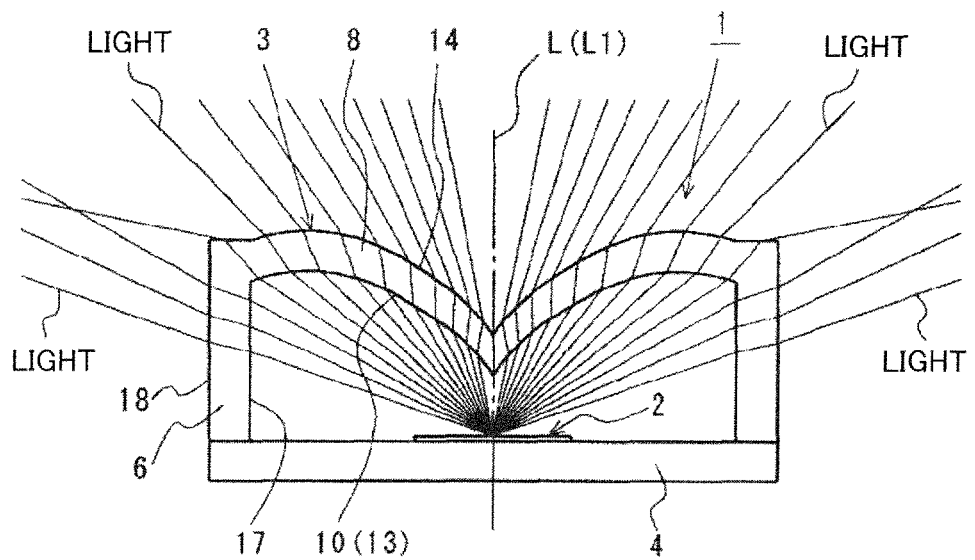

As shown in FIG. 3C, inner surface 10 of cap 8 is a concave surface (aspheric surface) in which central part 11 located on central axis L1 is located closer to one end 5 of sidewall 6 than outer circumference 12 is. Therefore, when light flux controlling member 3 is fixed onto board 4, central part 11 is located at a position closer to light emitting element 2 than outer circumference 12 is (see FIG. 2C). Inner surface 10 of cap 8 has a curved shape in which the inclination becomes slower from central part 11 of cap 8 to outer circumference 12 (to the outside in a radius direction). Inner surface 10 of cap 8 has an aspheric shape in which a point having an inclination angle of 0 appears at a position located between central part 11 and outer circumference 12 and closer to outer circumference 12. Transflective film 13 formed by stacking $TiO_2$ and $SiO_2$ layer on the surface thereof by deposition is formed on inner surface 10 of cap 8. The entire area of inner surface 10 of the cap is covered with transflective film 13. Transflective film 13 reflects a part of light from light emitting element 2 toward sidewall 6 and causes the other part of light from light emitting element 2 to enter the inside of cap 8 (see FIG. 4). The thickness of transflective film 13 is adjusted depending on requested optical reflectance. As the thickness of transflective film 13 becomes larger, the optical reflectance becomes higher.

Outer surface 14 of cap 8 has a double-sided relation with inner surface 10 and is formed so that the thickness along central axis L1 of cap 8 is constant from central part 11 to outer circumference 12. Outer surface 14 of cap 8 extensively emit light entering the inside of cap 8 through transflective film 13 to the outside (see FIG. 4B).

Sidewall 6 is disposed along central axis L1 to surround central axis L1. Sidewall 6 is located between the outer rim of cap 8 and board 4. Sidewall 6 is formed to have a constant inner diameter from one end 5 to the other end 7 and to have a constant thickness. Sidewall 6 extensively emits light, which is reflected by transflective film 13 of cap 8 and arrives thereat out of light emitted from light emitting element 2, and light, which directly arrives thereat out of light emitted from light emitting element 2, to the outside (see FIG. 4A).

Figure 5:
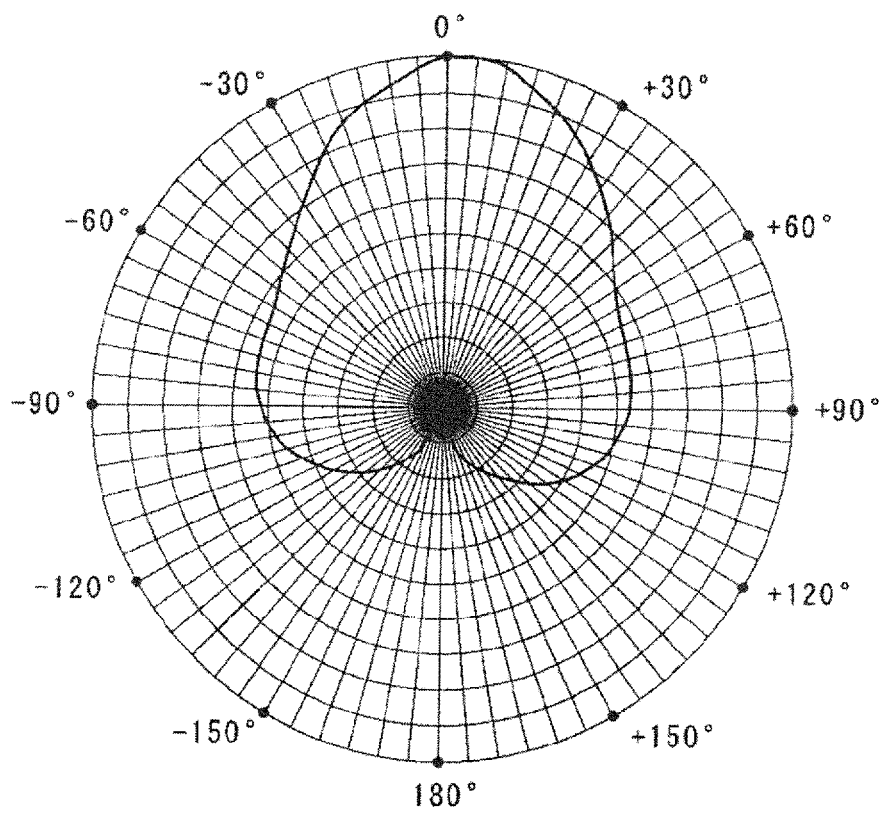
FIG. 5 is a graph illustrating the light distribution characteristics of the illumination device according to Embodiment 1 when optical reflectance of the transflective film is 55%.
Figure 6:
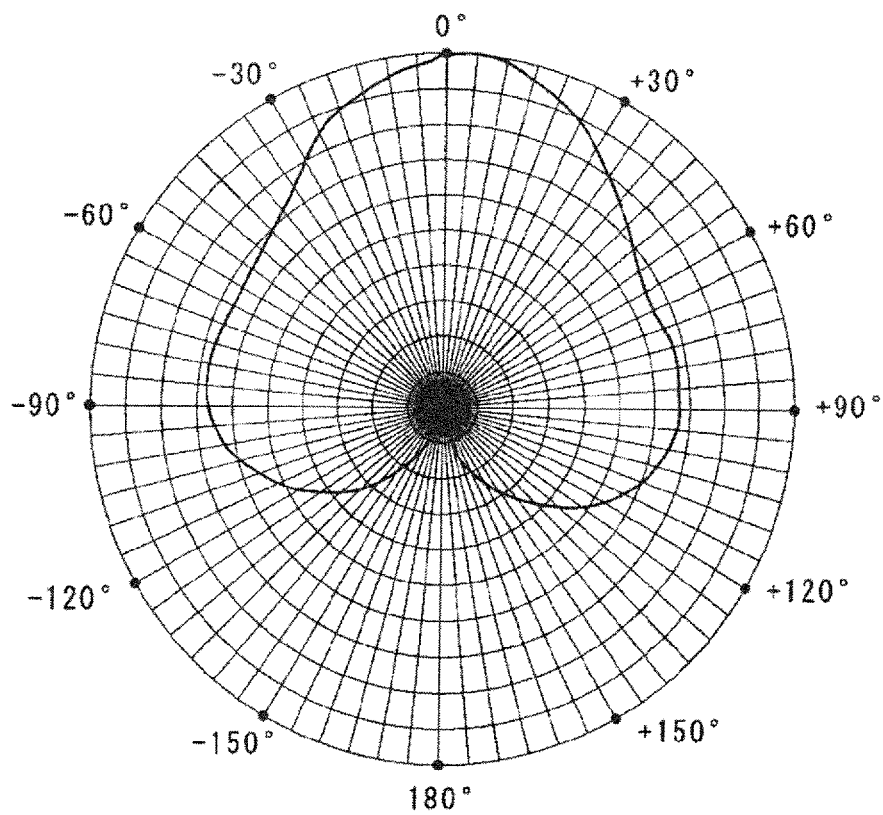
FIG. 6 is a graph illustrating light distribution characteristics of the illumination device according to Embodiment 1 when optical reflectance of the transflective film is 65%.
Figure 7:
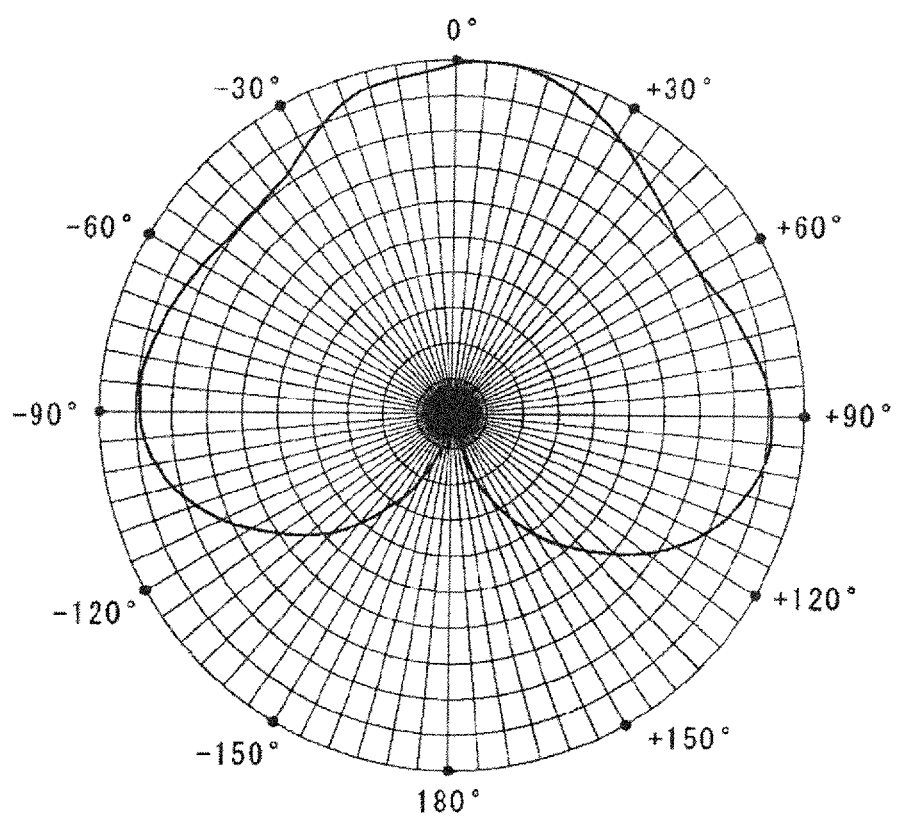
FIG. 7 is a graph illustrating light distribution characteristics of the illumination device according to Embodiment 1 when optical reflectance of the transflective film is 75%.
Figure 8:
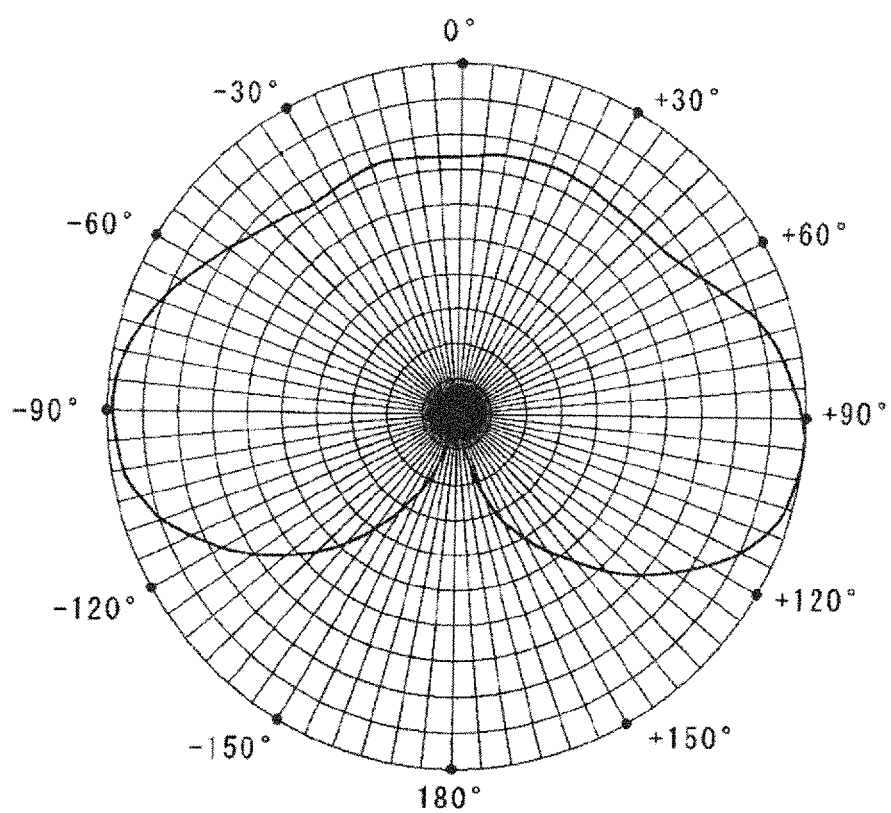
FIG. 8 is a graph illustrating light distribution characteristics of the illumination device according to Embodiment 1 when optical reflectance of the transflective film is 85%.

FIGS. 5 to 8 are graphs illustrating the light distribution characteristics of illumination device 1. FIG. 5 is a graph illustrating the light distribution characteristics of illumination device 1 when the optical reflectance of transflective film 13 is 55%. FIG. 6 is a graph illustrating the light distribution characteristics of illumination device 1 when the optical reflectance of transflective film 13 is 65%. FIG. 7 is a graph illustrating the light distribution characteristics of illumination device 1 when the optical reflectance of transflective film 13 is 75%. FIG. 8 is a graph illustrating the light distribution characteristics of illumination device 1 when the optical reflectance of transflective film 13 is 85%.

Figure 9:
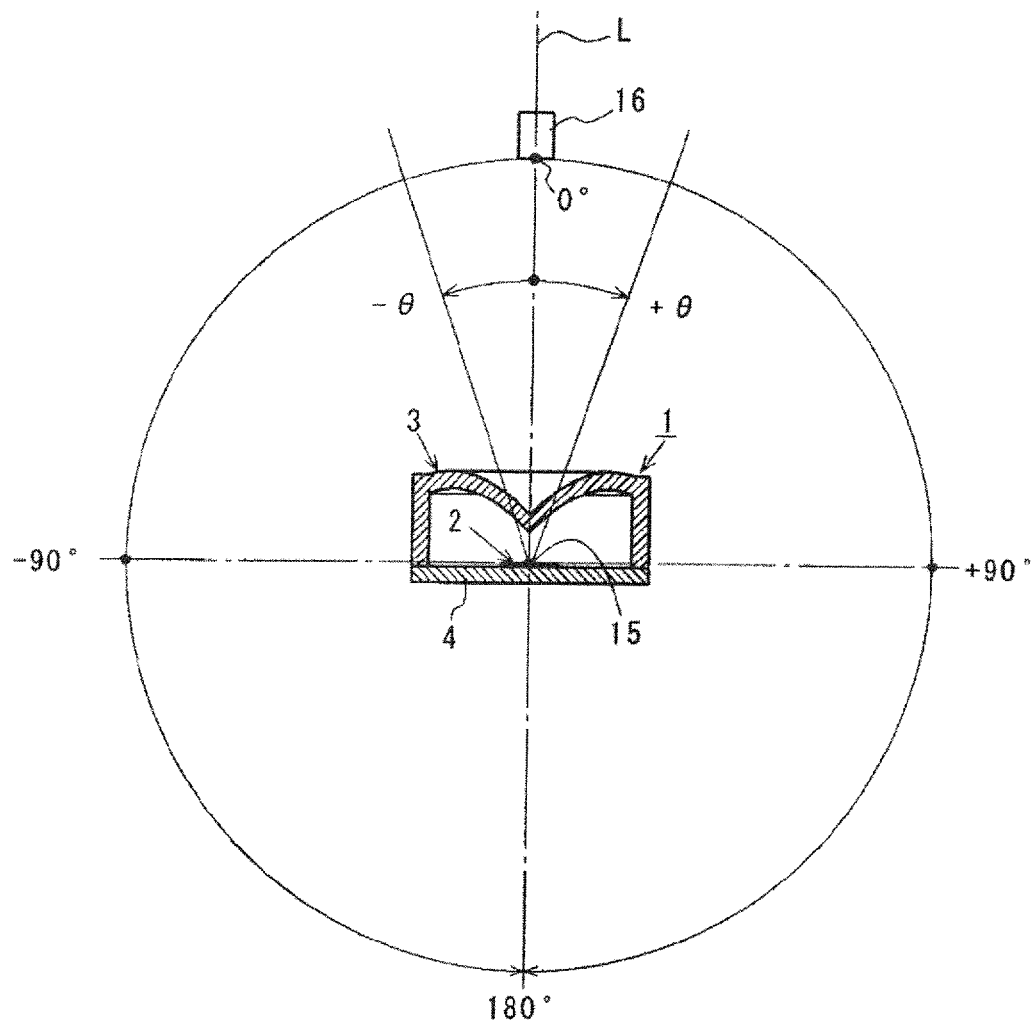
FIG. 9 is a diagram illustrating a method of measuring the light distribution characteristics of the illumination device.

The light distribution characteristics are measured in the following order. As shown in FIG. 9, illuminometer 16 is disposed at a position (reference position 0°) apart by a predetermined distance along optical axis L from emission center of light emitting element 2. Illuminometer 16 measures illuminance while rotating by 180° at intervals of 5° in a clockwise direction (in the +θ direction) about emission center 15 of light emitting element 2, and measures illuminance while rotating by 180° at intervals of 5° in a counterclockwise direction (in the −θ direction). Relative illuminance values (dimensionless values) when the maximum illuminance of the measured illuminance values is set to 1 are smoothly connected to form a curve, whereby the graphs of FIGS. 5 to 8 are created.

As shown in FIGS. 5 to 8, as the reflectance of transflective film 13 formed on inner surface 10 of cap 8 of light flux controlling member 3 becomes larger, the illuminance in the horizontal direction (in the ±90° direction) and in the backward direction (+90°<θ<+180° and −90°<θ<−180°) becomes higher. In the light distribution characteristics shown in FIGS.

5 to 7, the illuminance in the forward direction)(θ=0°) is the largest. On the contrary, in the light distribution characteristics shown in FIG. 8, the illuminance in the horizontal direction (in the ±90° direction) is larger than the illuminance in the forward direction) (θ=0°), and is different from the illuminance balance indicated by the light distribution characteristics shown in FIGS. 5 to 7.

In this way, the light distribution characteristics of illumination device 1 differ depending on the reflectance of transflective film 13 formed in inner surface 10 of cap 8 of light flux controlling member 3. Accordingly, the reflectance of transflective film 13 is selected depending on the usage of illumination device 1, and transflective film 13 is deposited on inner surface 10 of cap 8 of light flux controlling member 3 so as to achieve the selected reflectance.

Here, when the reflectance of transflective film 13 of light flux controlling member 3 is 75%, the light distribution characteristics (the light distribution characteristics shown in FIG. 7) of illumination device 1 including light flux controlling member 3 according to Embodiment 1 is closest to the light distribution characteristics of an incandescent lamp. Accordingly, when illumination device 1 having light flux controlling member 3 according to Embodiment 1 is used as indoor lighting instead of an incandescent lamp, it is preferable that the reflectance of transflective film 13 of light flux controlling member 3 be set to 75%.

Advantages

Light flux controlling member 3 according to Embodiment 1 reflects a part of light from light emitting element 2 by the use of transflective film 13 formed on inner surface 10 of cap 8, and emits the other (light not reflected by transflective film 13) of light from light emitting element 2 from outer surface 14 of cap 8 by the use of transflective film 13 formed on inner surface 10 of cap 8. In this way, since light flux controlling member 3 according to Embodiment 1 does not reflect light from light emitting element 2 by total reflection of cap 8, the light emitted from cap 8 does not cause color separation and thus degradation in quality of illumination due to the irregularity in color is not caused.

Illumination device 1 according to Embodiment 1 emits light from light emitting element 2, which is reflected by transflective film 13 formed on inner surface 10 of cap 8 and arrives at inner surface 17 of sidewall 6, and light, which directly arrives at inner surface 17 of sidewall 6 from light emitting element 2, from outer surface 18 of sidewall 6. Illumination device 1 according to Embodiment 1 emits light from light emitting element 2, which is transmitted by transflective film 13 formed on inner surface 10 of cap 8 and is incident on cap 8, from outer surface 14 of cap 8. In this way, since light flux controlling member 3 according to Embodiment 1 can satisfactorily distribute light in the horizontal direction and the backward direction in addition to the forward direction, it is possible to make the light distribution characteristics close to those of an incandescent lamp.

Illumination device 1 according to Embodiment 1 does not cause the degradation in quality of illumination due to the irregularity in color and thus can be used for indoor illumination instead of an incandescent lamp. Illumination device 1 according to Embodiment 1 can reduce power consumption in comparison with an incandescent lamp and can be used for a longer time than the incandescent lamp.

Outer surface 18 of sidewall 6 of light flux controlling member 3 and/or outer surface 14 of cap 8 may be formed of a light diffusion surface (a surface subjected to a light diffusion process such as a source roughening process). By employing this configuration, it is possible to extensively diffuse light emitted from sidewall 6 and/or cap 8.

Light flux controlling member 3 may be formed of a material having a light diffusion function. By employing this configuration, it is possible to scatter light in the inside of light flux controlling member 3 and to extensively diffuse light emitted from sidewall 6 and cap 8.

Transflective film 13 may be formed through a method other than a deposition method. For example, transflective film 13 formed in a film shape in advance may be bonded to inner surface 10 of cap 8.

Transflective film 13 may not be a multi-layered film of $TiO_2$ and $SiO_2$. For example, transflective film 13 may be a multi-layered dielectric film such as a multi-layered film of $ZnO_2$ and $SiO_2$ or a multi-layered film of $Ta_2O_2$ and $SiO_2$. Transflective film 13 may be a thin metal film of aluminum (Al) or the like from which a necessary amount of transmitted light is obtained.

The optical reflectance of transflective film 13 may be adjusted by means other than the adjustment of the thickness of transflective film 13. For example, by forming a reflective area in patterns such as dot shapes or mesh shapes and adjusting the area ratio of the transmissive area and the reflective area, desired optical reflectance may be obtained. The optical reflectance of the reflective area may be adjusted by the use of the thickness.

The method of fixing light flux controlling member 3 to board 4 is not limited to the fixation using an adhesive. For example, light flux controlling member 3 and board 4 may be fixed using another member such as a case. Light flux controlling member 3 and board 4 may be fixed using welding or a screw fixing mechanism, or the like.

A part of inner surface 10 of cap 8 of light flux controlling member 3 may be formed in an inclined plane or a plane.

(Embodiment 2)

Figure 10:
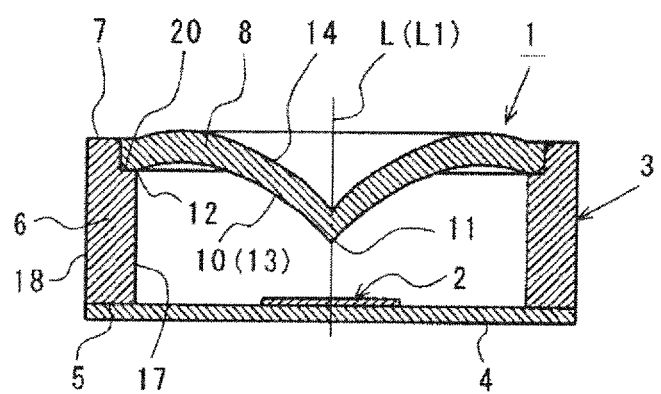
FIG. 10 is a cross-sectional view of an illumination device according to Embodiment 2.

FIG. 10 is a cross-sectional view of illumination device 1 and light flux controlling member 3 according to Embodiment 2 (corresponding to FIG. 2C). The same elements as those of illumination device 1 and light flux controlling member 3 according to Embodiment 1 shown in FIG. 2 will not be described.

As shown in FIG. 10, light flux controlling member 3 according to Embodiment 2 is different from light flux controlling member 3 according to Embodiment 1, in that sidewall 6 and cap 8 are formed of different members, respectively. Sidewall 6 and cap 8 are formed separately. Thereafter, by inserting cap 8 into a ring-like concave portion 20 formed on the upper end of sidewall 6 and fixing them (for example, by bonding or welding), sidewall 6 and cap 8 are formed as a unified body.

When light flux controlling member 3 according to Embodiment 2 is fabricated, only cap 8 can be put into a deposition processing chamber and transflective film 13 can be formed on inner surface 10 thereof. Accordingly, light flux controlling member 3 according to Embodiment 2 can be fabricated more efficiently than light flux controlling member 3 according to Embodiment 1. When light flux controlling member 3 according to Embodiment 1 is fabricated, preliminary treatment (masking) has to be performed so as not to form transflective film 13 on inner peripheral surface 17 of sidewall 6.

Figure 11:
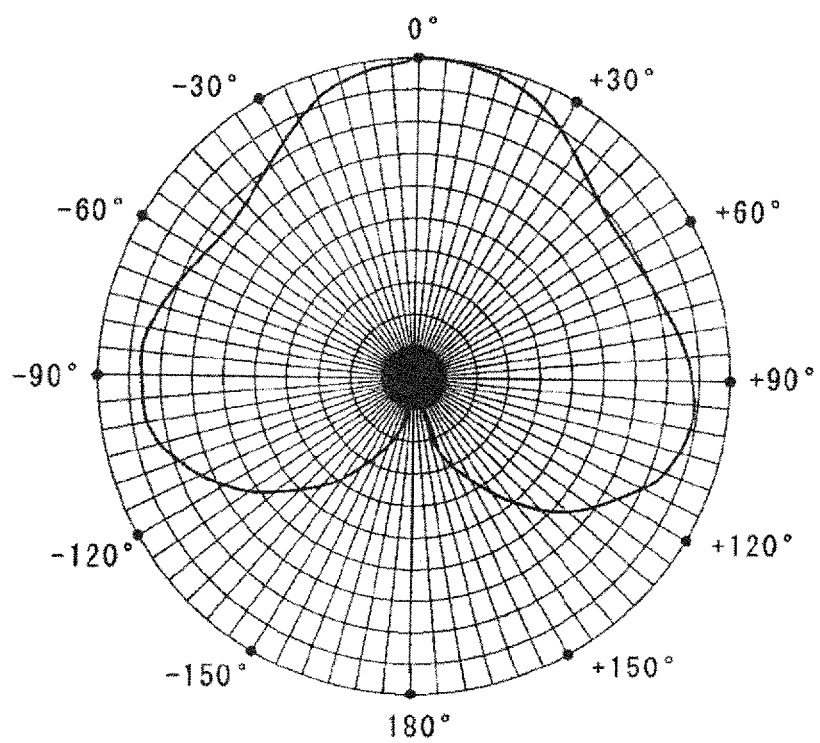
FIG. 11 is a graph illustrating the light distribution characteristics of the illumination device according to Embodiment 2.

As shown in FIG. 11, illumination device 1 according to Embodiment 2 exhibits almost the same light distribution characteristics as the light distribution characteristics (see FIG. 7) of illumination device 1 according to Embodiment 1 and it is thus possible to obtain the same advantages as those of illumination device 1 according to Embodiment 1 . The reflectance of transflective film 13 formed on inner surface 10 of cap 8 is adjusted to 75%.

(Embodiment 3)

Figure 12:
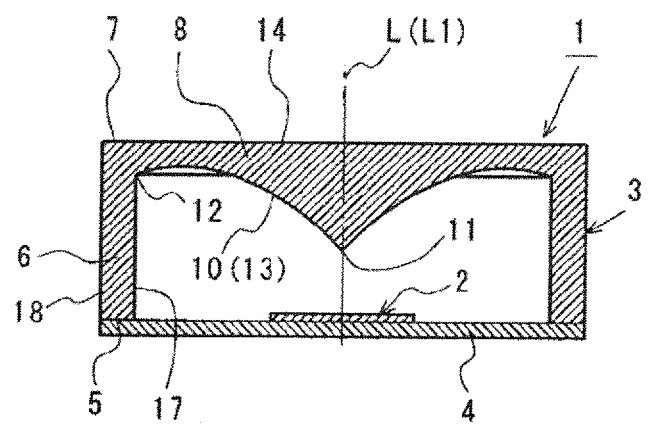
FIG. 12 is a cross-sectional view of an illumination device according to Embodiment 3.

FIG. 12 is a cross-sectional view of illumination device 1 and light flux controlling member 3 according to Embodiment 3 (corresponding to FIG. 2C). The same elements as those of illumination device 1 and light flux controlling member 3 according to Embodiment 1 shown in FIG. 2 will not be described.

As shown in FIG. 12, light flux controlling member 3 according to Embodiment 3 is different from light flux controlling member 3 according to Embodiment 1, in that outer surface 14 of cap 8 is a plane perpendicular to optical axis L.

Figure 13:
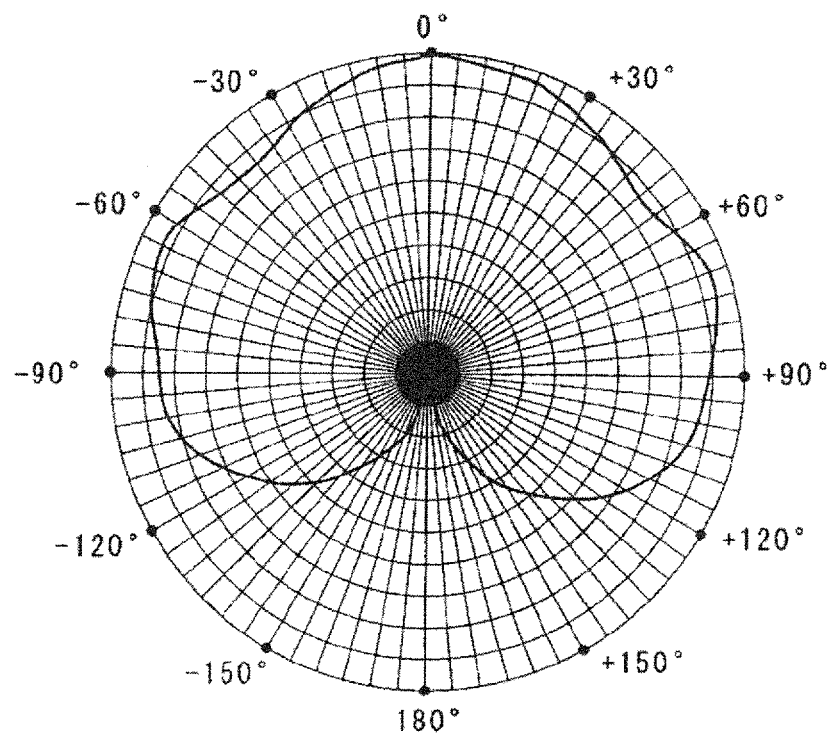
FIG. 13 is a graph illustrating the light distribution characteristics of the illumination device according to Embodiment 3.

As shown in FIG. 13, illumination device 1 according to Embodiment 3 exhibits almost the same light distribution characteristics as the light distribution characteristics (see FIG. 7) of illumination device 1 according to Embodiment 1, except that the illuminance of the oblique front side increases, and it is thus possible to obtain the same advantages as those of illumination device 1 according to Embodiment 1 . The reflectance of transflective film 13 formed on inner surface 10 of cap 8 is adjusted to 75%.

(Embodiment 4)

Figure 14:
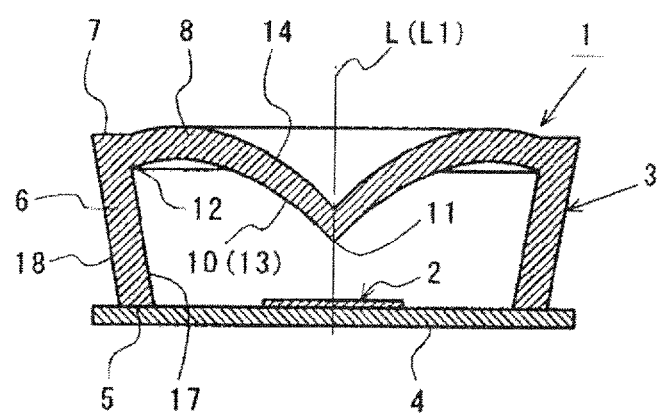
FIG. 14 is a cross-sectional view of an illumination device according to Embodiment 4.

FIG. 14 is a cross-sectional view of illumination device 1 and light flux controlling member 3 according to Embodiment 4 (corresponding to FIG. 2C). The same elements as those of illumination device 1 and light flux controlling member 3 according to Embodiment 1 shown in FIG. 2 will not be described.

As shown in FIG. 14, light flux controlling member 3 according to Embodiment 4 is different from light flux controlling member 3 according to Embodiment 1, in the shape of sidewall 6. That is, in light flux controlling member 3 according to Embodiment 4, the shape of sidewall 6 is formed in a reversely-tapered shape so that the inner diameter of lower end 5 of sidewall 6 is smaller than the inner diameter in a connecting part (outer circumference 12 of cap 8) of sidewall 6 and cap 8.

Figure 15:
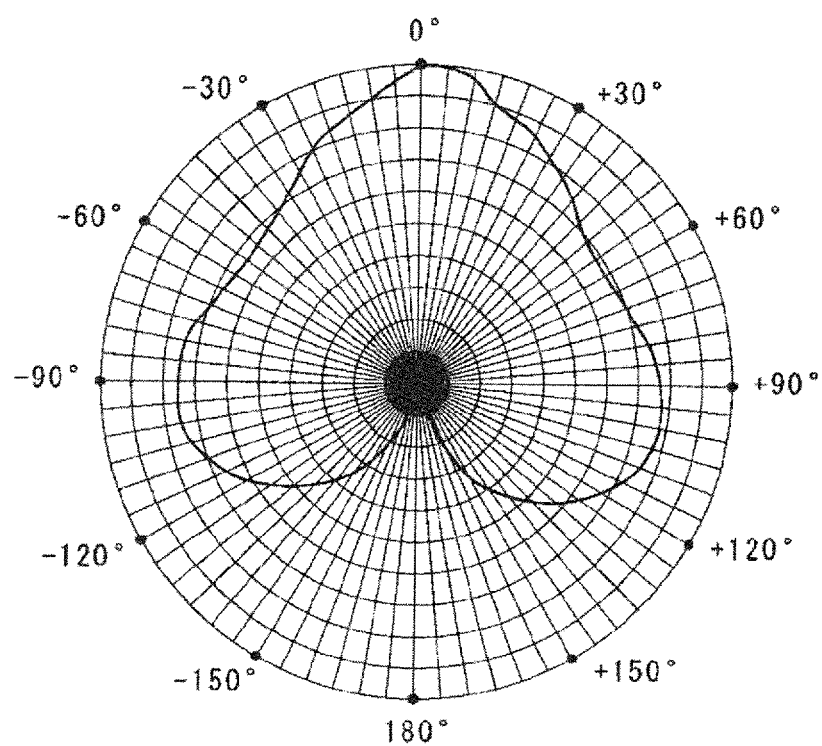
FIG. 15 is a graph illustrating the light distribution characteristics of the illumination device according to Embodiment 4.

As shown in FIG. 15, illumination device 1 according to Embodiment 4 exhibits almost the same light distribution characteristics as the light distribution characteristics (see FIG. 7) of illumination device 1 according to Embodiment 1, except that the illuminance of the oblique front side decreases, and it is thus possible to obtain the same advantages as those of illumination device 1 according to Embodiment 1 . The reflectance of transflective film 13 formed on inner surface 10 of cap 8 is adjusted to 75%.

Light flux controlling member 3 according to Embodiment 4 may be fabricated by fixing sidewall 6 and cap 8 which are separately formed, similarly to light flux controlling member 3 according to Embodiment 2.

(Embodiment 5)

Figure 16:
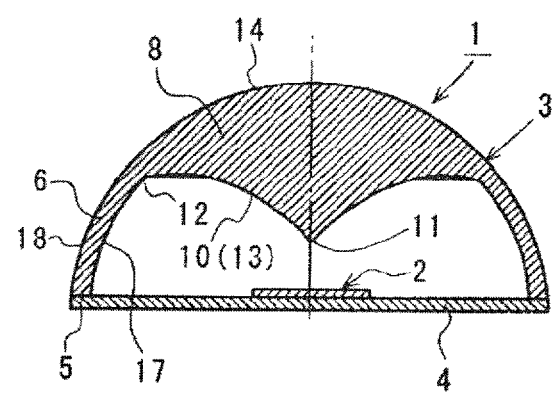
FIG. 16 is a cross-sectional view of an illumination device according to Embodiment 5.

FIG. 16 is a cross-sectional view of illumination device 1 and light flux controlling member 3 according to Embodiment 5 (corresponding to FIG. 2C). The same elements as those of illumination device 1 and light flux controlling member 3 according to Embodiment 1 shown in FIG. 2 will not be described.

As shown in FIG. 16, light flux controlling member 3 according to Embodiment 5 is different from light flux controlling member 3 according to Embodiment 1, in that outer peripheral surface 18 of sidewall 6 and outer surface 14 of the cap are configured to form a continuous semi-spherical surface. Inner peripheral surface 17 of sidewall 6 is configured to form a part of a semi-spherical surface coaxial with outer peripheral surface 18 of sidewall 6.

Figure 17:
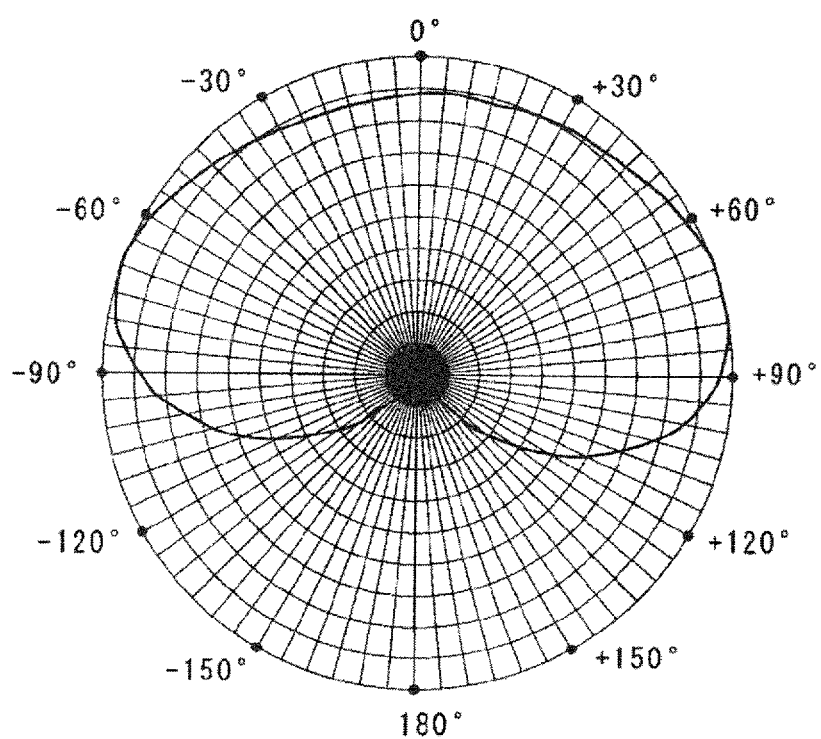
FIG. 17 is a graph illustrating the light distribution characteristics of the illumination device according to Embodiment 5.

As shown in FIG. 17, illumination device 1 according to Embodiment 5 exhibits almost the same light distribution characteristics as the light distribution characteristics (see FIG. 8) of illumination device 1 according to Embodiment 1, except that the illuminance of the front side decreases, and it is thus possible to obtain the same advantages as those of illumination device 1 according to Embodiment 1 . The reflectance of transflective film 13 formed on inner surface 10 of cap 8 is adjusted to 75%.

(Embodiment 6)

Figure 18:
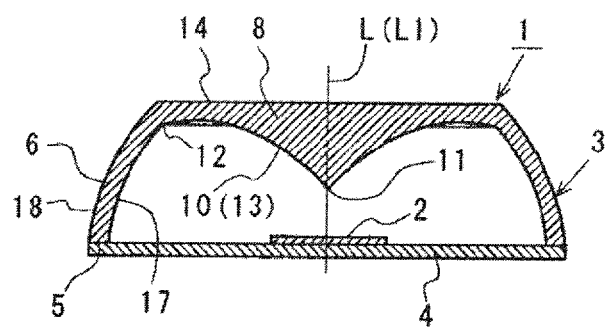
FIG. 18 is a cross-sectional view of an illumination device according to Embodiment 6.

FIG. 18 is a cross-sectional view of illumination device 1 and light flux controlling member 3 according to Embodiment 6 (corresponding to FIG. 2C). Illumination device 1 and light flux controlling member 3 according to Embodiment 6 are modified examples of illumination device 1 and light flux controlling member 3 according to Embodiment 5 . The same elements as those of illumination device 1 and light flux controlling member 3 according to Embodiment 5 shown in FIG. 16 will not be described.

As shown in FIG. 18, light flux controlling member 3 according to Embodiment 6 is different from light flux controlling member 3 according to Embodiment 5, in that outer surface 14 of cap 8 is a plane intersecting optical axis L at right angle. In this way, by cutting cap 8 with a virtual plane perpendicular to optical axis L and removing the upper part of cap 8, it is possible to reduce the height of light flux controlling member 3.

Illumination device 1 according to Embodiment 6 can achieve the same advantages as those of illumination device 1 according to Embodiment 5.

(Embodiment 7)

Figure 19:
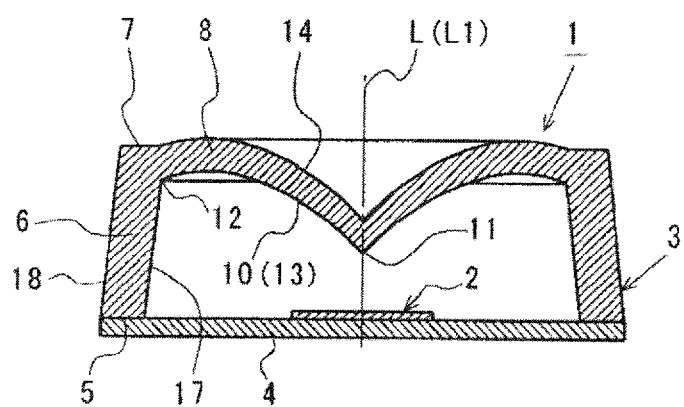
FIG. 19 is a cross-sectional view of an illumination device according to Embodiment 7.

FIG. 19 is a cross-sectional view of illumination device 1 and light flux controlling member 3 according to Embodiment 7 (corresponding to FIG. 2C). Illumination device 1 and light flux controlling member 3 according to Embodiment 7 are modified examples of illumination device 1 and light flux controlling member 3 according to Embodiment 1 . Accordingly, the same elements as those of illumination device 1 and light flux controlling member 3 according to Embodiment 1 shown in FIG. 2 will not be described.

As shown in FIG. 19, light flux controlling member 3 according to Embodiment 7 is different from light flux controlling member 3 according to Embodiment 1, in the shape of sidewall 6. That is, in light flux controlling member 3 according to Embodiment 4, sidewall 6 has a tapered shape so that the inner diameter of lower end 5 of sidewall 6 is larger than the inner diameter of the connecting portion (outer circumference 12 of cap 8) of sidewall 6 and cap 8. In this way, by forming sidewall 6 in a tapered shape, it is possible to easily release light flux controlling member 3 from a mold when fabricating light flux controlling member 3 through injection molding.

Illumination device 1 according to Embodiment 7 can achieve the same advantages as those of illumination device 1 according to Embodiment 1.

(Embodiment 8)

Figure 20:
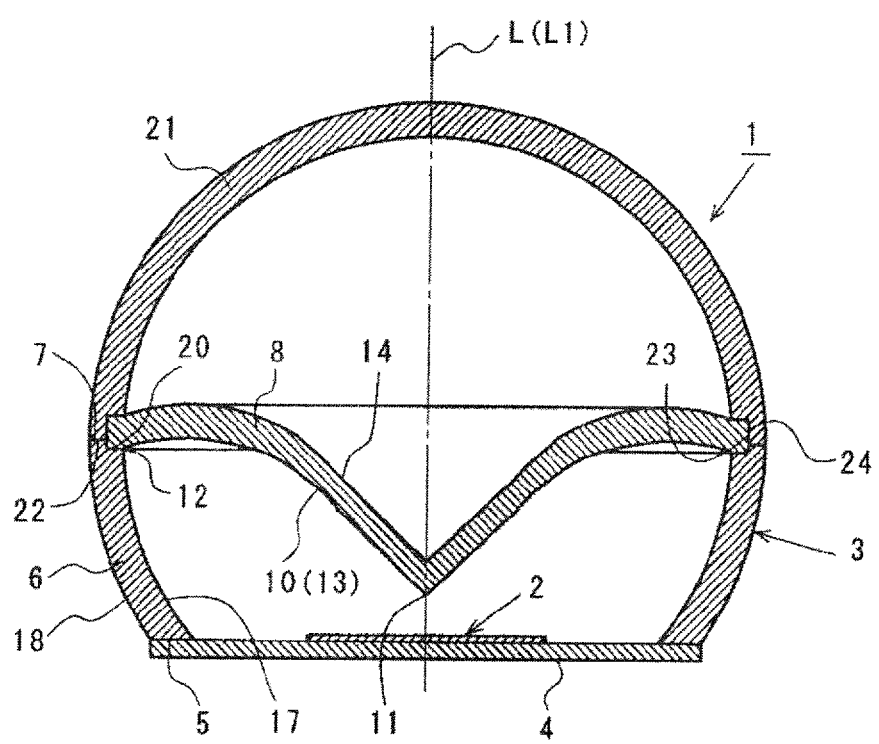
FIG. 20 is a cross-sectional view of an illumination device according to Embodiment 8.

FIG. 20 is a cross-sectional view of illumination device 1 and light flux controlling member 3 according to Embodiment 8 (corresponding to FIG. 2C). Illumination device 1 and light flux controlling member 3 according to Embodiment 8 are modified examples of illumination device 1 and light flux controlling member 3 according to Embodiment 1 . Accordingly, the same elements as those of illumination device 1 and light flux controlling member 3 according to Embodiment 1 shown in FIG. 2 will not be described.

As shown in FIG. 20, light flux controlling member 3 according to Embodiment 8 is different from light flux controlling member 3 according to Embodiment 1, in that sidewall 6 and cap 8 are formed of different members, respectively. Sidewall 6 and cap 8 are formed separately. Thereafter, by inserting cap 8 into a ring-like concave portion 20 formed on the upper end of sidewall 6 and fixing them (for example, by bonding or welding), sidewall 6 and cap 8 are formed as a unified body. Sidewall 6 is a tubular body having an outer cross-sectional shape obtained, for example, by cutting a ball. The inner diameter of lower end 5 of sidewall 6 is smaller than the inner diameter of the connecting portion (outer circumference 12 of cap 8) of sidewall 6 and cap 8.

Light flux controlling member 3 has cover 21 of which the outer shape is semi-spherical (which is a shape obtained by cutting a hollow ball to a half). Opening end 22 of cover 21 is fixed (for example, bonded or welded) to the other end (upper end) 7 of sidewall 6. Inner peripheral surface 23 of opening end 22 of cover 21 is fitted to outer peripheral surface 24 of cap 8. Outer surface 14 of cap 8 is covered with cover 21 with an air layer interposed therebetween. As a result, light flux controlling member 3 has an outer shape obtained by cutting a part of a ball.

Cover 21 is formed of a light transmitting material, similarly to sidewall 6 and cap 8. Cover 21 may be formed of a material into which a light scattering material is mixed so as to enhance light diffusing performance. At least one of the outer surface and the inner surface of cover 21 may be roughened to enhance the light diffusing performance. The light diffusing function may not be given to cover 21.

Figure 21:
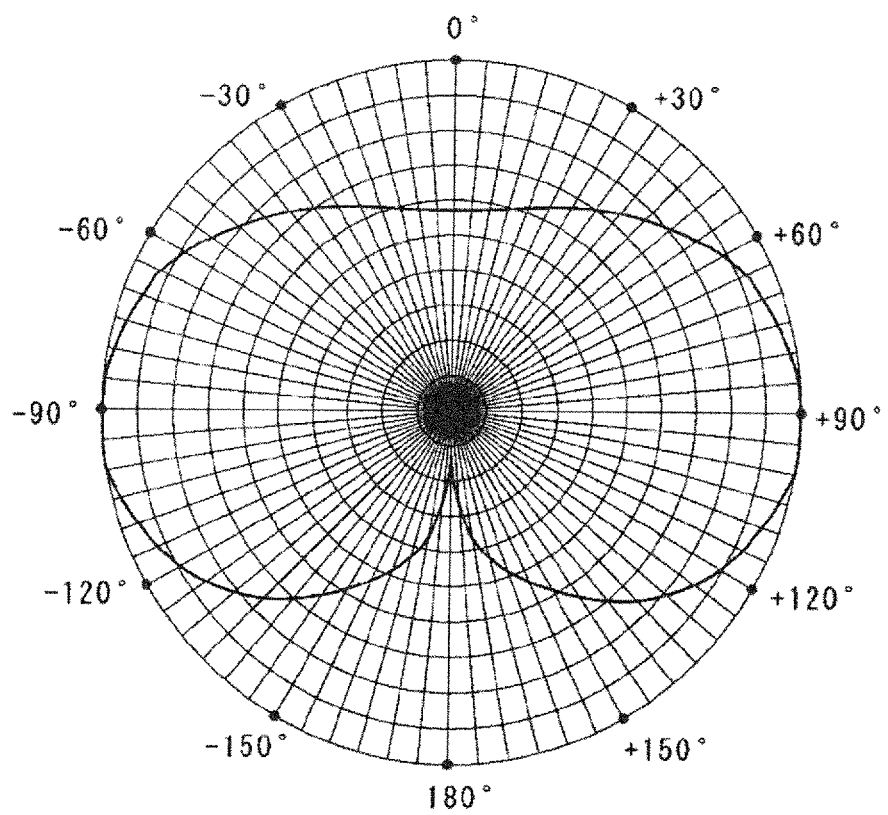
FIG. 21 is a graph illustrating the light distribution characteristics of the illumination device according to Embodiment 8.

As shown in FIG. 21, illumination device 1 according to Embodiment 8 exhibits almost the same light distribution characteristics as the light distribution characteristics (see FIG. 7) of illumination device 1 according to Embodiment 1, except that the illuminance of the front side is low and the illuminance in the horizontal direction is high, and it is thus possible to obtain the same advantages as those of illumination device 1 according to Embodiment 1. The reflectance of transflective film 13 formed on inner surface 10 of cap 8 is adjusted to 75%. Sidewall 6 and cover 21 have the same thickness, except for a portion in which both are fixed to each other and the vicinity thereof.

(Embodiment 9)

Figure 22:
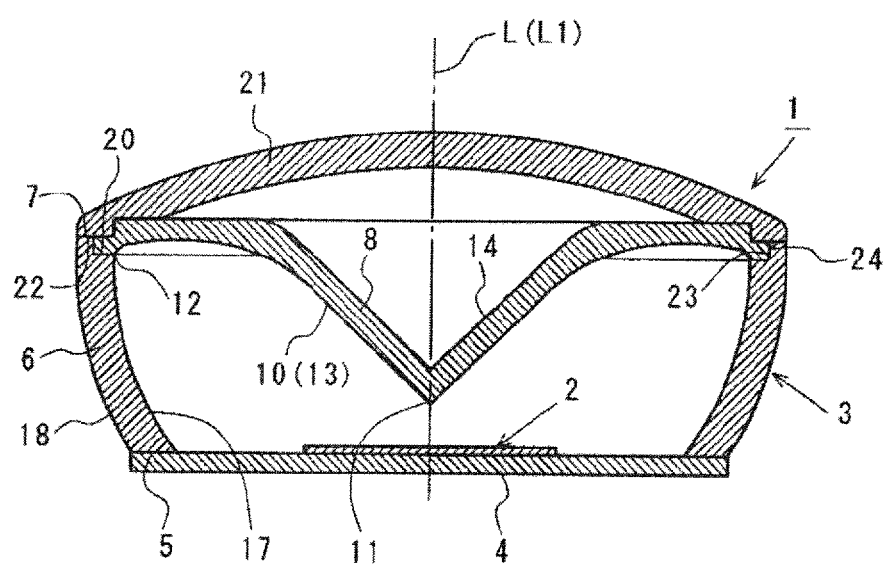
FIG. 22 is a cross-sectional view of an illumination device according to Embodiment 9.

FIG. 22 is a cross-sectional view of illumination device 1 and light flux controlling member 3 according to Embodiment 9 (corresponding to FIG. 2C). Illumination device 1 and light flux controlling member 3 according to Embodiment 9 are modified examples of illumination device 1 and light flux controlling member 3 according to Embodiment 8 . Accordingly, the same elements as those of illumination device 1 and light flux controlling member 3 according to Embodiment 8 shown in FIG. 20 will not be described.

As shown in FIG. 22, light flux controlling member 3 according to Embodiment 9 is different from light flux controlling member 3 according to Embodiment 8, in that the curvature of cover 21 is smaller. In this way, by reducing the curvature of cover 21, it is possible to reduce the height of light flux controlling member 3.

Figure 23:
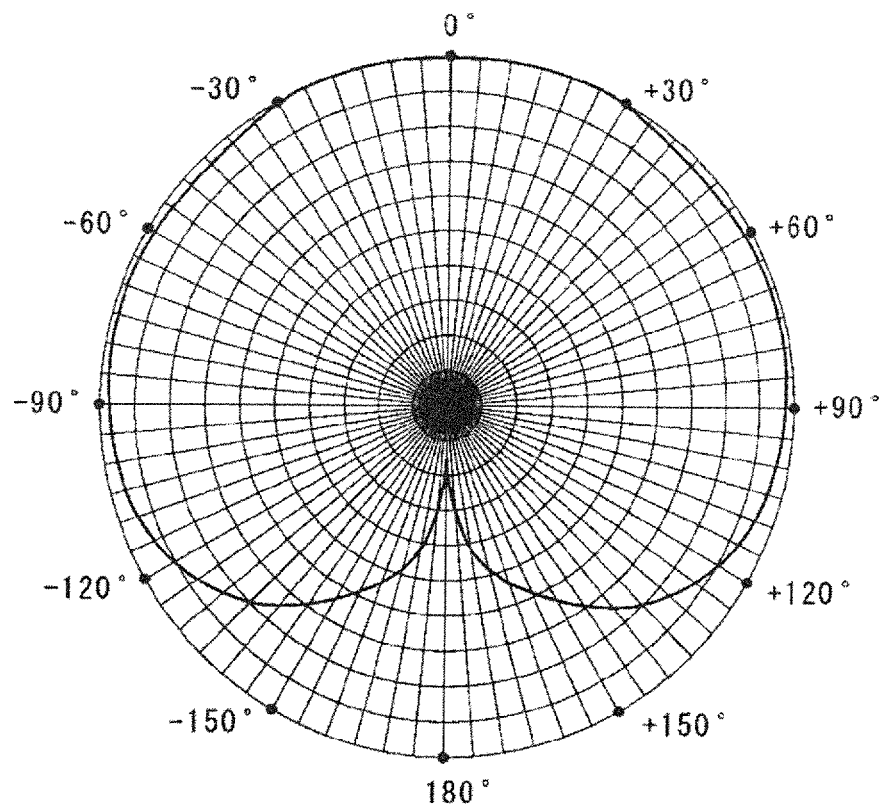
FIG. 23 is a graph illustrating the light distribution characteristics of the illumination device according to Embodiment 9.

As shown in FIG. 23, illumination device 1 according to Embodiment 9 exhibits almost the same light distribution characteristics as the light distribution characteristics (see FIG. 7) of illumination device 1 according to Embodiment 1, except that the illuminance in from the horizontal direction to the forward direction is almost constant, and it is thus possible to obtain the same advantages as those of illumination device 1 according to Embodiment 1 . The reflectance of transflective film 13 formed on inner surface 10 of cap 8 is adjusted to 75%.

(Embodiment 10)

Figure 24A:
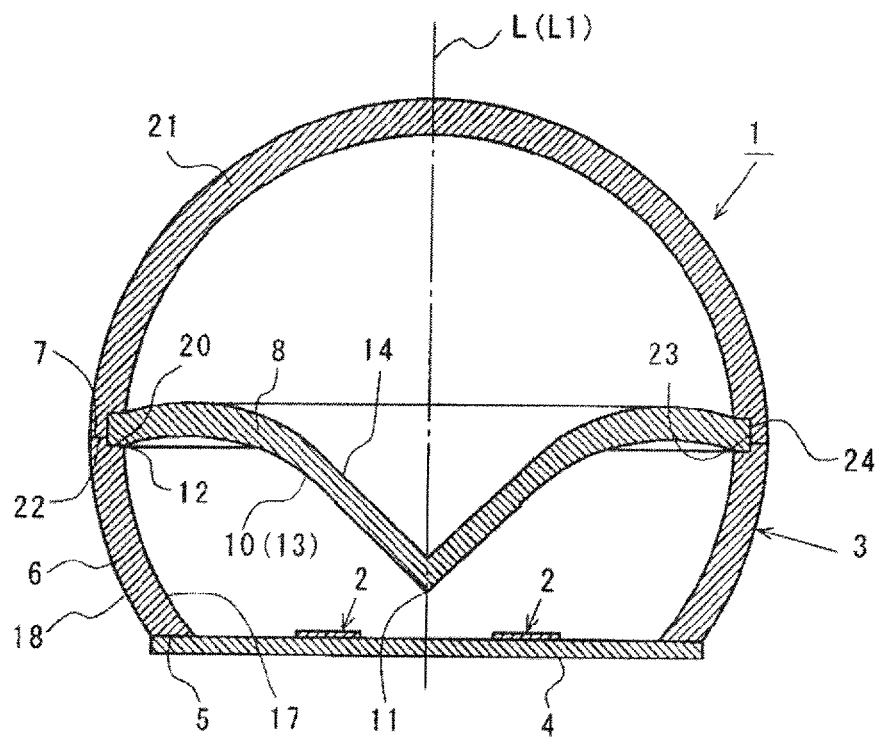
FIG. 24A is a cross-sectional view of an illumination device according to Embodiment 10 and FIG. 24B is a plan view of a board on which plural light emitting elements are mounted.
Figure 24B:
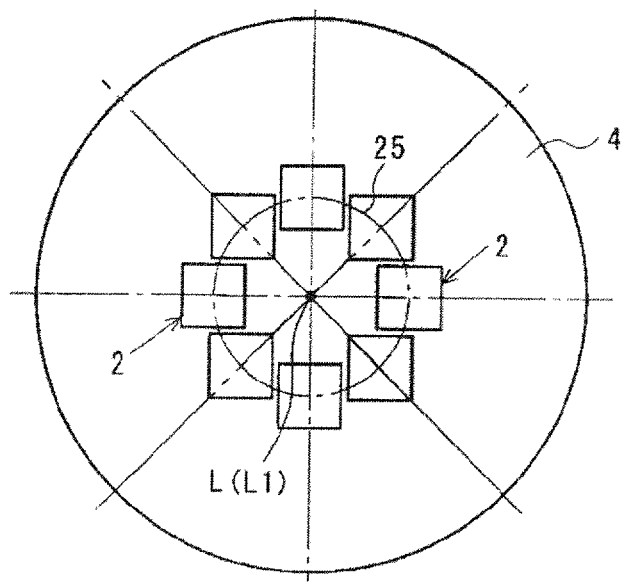

FIG. 24A is a cross-sectional view of illumination device 1 and light flux controlling member 3 according to Embodiment 10 (corresponding to FIG. 2C). FIG. 24B is a plan view of board 4 on which plural light emitting elements 2 are mounted. Illumination device 1 and light flux controlling member 3 according to Embodiment 10 are modified examples of illumination device 1 and light flux controlling member 3 according to Embodiment 8 . Accordingly, the same elements as those of illumination device 1 and light flux controlling member according to Embodiment 8 shown in FIG. 20 will not be described.

As shown in FIGS. 24A and 24B, illumination device 1 according to Embodiment 10 is different from illumination device 1 according to Embodiment 8, in that plural light emitting elements 2 are mounted on board 4. Light flux controlling member 3 according to Embodiment 10 is the same as light flux controlling member 3 according to Embodiment 8.

As shown in FIG. 24B, plural light emitting elements 2 are arranged at equal intervals (total eight light emitting elements are arranged at intervals of 45°)on the same circle 25 on board 4 of illumination device 1 according to Embodiment 10. Center L of light fluxes of plural light emitting elements 2 is the center of an entire emitted light flux in which three-dimensional emitted light fluxes of light emitting elements 2. The position of center L of light fluxes of plural light emitting elements 2 corresponds to the position (the central position of a light flux) of optical axis L of single light-emitting element 2 of illumination device 1 according to Embodiment 8 . Center L of the light fluxes of plural light emitting elements 2 is matched with central axis L1 of light flux controlling member 3.

Figure 25:
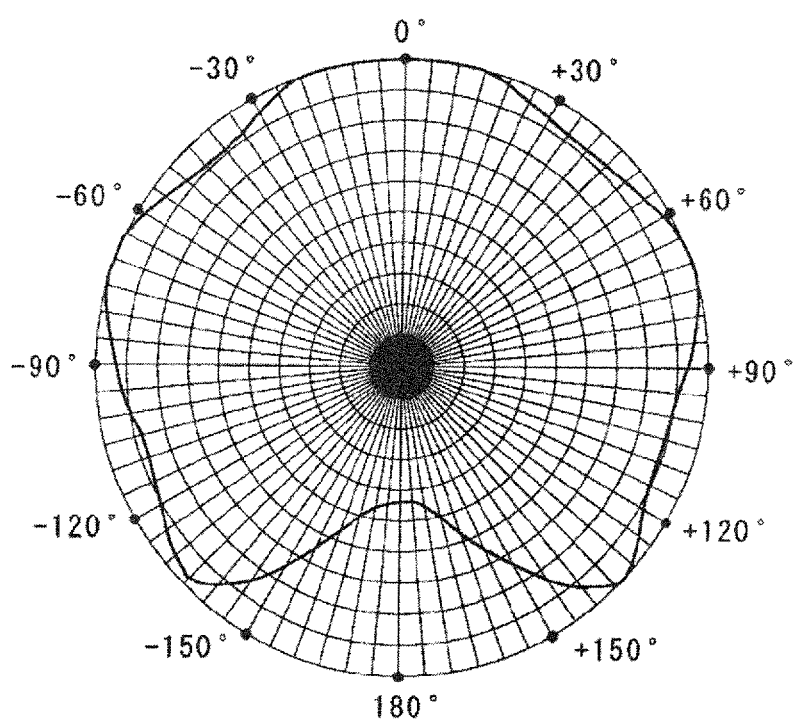
FIG. 25 is a graph illustrating the light distribution characteristics of the illumination device according to Embodiment 10.

As shown in FIG. 25, the illuminance in from the horizontal direction to the forward direction is almost constant and the light distribution characteristics of illumination device 1 according to Embodiment 10 is closer to the light distribution characteristics of an incandescent lamp, compared with the light distribution characteristics (see FIG. 21) of illumination device 1 according to Embodiment 8 . The reflectance of transflective film 13 formed on inner surface 10 of cap 8 is adjusted to 75%.

(Embodiment 11)

Figure 26A:
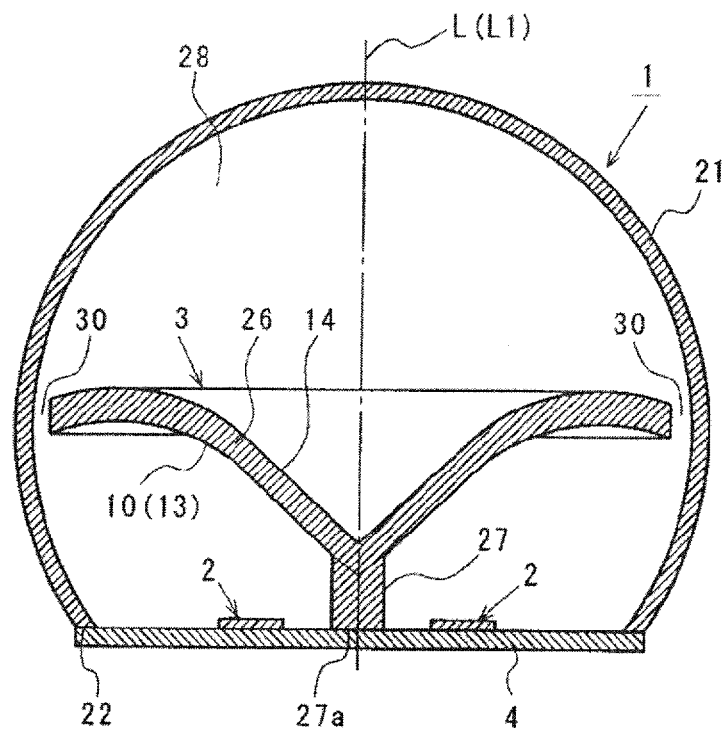
FIG. 26A is a cross-sectional view of an illumination device according to Embodiment 11 and FIG. 26B is a plan view of a board on which plural light emitting elements are mounted.
Figure 26B:
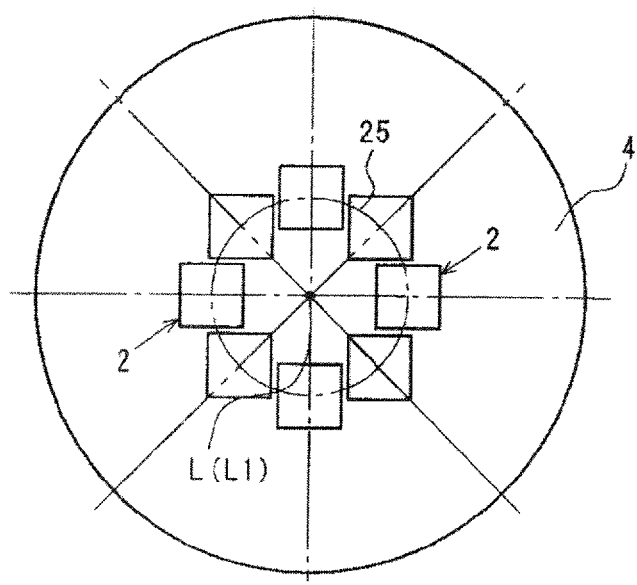

FIG. 26A is a cross-sectional view of illumination device 1 and light flux controlling member 3 according to Embodiment 11 (corresponding to FIG. 2C). FIG. 26B is a plan view of board 4 on which plural light emitting elements 2 are mounted. FIG. 27A is a front view of light flux controlling member 3, FIG. 27B is a plan view of light flux controlling member 3, FIG. 27C is a bottom view of light flux controlling member 3, and FIG. 27D is a cross-sectional view taken along line D-D of FIG. 27B. Illumination device 1 and light flux controlling member 3 according to Embodiment 11 are modified examples of illumination device 1 and light flux controlling member 3 according to Embodiment 10 . Accordingly, the same elements as those of illumination device 1 and light flux controlling member 3 according to Embodiment 10 shown in FIG. 24 will not be described.

As shown in FIGS. 26A and 27, light flux controlling member 3 according to Embodiment 11 includes light flux controlling member body 26 and supporting part 27 extending downward (along central axis L1) from the center of inner surface 10 (inner surface 10 opposed to light emitting element 2) of light flux controlling member body 26. Light flux controlling member 3 according to Embodiment 11 does not have a configuration corresponding to sidewall 6 of light flux controlling member 3 according to Embodiment 1 or Embodiment 10 (see FIGS. 2 and 24). Therefore, in illumination device 1 according to Embodiment 11, a space between the outer peripheral part of light flux controlling member body 26 and the outer peripheral part of board 4 serves as a transmitting part externally emitting light reflected by light flux controlling member body 26 (transflective part) and light directly arriving from light emitting element 2.

Supporting part 27 has a cylindrical shape, and end face (bottom end face) 27a thereof is fixed to board 4 (for example, by bonding, screwing, or pressing). Supporting part 27 supports light flux controlling member body 26 on board 4 so that central axis L1 of light flux controlling member 3 is matched with center L of the light fluxes of plural light emitting elements 2.

Light flux controlling member body 26 has the same shape as cap 8 of light flux controlling member 3 according to Embodiment 1 (see FIGS. 2 and 3), except that it is formed as a unified body with supporting part 27. Transflective film 13 is formed on inner surface 10 of light flux controlling member body 26 except for a portion in which supporting part 27 is formed, similarly to cap 8 of light flux controlling member 3 according to Embodiment 1 . Outer surface 14 of light flux controlling member body 26 has a double-sided relation with inner surface 10, and is formed similarly to outer surface 14 of cap 8 of light flux controlling member 3 according to Embodiment 1.

As shown in FIG. 26A, illumination device 1 according to Embodiment 11 includes cover 21 of a shape obtained by cutting a part of a hollow sphere. Opening end 22 of cover 21 is fixed to the outer peripheral part of disk-like board 4. As a result, plural light emitting elements 2 and light flux controlling member 3 are received in space 28 sealed by cover 21 and board 4. Gap 30 is present between the outer peripheral part of light flux controlling member body 26 and cover 21. Supporting part 27 is fixed directly to board 4.

Illumination device 1 according to Embodiment 11 is smaller in the number of parts than illumination device 1 according to Embodiment 10 . Accordingly, illumination device 1 according to Embodiment 11 can be fabricated through a smaller number of assembly steps in comparison with illumination device 1 according to Embodiment 10, thereby enhancing production efficiency.

Figure 28:
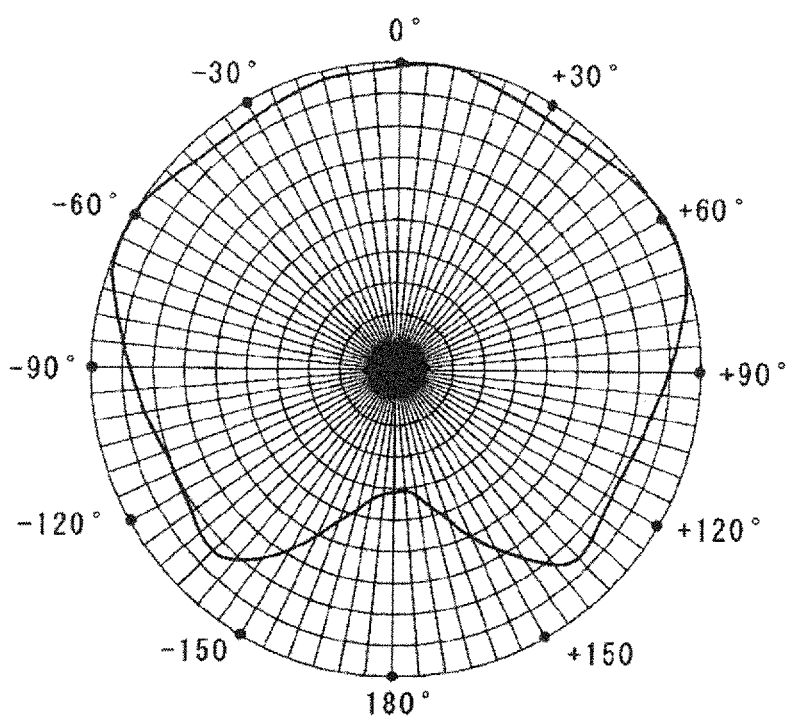
FIG. 28 is a graph illustrating the light distribution characteristics of the illumination device according to Embodiment 11.

As shown in FIG. 28, illumination device 1 according to Embodiment 11 exhibits almost the same light distribution characteristics as the light distribution characteristics (see FIG. 25) of illumination device 1 according to Embodiment 10 and it is thus possible to obtain the same advantages as those of illumination device 1 according to Embodiment 1 . The reflectance of transflective film 13 formed on inner surface 10 of light flux controlling member body 26 is adjusted to 75%.

(Embodiment 12)

Figure 29:
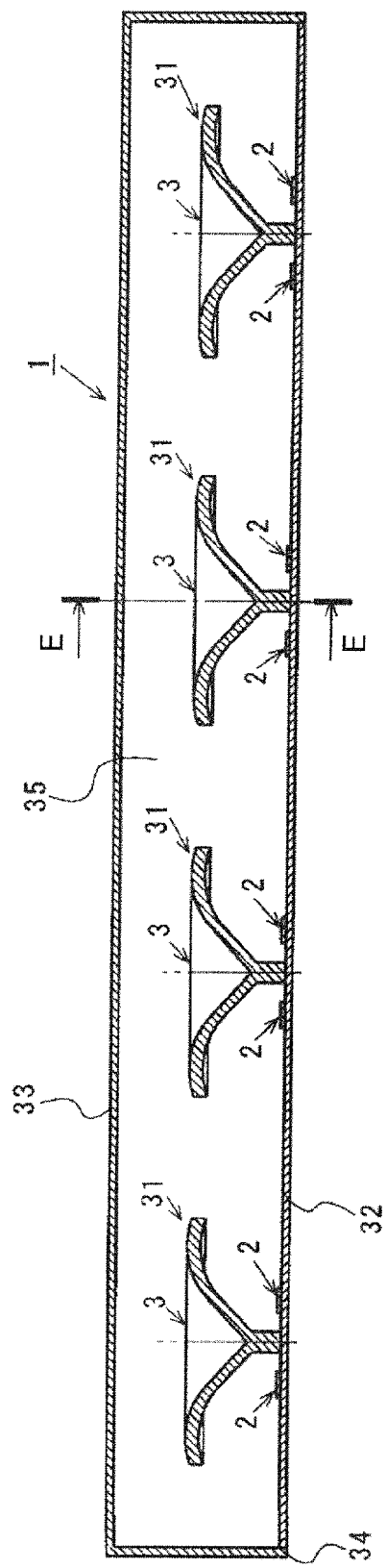
FIG. 29 is a cross-sectional view of an illumination device according to Embodiment 12.

FIG. 29 is a cross-sectional view of illumination device 1 and light flux controlling member 3 according to Embodiment 12. Illumination device 1 and light flux controlling member 3 according to Embodiment 12 are modified examples of illumination device 1 and light flux controlling member 3 according to Embodiment 11 . Accordingly, the same elements as those of illumination device 1 and light flux controlling member 3 according to Embodiment 11 shown in FIGS. 26 and 27 will not be described.

As shown in FIG. 29, illumination device 1 according to Embodiment 12 includes plural "light emitting element-light flux controlling member" units 31 including plural light emitting elements 2 and light flux controlling member 3 included in illumination device 1 according to Embodiment 11 . Plural "light emitting element-light flux controlling member" units 31 are arranged on single board 32. Opening end 34 of cover 33 is fixed to the outer rim of board 32. As a result, plural "light emitting element-light flux controlling member" units 31 are received in space 35 sealed by board 32 and cover 33.

The surface of board 32 on which plural light emitting elements 2 are mounted may be coated with a light reflecting member (not shown) having an excellent light reflecting function. A light reflecting member (not shown) having an excellent light reflecting function may be disposed on board 32 on which plural light emitting elements 2 are mounted.

The cross-section taken along line E-E shown in FIG. 29 is the same as shown in FIG. 26A. The planar shape of illumination device 1 according to Embodiment 12 can be set to an optimal shape such as a circular shape, a rectangular shape, and a hexagonal shape, depending on the usages.

The light distribution characteristics of illumination device 1 according to Embodiment 12 are close to the light distribution characteristics of an incandescent lamp. Illumination device 1 according to Embodiment 12 can emit high-quality illumination light without irregularity in color.

(Embodiment 13 )

Configuration of Illumination Device

Figure 30A:
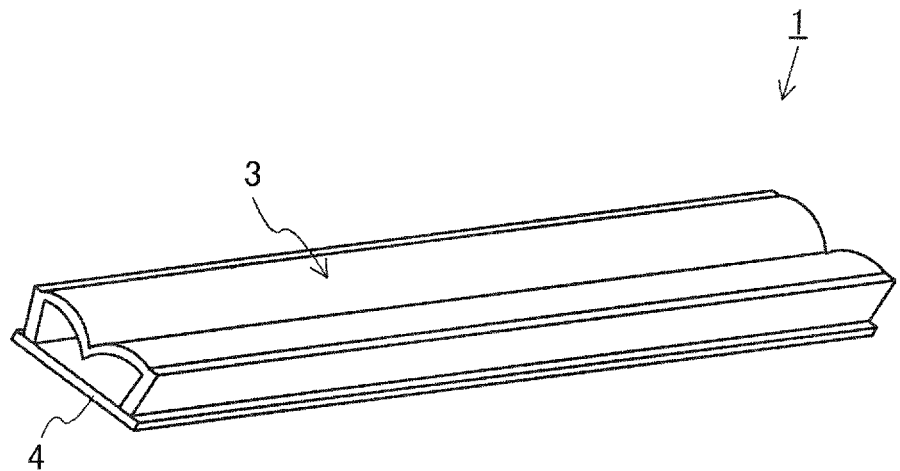
FIG. 30A is a perspective view illustrating the appearance of an illumination device according to Embodiment 13 and FIG. 30B is a transparent perspective view of the illumination device according to Embodiment 13.
Figure 30B:
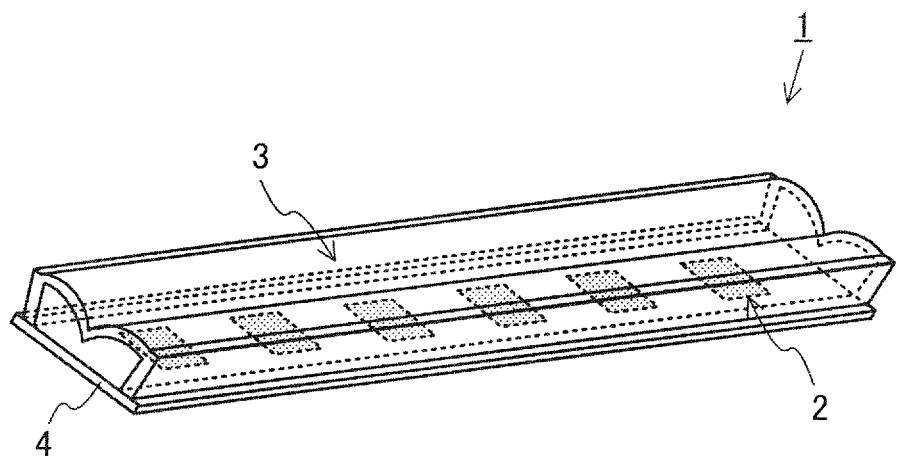

FIG. 30A is a perspective view illustrating the appearance of illumination device 1 according to Embodiment 13 and FIG. 30B is a transparent perspective view of illumination device 1. Illumination device 1 can be used instead of a straight tube fluorescent lamp.

As shown in FIGS. 30A and 30B, illumination device 1 includes light emitting elements 2, light flux control member 3, and board 4. In the description of Embodiments 13 to 17, the long-axis direction of board 4 is defined as a first direction and the short-axis direction of board 4 is defined as a second direction. The first direction and the second direction are perpendicular to each other.

Figure 31A:
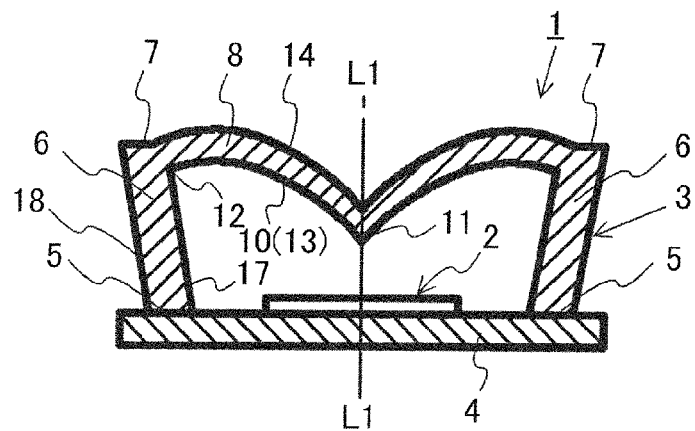
FIG. 31A is a cross-sectional view of the illumination device according to Embodiment 13 taken along a second direction and FIG. 31B is a plan view of a board on which plural light emitting elements are mounted.
Figure 31B:
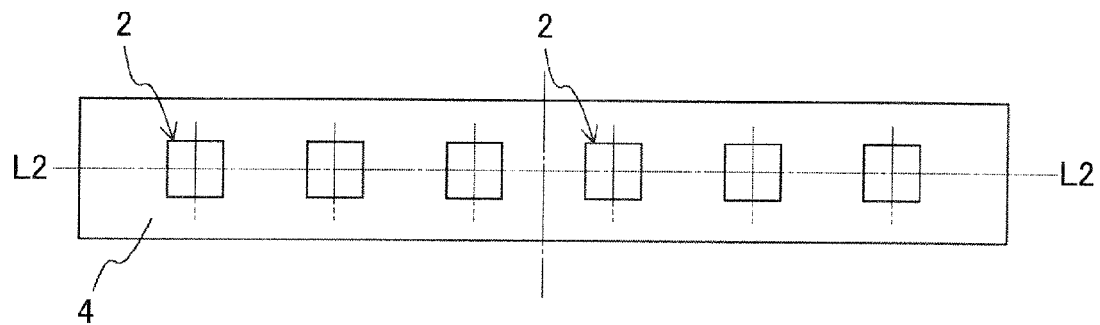

FIG. 31A is a cross-sectional view (transverse cross-section) in the second direction of illumination device 1. FIG. 31B is a plan view of board 4 on which plural light emitting elements 2 are mounted.

As shown in FIGS. 31A and 31B, illumination device 1 emits light from plural light emitting elements 2 (for example, LEDs or LEDs sealed by a sealing member) arranged in a line in the first direction through light flux controlling member 3. One end 5 of light flux controlling member 3 is fixed to board 4 on which plural light emitting elements 2 are mounted with an adhesive. Central line L1 (see FIGS. 31A and 32A) of light flux controlling member 3 is located in straight line L2 (see FIG. 31B) connecting the centers of light emitting elements 2.

Configuration of Light Flux Controlling Member

Figure 32A:
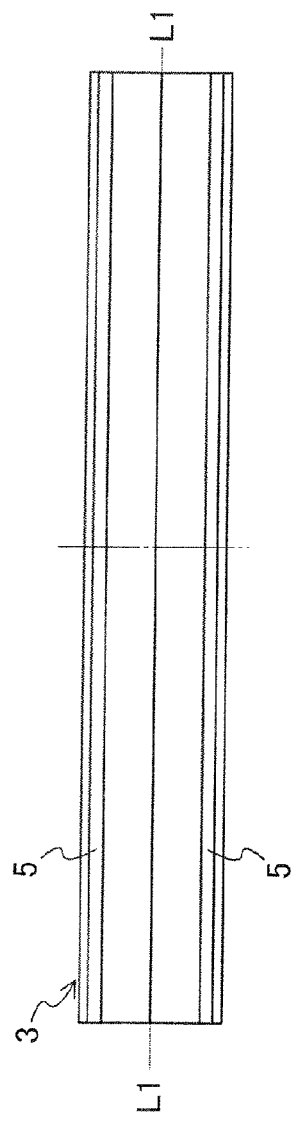
FIG. 32A is a bottom view of a light flux controlling member of the illumination device according to Embodiment 13.
Figure 32B:
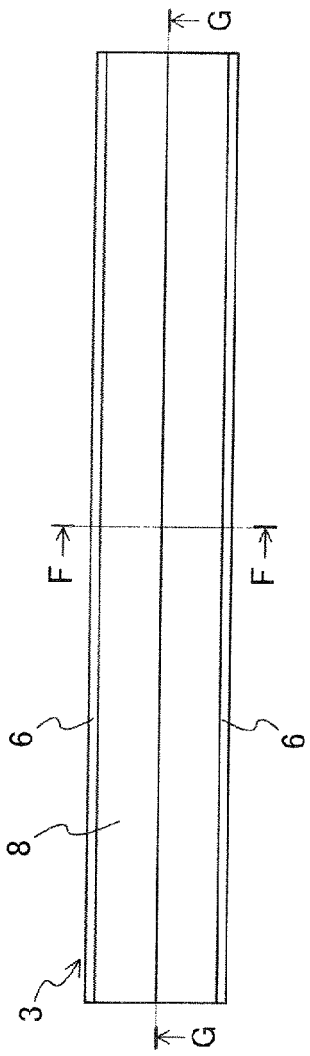
FIG. 32B is a plan view of the light flux controlling member of the illumination device according to Embodiment 13.
Figure 32C:
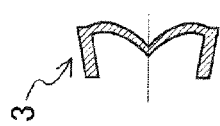
FIG. 32C is a cross-sectional view taken along line F-F of FIG. 32B.
Figure 32D:
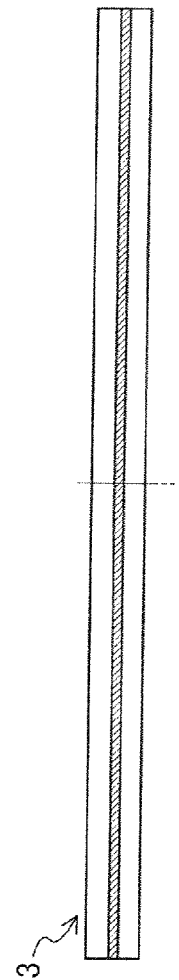
FIG. 32D is a cross-sectional view taken along line G-G of FIG. 32B.

FIG. 32A is a bottom view of light flux controlling member 3 and FIG. 32B is a plan view of light flux controlling member 3. FIG. 32C is a cross-sectional view (a cross-sectional view in the second direction; corresponding to FIG. 31A) taken along line F-F of FIG. 32B and FIG. 32D is a cross-sectional view (a cross-sectional view in the first direction) taken along line G-G of FIG. 32B.

Light flux controlling member 3 is formed of a transparent resin material such as polymethylmethacrylate (PMMA), polycarbonate (PC), or epoxy resin (EP) or a transparent glass.

Light flux controlling member 3 is formed to have a rectangular planar shape. Light flux controlling member 3 includes two sidewalls (supporting parts: transmissive parts) 6 of which one end 5 is fixed to board 4 and cap (light flux controlling member body: transflective part) 8 fixed to the other ends 7 of sidewall 6 (see FIG. 31A). Inner surface 10 and outer surface 14 of cap 8 does not have curvature in the first direction. That is, inner surface 10 and outer surface 14 of cap 8 do not affect the light distribution characteristics of emitted light of light emitting elements 2 in the first direction. On the other hand, inner surface 10 and outer surface 14 of cap 8 have curvature in the second direction. Therefore, inner surface 10 of cap 8 can change the light distribution characteristics of emitted light of light emitting elements 2 to desired light distribution characteristics in the second direction by controlling the reflecting direction of light from light emitting elements 2.

Figure 33A:
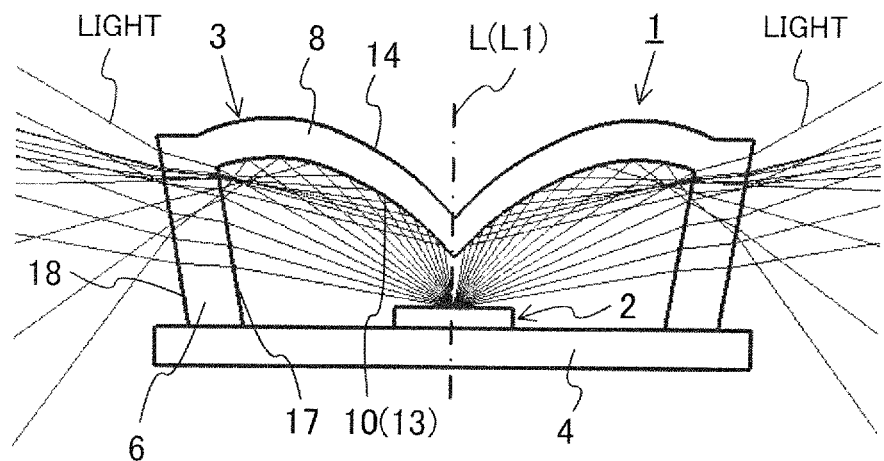
FIG. 33A is a schematic diagram illustrating a light reflecting function of a transflective film of the light flux controlling member and FIG. 33B is a schematic diagram illustrating a light transmitting function of the transflective film of the light flux controlling member.
Figure 33B:
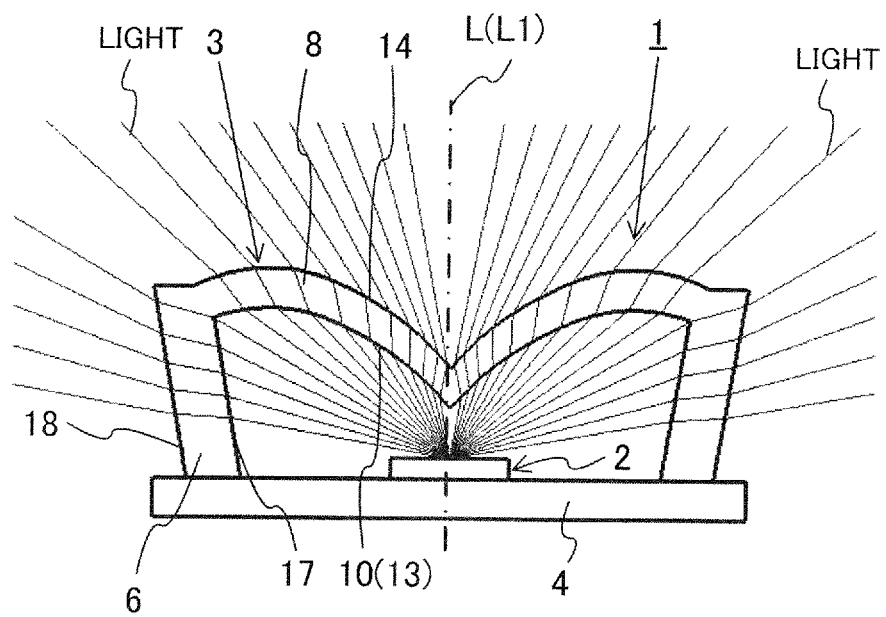

As shown in FIG. 31A, inner surface 10 of cap 8 is a concave surface in which central part 11 located on central axis L1 is located closer to one end 5 of sidewall 6 than outer circumference 12 in the second direction is. Therefore, when light flux controlling member 3 is fixed onto board 4, central part 11 is located at a position closer to light emitting element 2 than outer circumference 12 is. Inner surface 10 of cap 8 has a curved shape in which the inclination becomes slower from central part 11 of cap 8 to outer circumference 12. Inner surface 10 of cap 8 has an aspheric shape in which a point having an inclination angle of 0 appears at a position located between central part 11 and outer circumference 12 and closer to outer circumference 12. Transflective film 13 formed by stacking $TiO_2$ and $SiO_2$ layer on the surface thereof by deposition is formed on inner surface 10 of cap 8. The entire area of inner surface 10 of cap 8 is covered with transflective film 13. Transflective film 13 reflects a part of light from light emitting element 2 toward sidewall 6 and causes the other part of light from light emitting element 2 to enter the inside of cap 8 (see FIG. 33). The thickness of transflective film 13 is adjusted depending on requested optical reflectance. As the thickness of transflective film 13 becomes larger, the optical reflectance becomes higher.

Outer surface 14 of cap 8 has a double-sided relation with inner surface 10 and is formed so that the thickness along central axis L1 of cap 8 is constant from central part 11 to outer circumference 12. Outer surface 14 of cap 8 extensively emit light entering the inside of cap 8 through transflective film 13 to the outside (see FIG. 33B).

Two sidewalls 6 are disposed to oppose each other so that the gap between one ends 5 is smaller than the gap between the other ends 7. Sidewalls 6 are located between the outer rim of cap 8 and board 4. The thickness of sidewalls 6 is constant from one end 5 to the other end 7. Sidewalls 6 extensively emit light reflected by transflective film 13 of cap 8 and arriving thereat and light directly arriving thereat out of light emitted from light emitting elements 2 out of light emitted from light emitting element 2 to the outside (see FIG. 33A).

Figure 34:
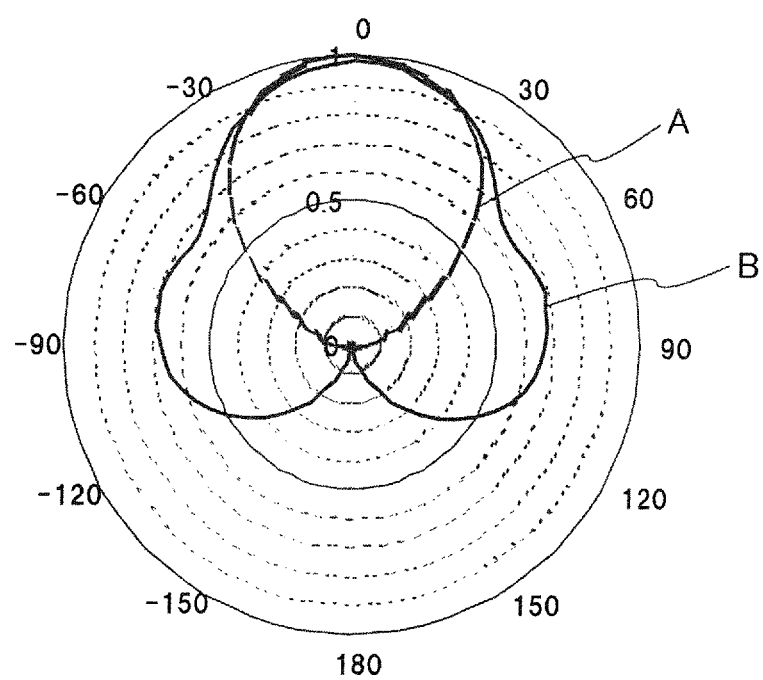
FIG. 34 is a graph illustrating the light distribution characteristics of the illumination device according to Embodiment 13 when optical reflectance of the transflective film is 50%.
Figure 35:
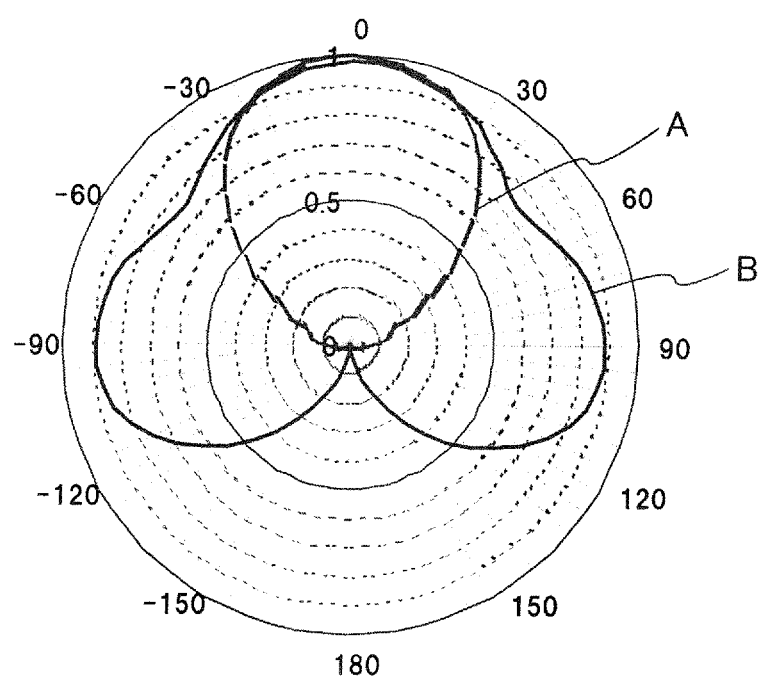
FIG. 35 is a graph illustrating the light distribution characteristics of the illumination device according to Embodiment 13 when optical reflectance of the transflective film is 60%.
Figure 36:
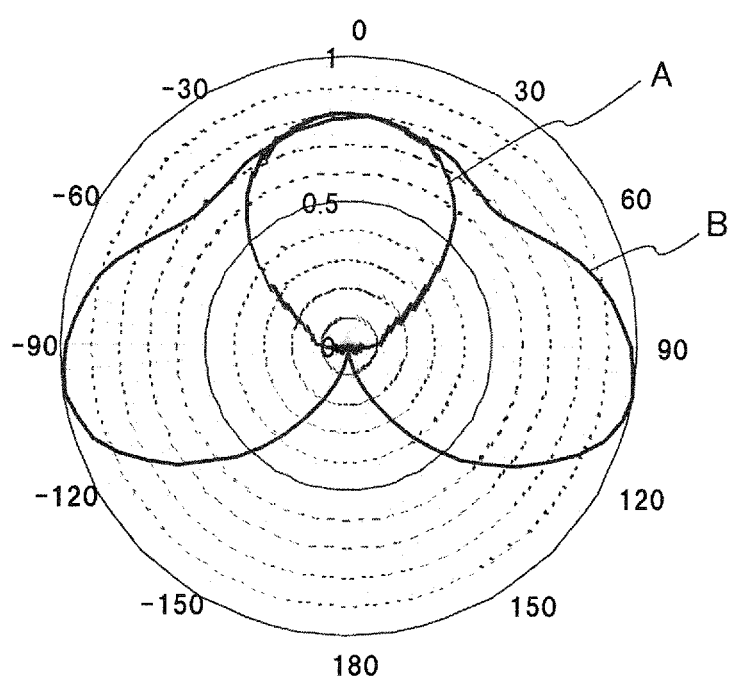
FIG. 36 is a graph illustrating the light distribution characteristics of the illumination device according to Embodiment 13 when optical reflectance of the transflective film is 70%.
Figure 37:
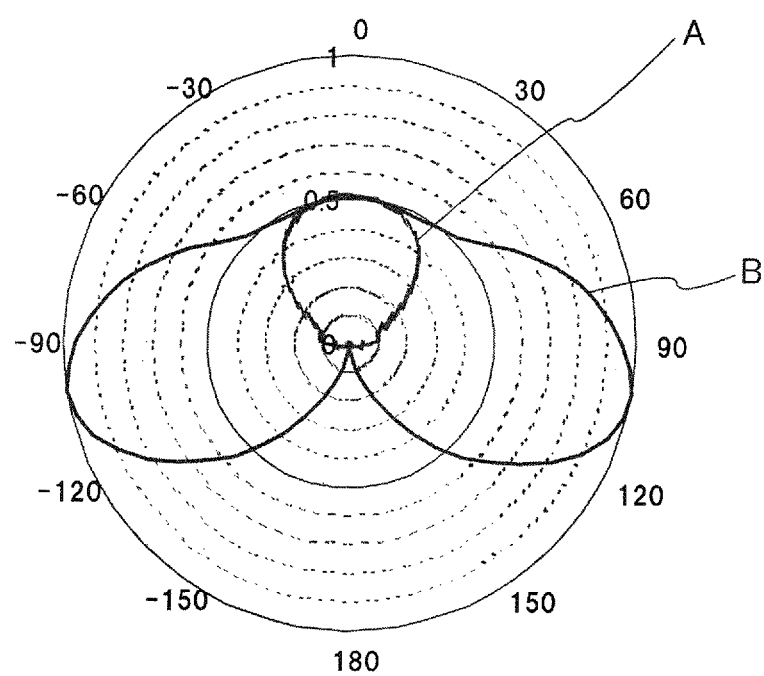
FIG. 37 is a graph illustrating the light distribution characteristics of the illumination device according to Embodiment 13 when optical reflectance of the transflective film is 80%.

FIGS. 34 to 37 are graphs illustrating the light distribution characteristics of illumination device 1. FIG. 34 is a graph illustrating the light distribution characteristics of illumination device 1 when the optical reflectance of transflective film 13 is 50%. FIG. 35 is a graph illustrating the light distribution characteristics of illumination device 1 when the optical reflectance of transflective film 13 is 60%. FIG. 36 is a graph illustrating the light distribution characteristics of illumination device 1 when the optical reflectance of transflective film 13 is 70%. FIG. 37 is a graph illustrating the light distribution characteristics of illumination device 1 when the optical reflectance of transflective film 13 is 80%.

Figure 38:
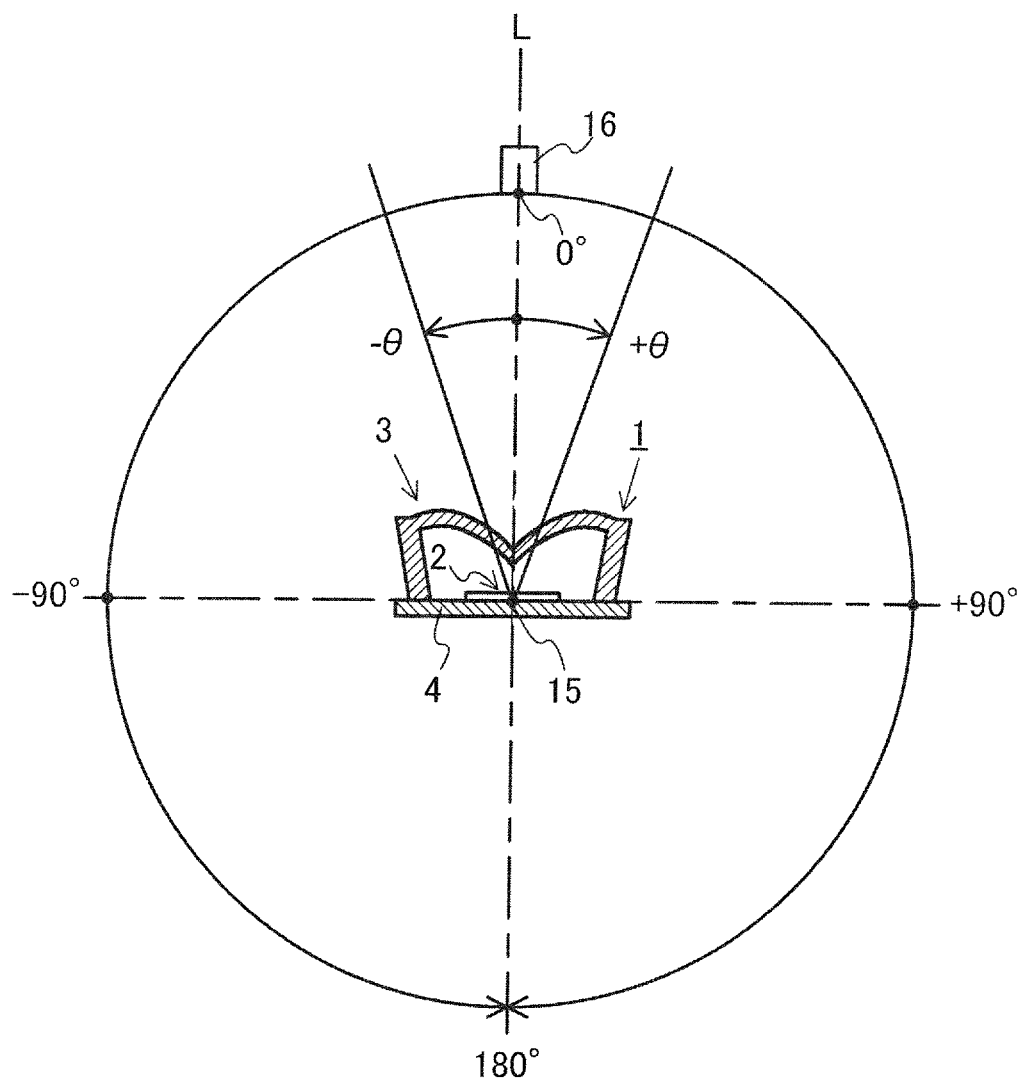
FIG. 38 is a diagram illustrating a method of measuring the light distribution characteristics of the illumination device.

The light distribution characteristics are measured in the following order. As shown in FIG. 38, illuminometer 16 is disposed at a position (reference position 0°) apart by a predetermined distance in the perpendicular direction from center 15 (see FIG. 31B) of board 4. Illuminometer 16 measures illuminance while rotating by 180° at intervals of 5° in a clockwise direction (in the +θ direction) about center 15 of board 4, and measures illuminance while rotating by 180° at intervals of 5° in a counterclockwise direction (in the −θ direction). Relative illuminance values (dimensionless values) when the maximum illuminance value of the measured illuminance values is set to 1 are smoothly connected to form a curve, whereby the graphs of FIGS. 34 to 37 are created. The light distribution characteristics of illumination device 1 are measured in two directions of the first direction and the second direction. In FIGS. 34 to 37, the measurement result in the first direction (the long-axis direction) is indicated by curve A and the measurement result in the second direction (the short-axis direction) is indicated by curve B.

As indicated by curve B in FIGS. 34 to 37, as the reflectance of transflective film 13 formed on inner surface 10 of cap 8 of light flux controlling member 3 becomes larger, the illuminance in the horizontal direction (in the ±90° direction) and in the backward direction (+90°<θ<+180° and −90°<θ<−180°) becomes higher. In the light distribution characteristics shown in FIGS. 34 and 35, the illuminance in the forward direction) (θ=0°) is the largest. On the contrary, in the light distribution characteristics shown in FIG. 36 and 37, the illuminance in the horizontal direction (in the ±90° direction) is larger than the illuminance in the forward direction) (θ=0°), and is different from the illuminance balance indicated by the light distribution characteristics shown in FIGS. 34 and 35.

In this way, the light distribution characteristics of illumination device 1 differ depending on the reflectance of transflective film 13 formed in inner surface 10 of cap 8 of light flux controlling member 3. Accordingly, the reflectance of transflective film 13 is selected depending on the usage of illumination device 1, and transflective film 13 is deposited on inner surface 10 of cap 8 of light flux controlling member 3 so as to achieve the selected reflectance.

Here, when the reflectance of transflective film 13 of light flux controlling member 3 is 60%, the light distribution characteristics (the light distribution characteristics shown in FIG. 35) of illumination device 1 including light flux controlling member 3 according to Embodiment 13 is closest to the light distribution characteristics of a fluorescent lamp. Accordingly, when illumination device 1 having light flux controlling member 3 according to Embodiment 13 is used as indoor lighting instead of a fluorescent lamp, it is preferable that the reflectance of transflective film 13 of light flux controlling member 3 be set to 60%.

Advantages

Light flux controlling member 3 according to Embodiment 13 reflects a part of light from light emitting element 2 by the use of transflective film 13 formed on inner surface 10 of cap 8, and emits the other (light not reflected by transflective film 13) of light from light emitting element 2 from outer surface 14 of cap 8 by the use of transflective film 13 formed on inner surface 10 of cap 8. In this way, since light flux controlling member 3 according to Embodiment 13 does not reflect light from light emitting element 2 by total reflection of cap 8, the light emitted from cap 8 does not cause color separation and thus degradation in quality of illumination due to the irregularity in color is not caused.

Illumination device 1 according to Embodiment 13 emits light from light emitting element 2, which is reflected by transflective film 13 formed on inner surface 10 of cap 8 and arrives at inner surface 17 of sidewall 6, and light, which directly arrives at inner surface 17 of sidewall 6 from light emitting element 2, from outer surface 18 of sidewall 6. Illumination device 1 according to Embodiment 13 emits light from light emitting element 2, which is transmitted by transflective film 13 formed on inner surface 10 of cap 8 and is incident on cap 8, from outer surface 14 of cap 8. In this way, since light flux controlling member 3 according to Embodiment 13 can satisfactorily distribute light in the horizontal direction and the backward direction in addition to the forward direction, it is possible to make the light distribution characteristics close to those of a fluorescent lamp.

Illumination device 1 according to Embodiment 13 does not cause the degradation in quality of illumination due to the irregularity in color and thus can be used for indoor illumination instead of a fluorescent lamp. Illumination device 1 according to Embodiment 13 can reduce power consumption in comparison with a fluorescent lamp and can be used for a longer time than the fluorescent lamp.

Outer surface 18 of sidewall 6 of light flux controlling member 3 and/or outer surface 14 of cap 8 may be formed of a light diffusion surface (a surface subjected to a light diffusion process such as a surface roughening process). By employing this configuration, it is possible to extensively diffuse light emitted from sidewall 6 and/or cap 8.

Light flux controlling member 3 may be formed of a material having a light diffusion function. By employing this configuration, it is possible to scatter light in the inside of light flux controlling member 3 and to extensively diffuse light emitted from sidewall 6 and cap 8.

Transflective film 13 may be formed through a method other than a deposition method. For example, transflective film 13 formed in a film shape in advance may be bonded to inner surface 10 of cap 8.

Transflective film 13 may not be a multi-layered film of $TiO_2$ and $SiO_2$. For example, transflective film 13 may be a multi-layered dielectric film such as a multi-layered film of $ZnO_2$ and $SiO_2$ or a multi-layered film of $Ta_2O_2$ and $SiO_2$. Transflective film 13 may be a thin metal film of aluminum (Al) or the like from which a necessary amount of transmitted light is obtained.

The optical reflectance of transflective film 13 may be adjusted by means other than the adjustment of the thickness of transflective film 13. For example, by forming a reflective area in patterns such as dot shapes or mesh shapes and adjusting the area ratio of the transmissive area and the reflective area, desired optical reflectance may be obtained. The optical reflectance of the reflective area may be adjusted by the use of the thickness.

The method of fixing light flux controlling member 3 to board 4 is not limited to the fixation using an adhesive. For example, light flux controlling member 3 and board 4 may be fixed using another member such as a case. Light flux controlling member 3 and board 4 may be fixed using welding or a screw fixing mechanism, or the like.

A part of inner surface 10 of cap 8 of light flux controlling member 3 may be formed in an inclined plane or a plane.

(Embodiment 14)

Figure 39A:
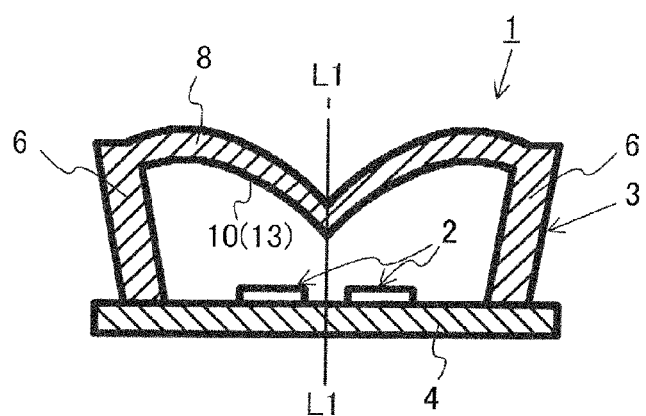
FIG. 39A is a cross-sectional view of the illumination device according to Embodiment 14 taken along a second direction and FIG. 39B is a plan view of a board on which plural light emitting elements are mounted.
Figure 39B:
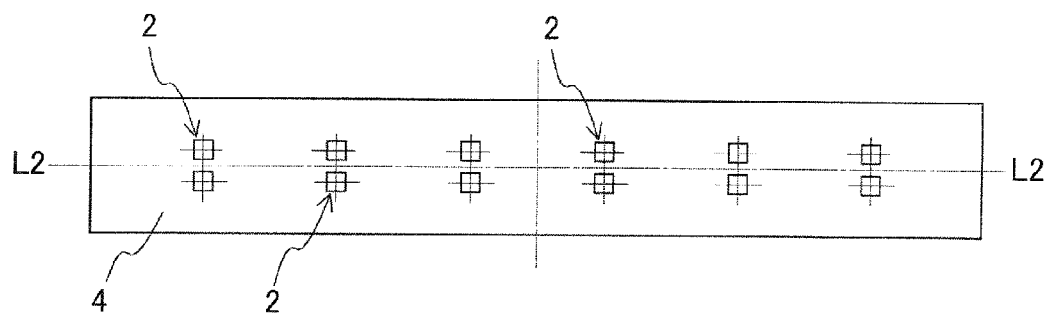

FIG. 39A is a cross-sectional view (transverse cross-section) of illumination device 1 according to Embodiment 14 taken along the second direction. FIG. 39B is a plan view of board 4 on which plural light emitting elements 2 are mounted. FIG. 40A is a bottom view of light flux controlling member 3 according to Embodiment 14 and FIG. 40B is a plan view of light flux controlling member 3 according to Embodiment 14. FIG. 40C is a cross-sectional view (cross-sectional view in the second direction; corresponding to FIG. 39A) taken along line H-H of FIG. 40B and FIG. 40D is a cross-sectional view (cross-sectional view in the first direction) taken along line I-I of FIG. 40B. The same elements as those of illumination device 1 and light flux controlling member 3 according to Embodiment 13 shown in FIGS. 30 to 32 will not be described.

As shown in FIGS. 39A and 39B, illumination device 1 according to Embodiment 14 emits light from plural light emitting elements 2, which are arranged in two lines in the first direction, through light flux controlling member 3. Central line L1 (see FIGS. 39A and 40A) of light flux controlling member 3 is located on straight line L2 (see FIG. 39B) connecting the centers of two light emitting elements 2 arranged in parallel. Light flux controlling member 3 is the same as light flux controlling member 3 according to Embodiment 13.

Figure 41:
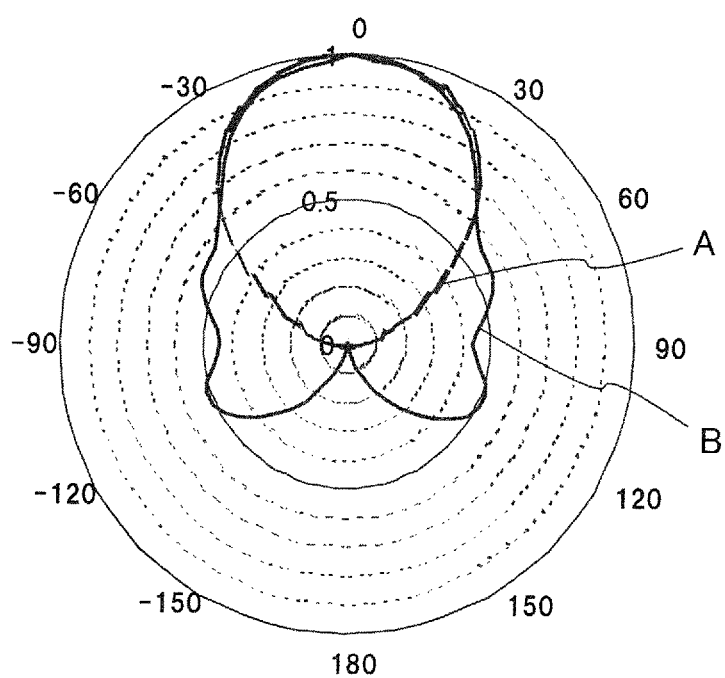
FIG. 41 is a graph illustrating the light distribution characteristics of the illumination device according to Embodiment 14 when optical reflectance of the transflective film is 50%.
Figure 42:
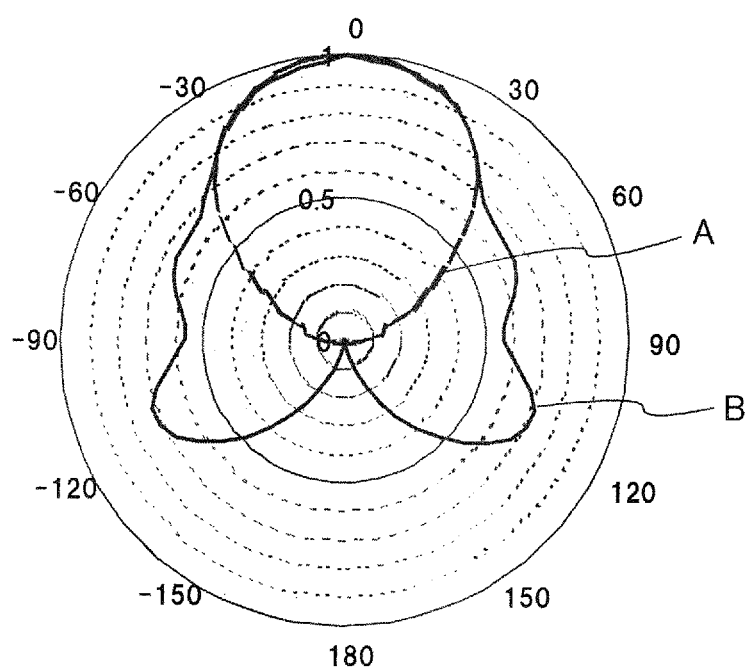
FIG. 42 is a graph illustrating the light distribution characteristics of the illumination device according to Embodiment 14 when optical reflectance of the transflective film is 60%.
Figure 43:
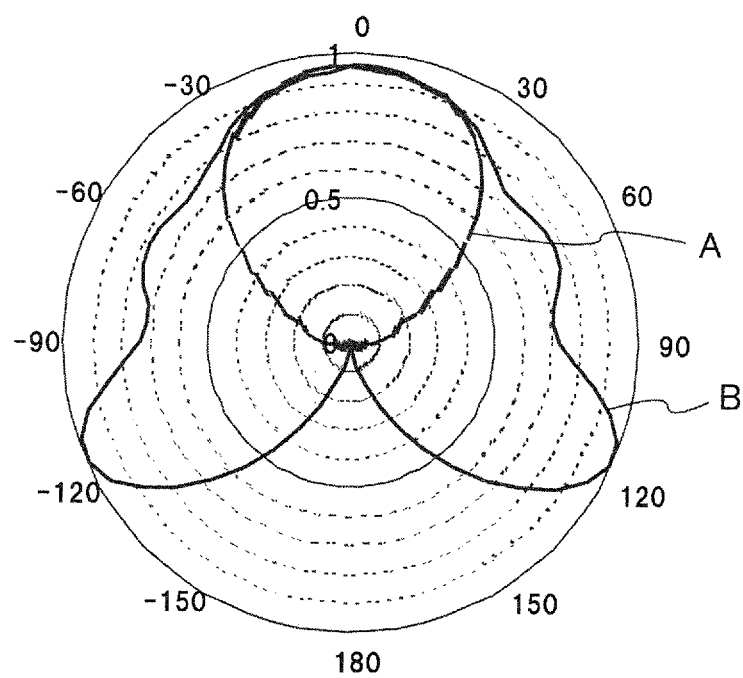
FIG. 43 is a graph illustrating the light distribution characteristics of the illumination device according to Embodiment 14 when optical reflectance of the transflective film is 70%.
Figure 44:
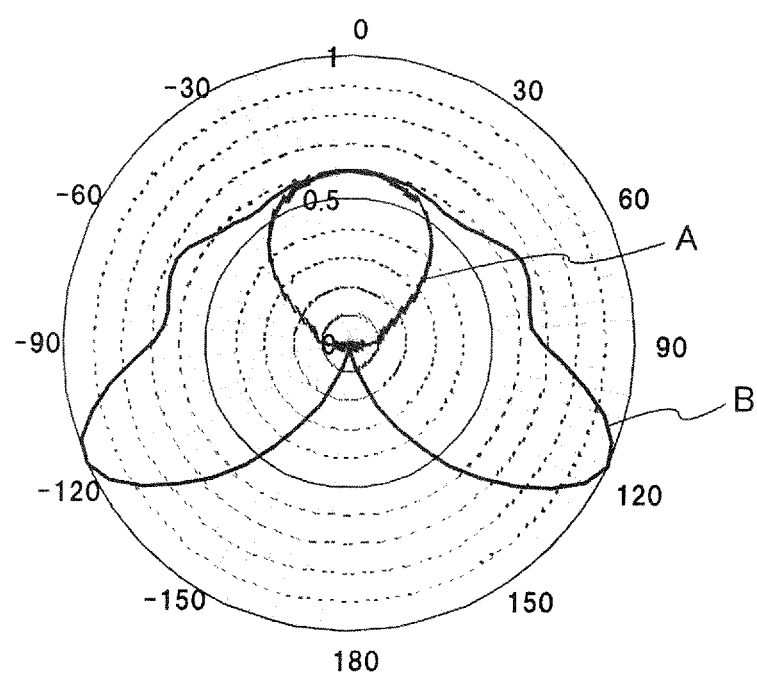
FIG. 44 is a graph illustrating the light distribution characteristics of the illumination device according to Embodiment 14 when optical reflectance of the transflective film is 80%.

FIGS. 41 to 44 are graphs illustrating the light distribution characteristics of illumination device 1 according to Embodiment 14. FIG. 41 is a graph illustrating the light distribution characteristics of illumination device 1 when the optical reflectance of transflective film 13 is 50%. FIG. 42 is a graph illustrating the light distribution characteristics of illumination device 1 when the optical reflectance of transflective film 13 is 60%. FIG. 43 is a graph illustrating the light distribution characteristics of illumination device 1 when the optical reflectance of transflective film 13 is 70%. FIG. 44 is a graph illustrating the light distribution characteristics of illumination device 1 when the optical reflectance of transflective film 13 is 80%.

As indicated by curve B in FIGS. 41 to 44, illumination device 1 according to Embodiment 14 exhibits almost the same light distribution characteristics as the light distribution characteristics (see FIGS. 34 to 37) of illumination device 1 according to Embodiment 13 and it is thus possible to obtain the same advantages as those of illumination device 1 according to Embodiment 13.

(Embodiment 155)

Figure 45A:
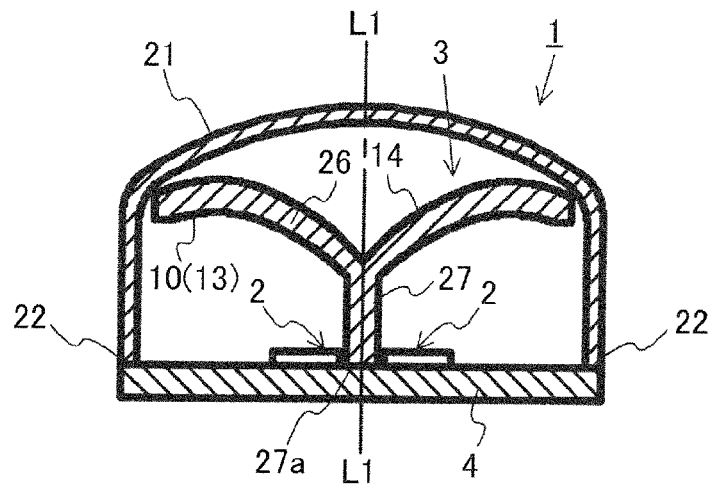
FIG. 45A is a cross-sectional view of the illumination device according to Embodiment 15 taken along a second direction and FIG. 45B is a plan view of a board on which plural light emitting elements are mounted.
Figure 45B:
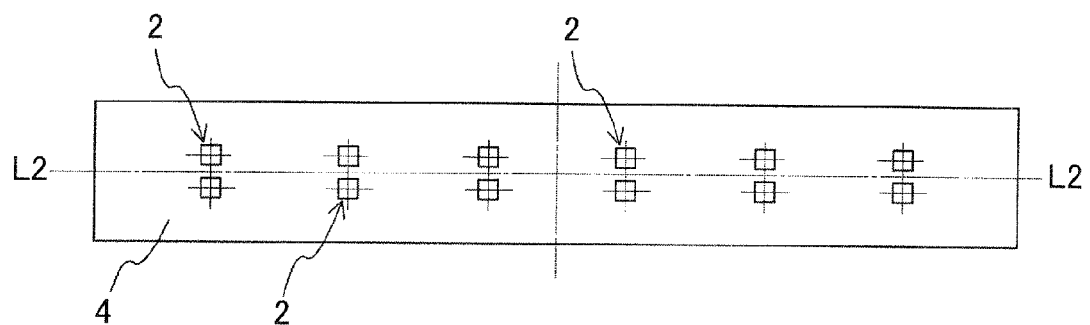

FIG. 45A is a cross-sectional view (transverse cross-section) of illumination device 1 according to Embodiment 15 taken along the second direction. FIG. 45B is a plan view of board 4 on which plural light emitting elements 2 are mounted. FIG. 46A is a bottom view of light flux controlling member 3 of illumination device 1 according to Embodiment 15 and FIG. 46B is a plan view of light flux controlling member 3 of illumination device 1 according to Embodiment 15 . FIG. 46C is a cross-sectional view (cross-sectional view in the second direction; corresponding to FIG. 45A) taken along line J-J of FIG. 46B and FIG. 46D is a cross-sectional view (cross-sectional view in the first direction) taken along line K-K of FIG. 46B. The same elements as those of illumination device 1 and light flux controlling member 3 according to Embodiment 13 shown in FIGS. 30 to 32 will not be described.

As shown in FIGS. 45A and 46, light flux controlling member 3 includes light flux controlling member body 26 and supporting part 27 extending downward (along central axis L1) from the center of inner surface 10 (inner surface 10 opposed to light emitting element 2) of light flux controlling member body 26. Light flux controlling member 3 according to Embodiment 15 does not have a configuration corresponding to sidewall 6 of light flux controlling member 3 according to Embodiment 13 (see FIGS. 31A and 45A). Therefore, in illumination device 1 according to Embodiment 15, a space between the outer peripheral part of light flux controlling member body 26 and the outer peripheral part of board 4 serves as a transmitting part externally emitting light reflected by light flux controlling member body 26 (transflective part) and light directly arriving from light emitting element 2.

As shown in FIGS. 45A and 46, supporting part 27 of light flux controlling member 3 has a square column shape, and supports light flux controlling member body 26 on board 4. End face (bottom end face) 27a of supporting part 27 of light flux controlling member 3 is fixed to board 4 (for example, by bonding, screwing, or pressing). Central line L1 (see FIGS. 45A and 46A) of light flux controlling member 3 is located on straight line L2 (see FIG. 45B) connecting the centers of two light emitting elements 2 arranged in parallel.

Light flux controlling member body 26 has the same shape as cap 8 of light flux controlling member 3 according to Embodiment 13 (see FIGS. 31A and 45A), except that it is formed as a unified body with supporting part 27 at the center of inner surface 10. Inner surface 10 and outer surface 14 of light flux controlling member body 26 does not have curvature in the first direction. That is, inner surface 10 and outer surface 14 of light flux controlling member body 26 do not affect the light distribution characteristics of emitted light of light emitting elements 2 in the first direction. On the other hand, inner surface 10 and outer surface 14 of light flux controlling member body 26 have curvature in the second direction. Therefore, inner surface 10 of light flux controlling member body 26 can change the light distribution characteristics of emitted light of light emitting elements 2 to desired light distribution characteristics in the second direction by controlling the reflecting direction of light from light emitting elements 2.

Transflective film 13 is formed on inner surface 10 of light flux controlling member body 26 except for a portion in which supporting part 27 is formed, similarly to cap 8 of light flux controlling member 3 according to Embodiment 13 . Outer surface 14 of light flux controlling member body 26 has a double-sided relation with inner surface 10, and is formed similarly to outer surface 14 of cap 8 of light flux controlling member 3 according to Embodiment 13.

As shown in FIG. 45A, in illumination device 1 according to Embodiment 15, opening end 22 of cover 21 having a D-shaped cross-section is fixed to the outer peripheral part of board 4, and plural light emitting elements 2 and light flux controlling member 3 are received in the space between cover 21 and board 4.

Figure 47:
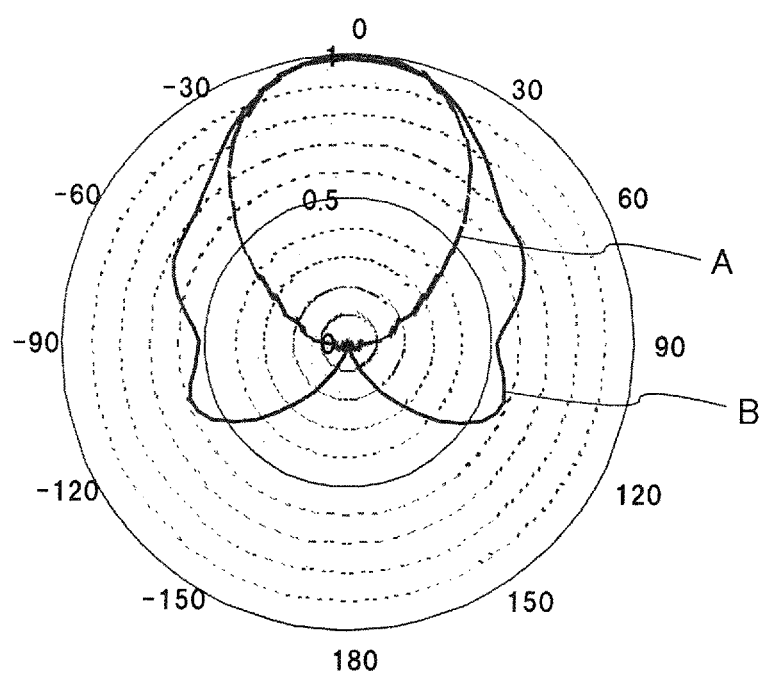
FIG. 47 is a graph illustrating the light distribution characteristics of the illumination device according to Embodiment 15 when optical reflectance of the transflective film is 50%.
Figure 48:
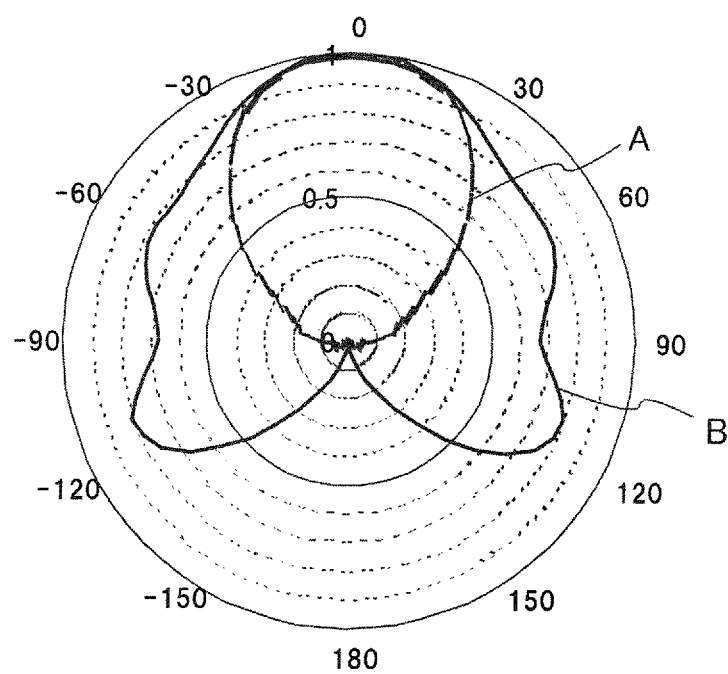
FIG. 48 is a graph illustrating the light distribution characteristics of the illumination device according to Embodiment 15 when optical reflectance of the transflective film is 60%.
Figure 49:
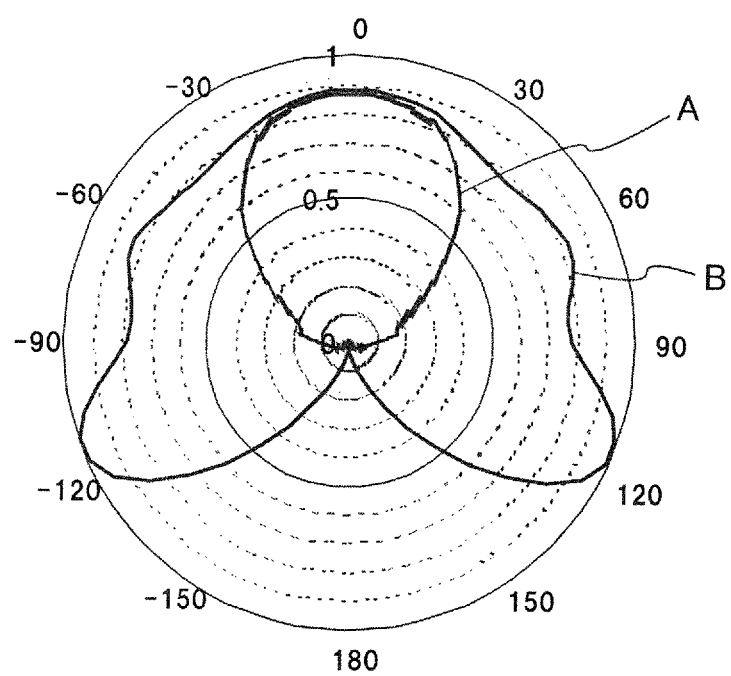
FIG. 49 is a graph illustrating the light distribution characteristics of the illumination device according to Embodiment 15 when optical reflectance of the transflective film is 70%.
Figure 50:
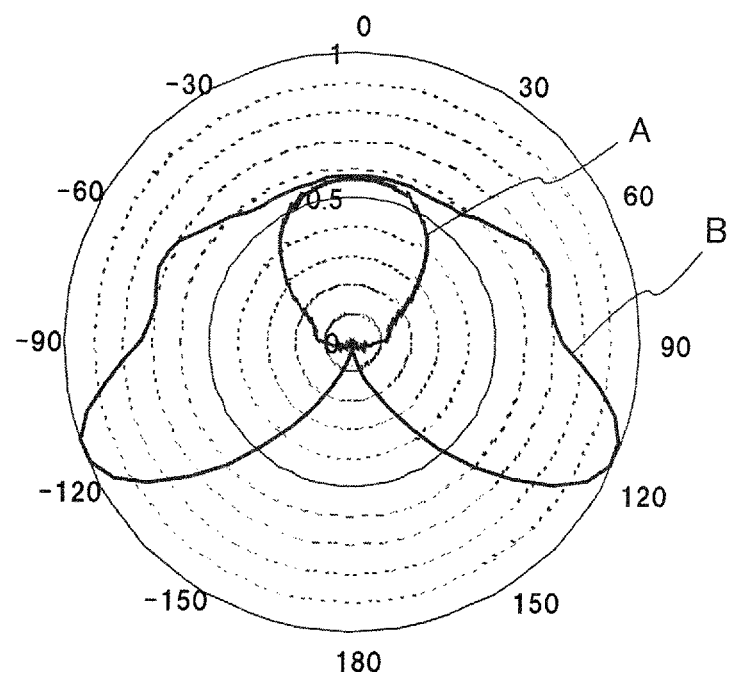
FIG. 50 is a graph illustrating the light distribution characteristics of the illumination device according to Embodiment 15 when optical reflectance of the transflective film is 80%.

FIGS. 47 to 50 are graphs illustrating the light distribution characteristics of illumination device 1 according to Embodiment 15 . FIG. 47 is a graph illustrating the light distribution characteristics of illumination device 1 when the optical reflectance of transflective film 13 is 50%. FIG. 48 is a graph illustrating the light distribution characteristics of illumination device 1 when the optical reflectance of transflective film 13 is 60%. FIG. 49 is a graph illustrating the light distribution characteristics of illumination device 1 when the optical reflectance of transflective film 13 is 70%. FIG. 50 is a graph illustrating the light distribution characteristics of illumination device 1 when the optical reflectance of transflective film 13 is 80%.

As indicated by curve B in FIGS. 47 to 50, illumination device 1 according to Embodiment 15 exhibits almost the same light distribution characteristics as the light distribution characteristics (see FIGS. 34 to 37) of illumination device 1 according to Embodiment 13 and it is thus possible to obtain the same advantages as those of illumination device 1 according to Embodiment 13.

(Embodiment 16)

Figure 51A:
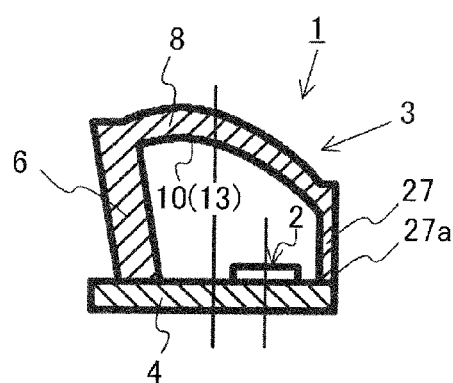
FIG. 51A is a cross-sectional view of the illumination device according to Embodiment 16 taken along a second direction and FIG. 51B is a plan view of a board on which plural light emitting elements are mounted.
Figure 51B:
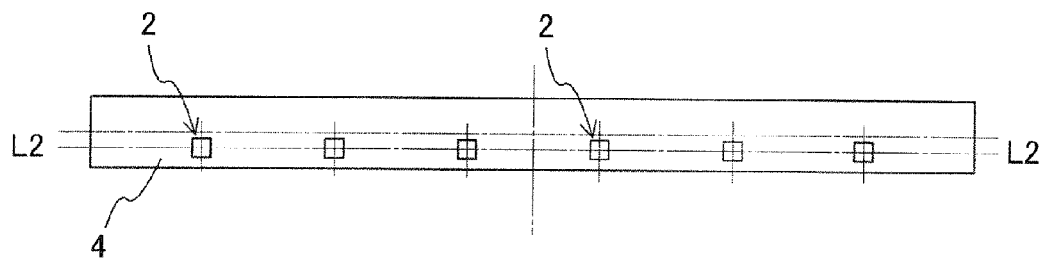

FIG. 51A is a cross-sectional view (transverse cross-section) of illumination device 1 according to Embodiment 16 taken along the second direction. FIG. 51B is a plan view of board 4 on which plural light emitting elements 2 are mounted. FIG. 52A is a bottom view of light flux controlling member 3 according to Embodiment 16 and FIG. 52B is a plan view of light flux controlling member 3 according to Embodiment 16. FIG. 52C is a cross-sectional view (cross-sectional view in the second direction; corresponding to FIG. 51A) taken along line L-L of FIG. 52B and FIG. 52D is a cross-sectional view (cross-sectional view in the first direction) taken along line M-M of FIG. 52B. The same elements as those of illumination device 1 and light flux controlling member 3 according to Embodiment 13 shown in FIGS. 30 to 32 will not be described.

As shown in FIGS. 51A and 52, light flux controlling member 3 has a shape in which light flux controlling member 3 according to Embodiment 13 is divided into two halves by central line L1 (see FIG. 31A). Inner surface 10 and outer surface 14 of cap 8 does not have curvature in the first direction. That is, inner surface 10 and outer surface 14 of cap 8 do not affect the light distribution characteristics of emitted light of light emitting elements 2 in the first direction. On the other hand, inner surface 10 and outer surface 14 of cap 8 have curvature in the second direction. Therefore, inner surface 10 of cap 8 can change the light distribution characteristics of emitted light of light emitting elements 2 to desired light distribution characteristics in the second direction by controlling the reflecting direction of light from light emitting elements 2.

Supporting part 27 is disposed between the dividing surface and board 4. Supporting part 27 of light flux controlling member 3 has a square column shape, and supports cap 8 on board 4. End face (bottom end face) 27a of supporting part 27 of light flux controlling member 3 is fixed to board 4 (for example, by bonding, screwing, or pressing).

Figure 53:
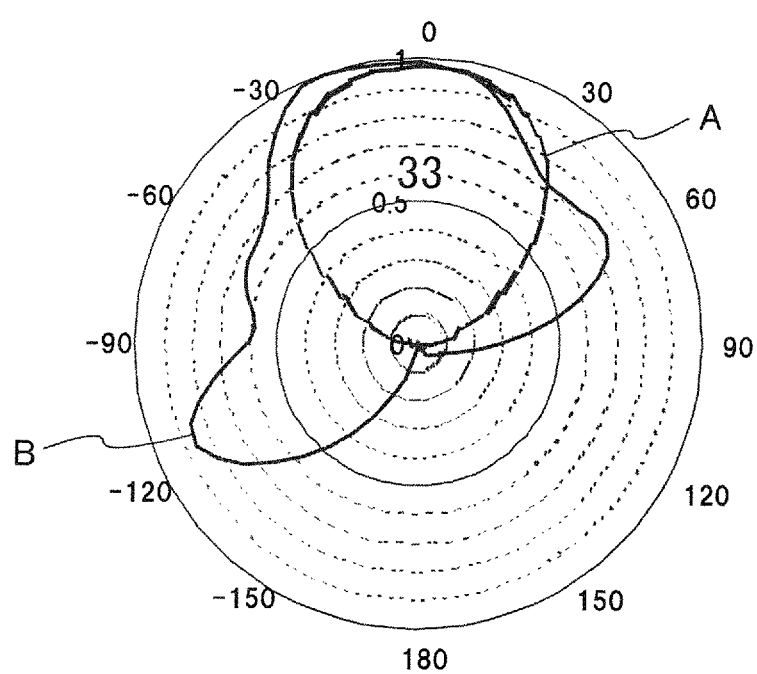
FIG. 53 is a graph illustrating the light distribution characteristics of the illumination device according to Embodiment 16 when optical reflectance of the transflective film is 50%.
Figure 54:
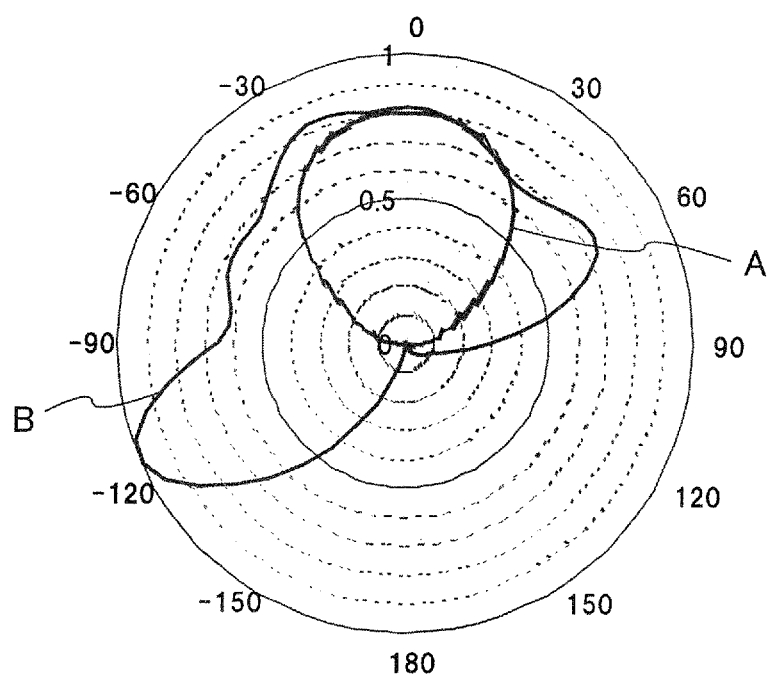
FIG. 54 is a graph illustrating the light distribution characteristics of the illumination device according to Embodiment 16 when optical reflectance of the transflective film is 60%.
Figure 55:
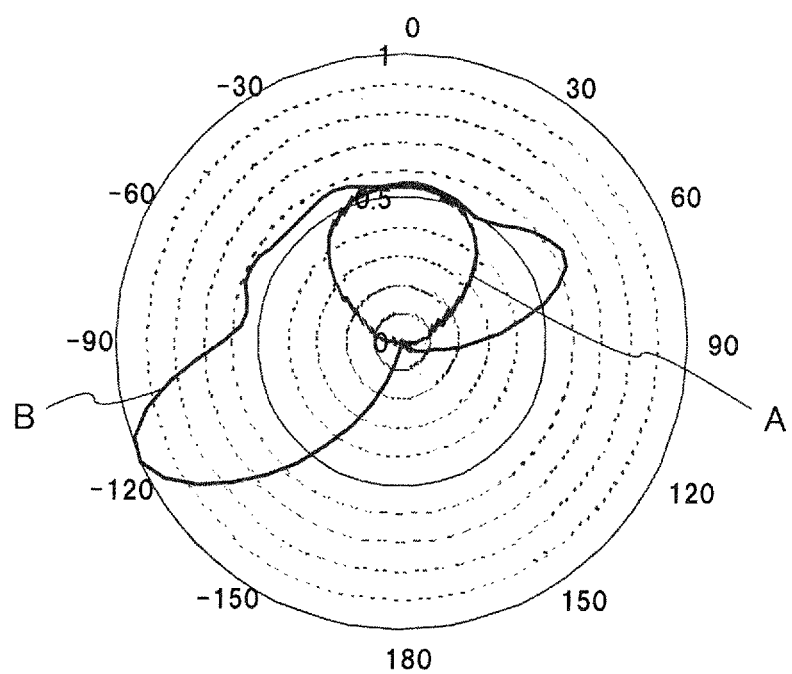
FIG. 55 is a graph illustrating the light distribution characteristics of the illumination device according to Embodiment 16 when optical reflectance of the transflective film is 70%.
Figure 56:
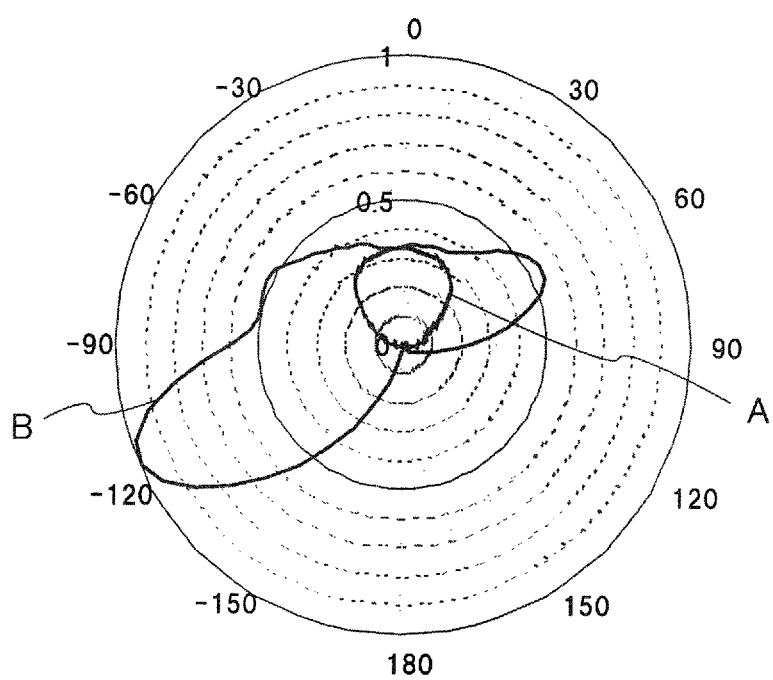
FIG. 56 is a graph illustrating the light distribution characteristics of the illumination device according to Embodiment 16 when optical reflectance of the transflective film is 80%.

FIGS. 53 to 56 are graphs illustrating the light distribution characteristics of illumination device 1 according to Embodiment 16 . FIG. 53 is a graph illustrating the light distribution characteristics of illumination device 1 when the optical reflectance of transflective film 13 is 50%. FIG. 54 is a graph illustrating the light distribution characteristics of illumination device 1 when the optical reflectance of transflective film 13 is 60%. FIG. 55 is a graph illustrating the light distribution characteristics of illumination device 1 when the optical reflectance of transflective film 13 is 70%. FIG. 56 is a graph illustrating the light distribution characteristics of illumination device 1 when the optical reflectance of transflective film 13 is 80%.

As indicated by curve B in FIGS. 53 to 56, illumination device 1 according to Embodiment 16 can realize deflected light distribution of emitting light backward from only sidewall 6 side.

(Embodiment 17)

Figure 57:
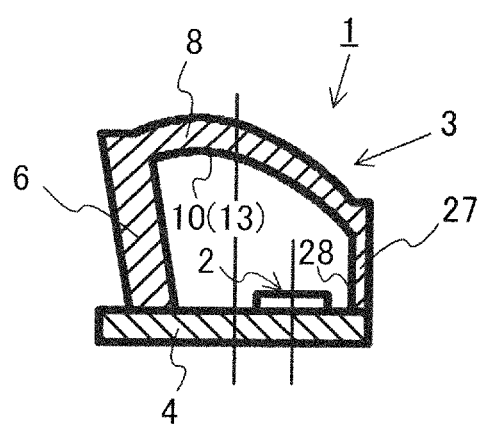
FIG. 57 is a cross-sectional view of an illumination device according to Embodiment 17 taken along a second direction.

FIG. 57 is a cross-sectional view (transverse cross-section) of illumination device 1 according to Embodiment 17 taken along the second direction. Illumination device 1 according to Embodiment 17 is the same as illumination device 1 according to Embodiment 16, except that the inner surface of supporting part 27 is formed of mirror surface 28. The same elements as those of illumination device 1 and light flux controlling member 3 according to Embodiment 16 shown in FIGS. 51 and 52 will not be described.

As shown in FIG. 57, the inner surface of supporting part 27 of light flux controlling member 3 is formed of mirror surface 28 (see FIG. 51A). Therefore, light emitted from light emitting element 2 to supporting part 27 is reflected toward sidewall 6 or cap 8 by mirror surface 28.

Figure 58:
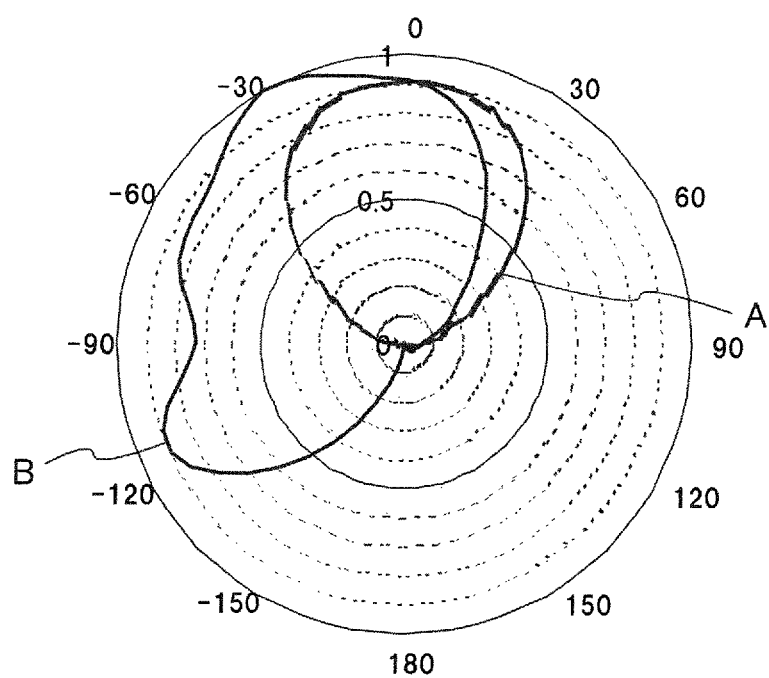
FIG. 58 is a graph illustrating the light distribution characteristics of the illumination device according to Embodiment 17 when optical reflectance of the transflective film is 50%.
Figure 59:
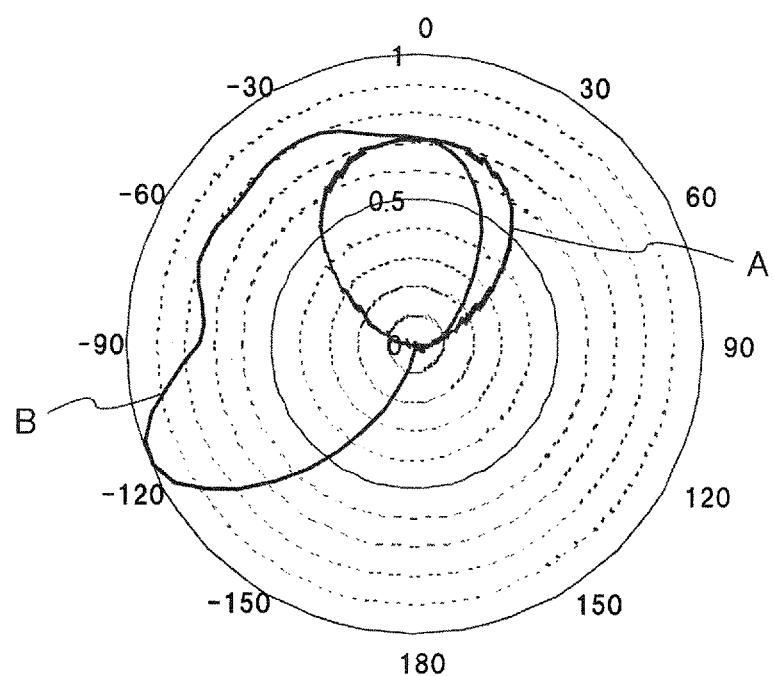
FIG. 59 is a graph illustrating the light distribution characteristics of the illumination device according to Embodiment 17 when optical reflectance of the transflective film is 60%.
Figure 60:
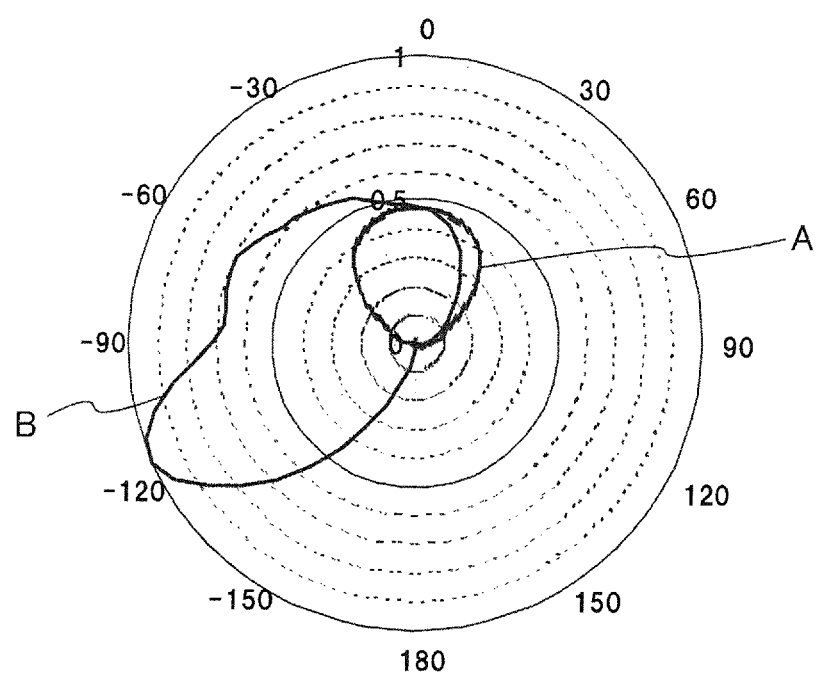
FIG. 60 is a graph illustrating the light distribution characteristics of the illumination device according to Embodiment 17 when optical reflectance of the transflective film is 70%.
Figure 61:
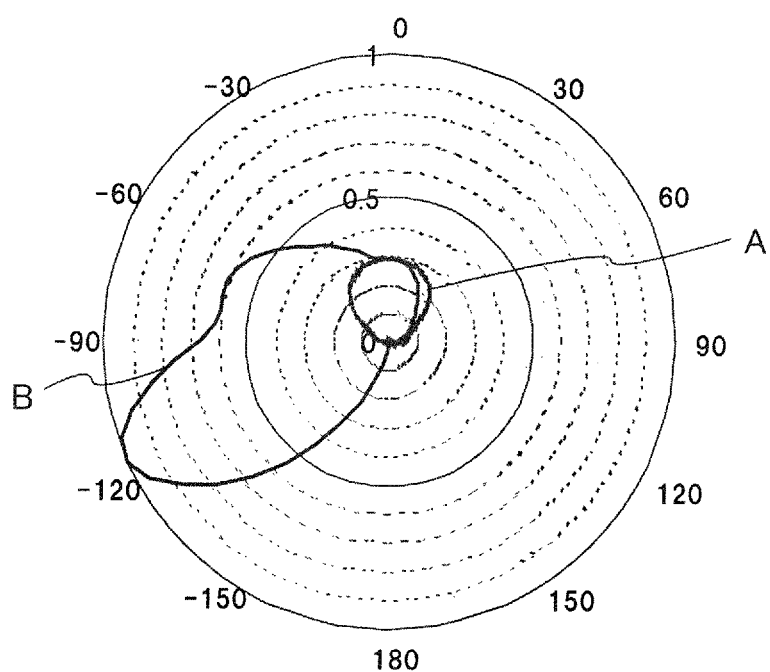
FIG. 61 is a graph illustrating the light distribution characteristics of the illumination device according to Embodiment 17 when optical reflectance of the transflective film is 80%.

FIGS. 58 to 61 are graphs illustrating the light distribution characteristics of illumination device 1 according to Embodiment 17 . FIG. 58 is a graph illustrating the light distribution characteristics of illumination device 1 when the optical reflectance of transflective film 13 is 50%. FIG. 59 is a graph illustrating the light distribution characteristics of illumination device 1 when the optical reflectance of transflective film 13 is 60%. FIG. 60 is a graph illustrating the light distribution characteristics of illumination device 1 when the optical reflectance of transflective film 13 is 70%. FIG. 61 is a graph illustrating the light distribution characteristics of illumination device 1 when the optical reflectance of transflective film 13 is 80%.

As indicated by curve B in FIGS. 58 to 61, illumination device 1 according to Embodiment 17 can realize more deflected light distribution in comparison with illumination device 1 according to Embodiment 16.

(Embodiment 18)

Configuration of Illumination device

Figure 62:
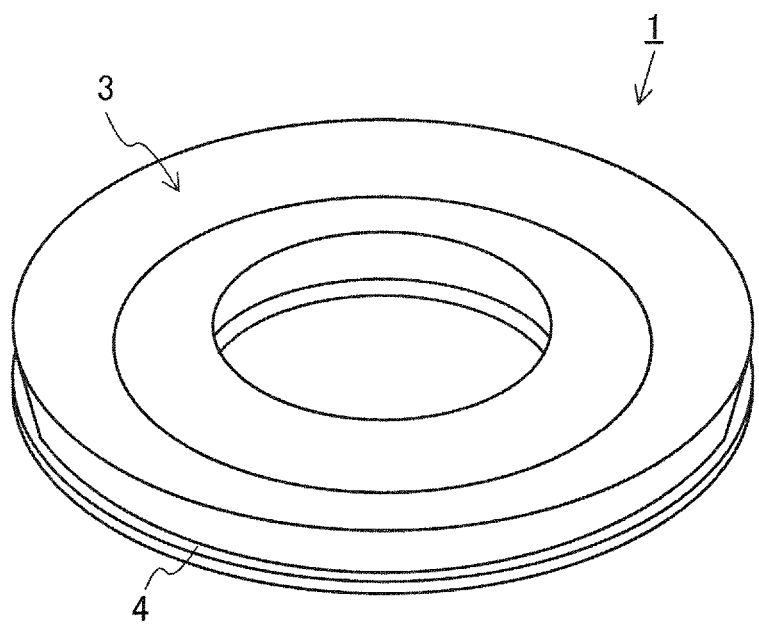
FIG. 62 is a perspective view of an illumination device according to Embodiment 18.

FIG. 62 is a perspective view of illumination device 1 according to Embodiment 18 of the invention.

As shown in FIG. 62, illumination device 1 includes light emitting elements 2, light flux control member 3, and board 4. In the description of Embodiment 18, the peripheral direction of ring-shaped board 4 is defined as a first direction and the diameter direction of ring-shaped board 4 is defined as a second direction. The first direction and the second direction are perpendicular to each other.

Figure 63A:
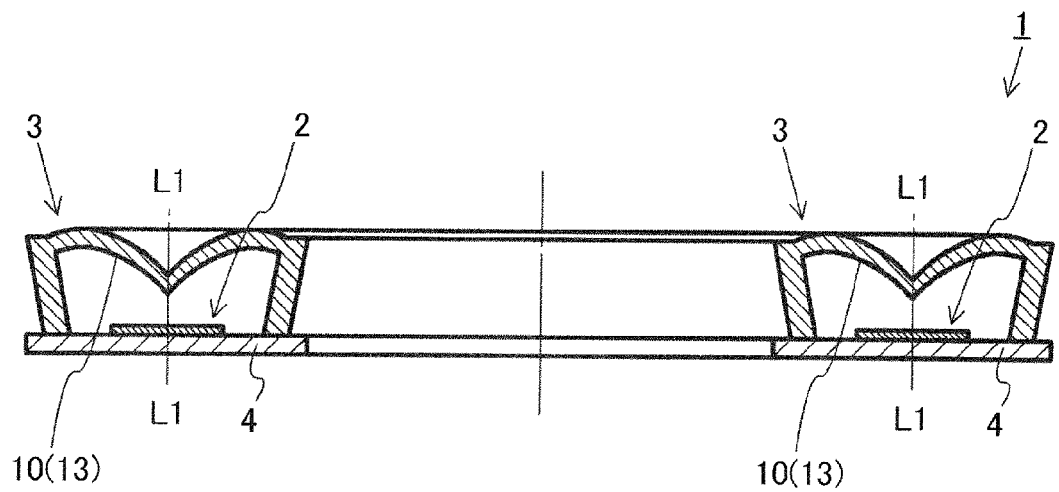
FIG. 63A is a cross-sectional view of the illumination device according to Embodiment 18 taken along a second direction and FIG. 63B is a plan view of a board on which plural light emitting elements are mounted.
Figure 63B:
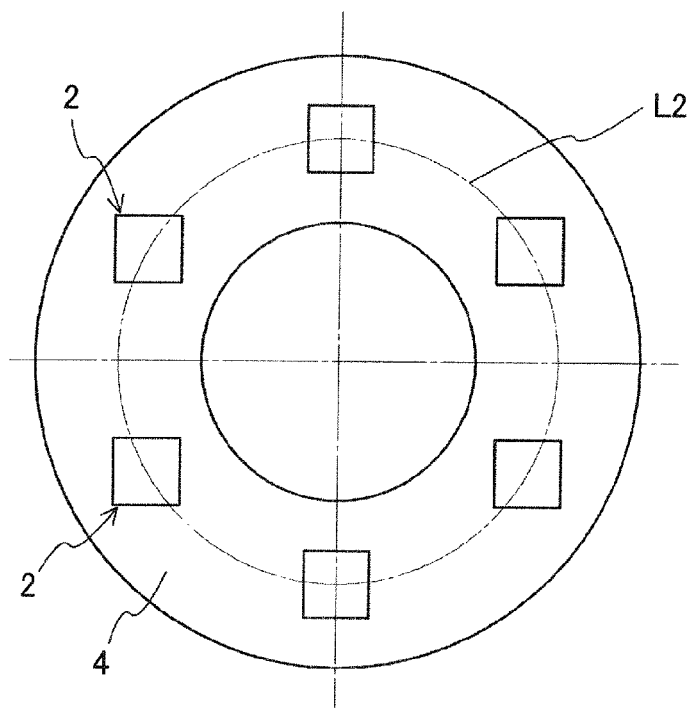

FIG. 63A is a cross-sectional view (transverse cross-section) in the second direction of illumination device 1. FIG. 63B is a plan view of board 4 on which plural light emitting elements 2 are mounted.

Illumination device 1 is used instead of a circular fluorescent lamp. As shown in FIGS. 63A and 63B, illumination device 1 emits light from plural light emitting elements 2 arranged in a line in the first direction (the peripheral direction) through light flux controlling member 3. One end 5 of light flux controlling member 3 is fixed to board 4 on which plural light emitting elements 2 are mounted with an adhesive. Central line L1 (see FIGS. 63A and 64A) of light flux controlling member 3 is located in straight line L2 (see FIG. 63B) connecting the centers of light emitting elements 2.

Configuration of Light Flux Controlling Member

Figure 64A:
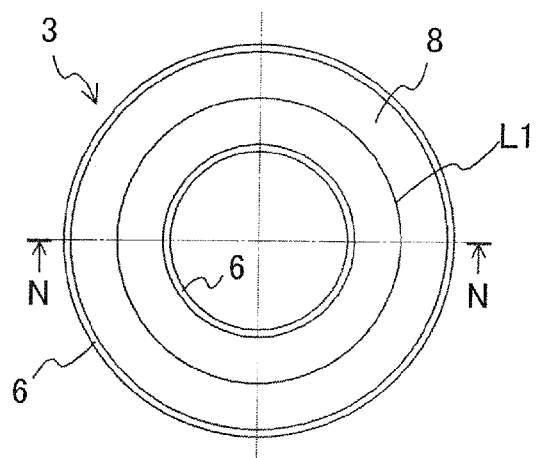
FIG. 64A is a plan view of a light flux controlling member of the illumination device according to Embodiment 18.
Figure 64B:
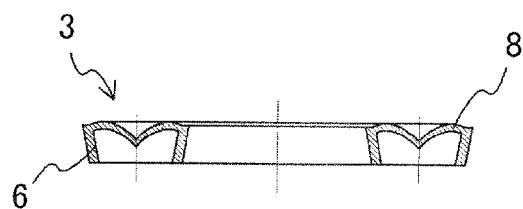
FIG. 64B is a cross-sectional view taken along line N-N of FIG. 64A.
Figure 64C:
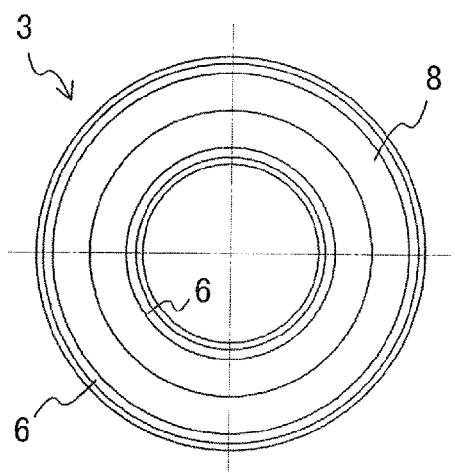
FIG. 64C is a bottom view of the light flux controlling member of the illumination device according to Embodiment 18.

FIG. 64A is a plan view of light flux controlling member 3, FIG. 64B is a cross-sectional view (a cross-sectional view in the second direction; corresponding to FIG. 63A) taken along line N-N of FIG. 64A, and FIG. 64C is a bottom view of light flux controlling member 3.

As shown in FIGS. 64A to 64C, light flux controlling member 3 has a shape obtained by connecting ends in the long-axis direction of light flux controlling member 3 according to Embodiment 13 to each other to form a ring shape. Inner surface 10 and outer surface 14 of cap 8 does not have curvature in the first direction (the peripheral direction). That is, inner surface 10 and outer surface 14 of cap 8 do not affect the light distribution characteristics of emitted light of light emitting elements 2 in the first direction (the peripheral direction). On the other hand, inner surface 10 and outer surface 14 of cap 8 have curvature in the second direction (the diameter direction). Therefore, inner surface 10 of cap 8 can change the light distribution characteristics of emitted light of light emitting elements 2 to desired light distribution characteristics in the second direction (the diameter direction) by controlling the reflecting direction of light from light emitting elements 2.

Figure 65:
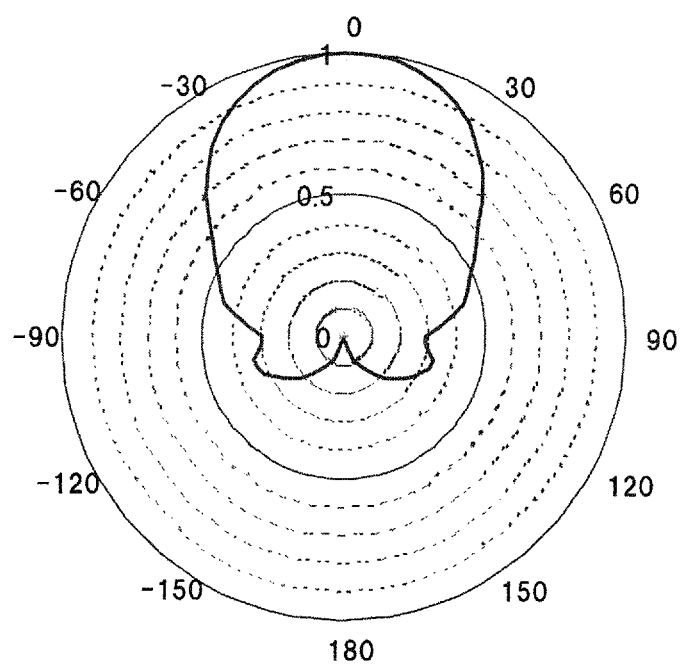
FIG. 65 is a graph illustrating the light distribution characteristics of the illumination device according to Embodiment 18 when optical reflectance of the transflective film is 50%.
Figure 66:
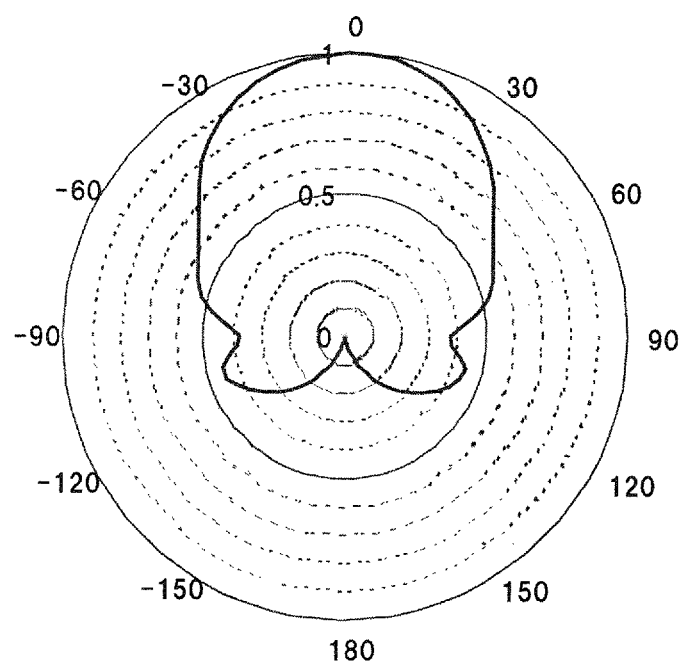
FIG. 66 is a graph illustrating the light distribution characteristics of the illumination device according to Embodiment 18 when optical reflectance of the transflective film is 60%.
Figure 67:
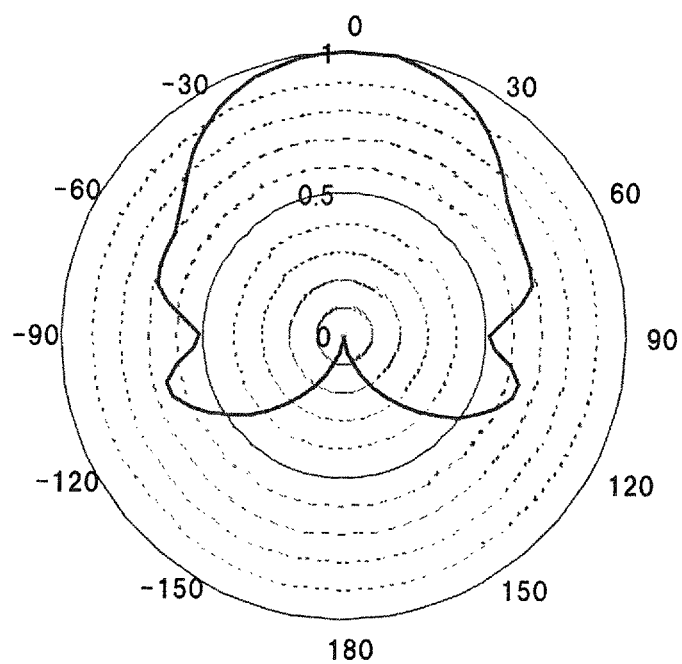
FIG. 67 is a graph illustrating the light distribution characteristics of the illumination device according to Embodiment 18 when optical reflectance of the transflective film is 70%.
Figure 68:
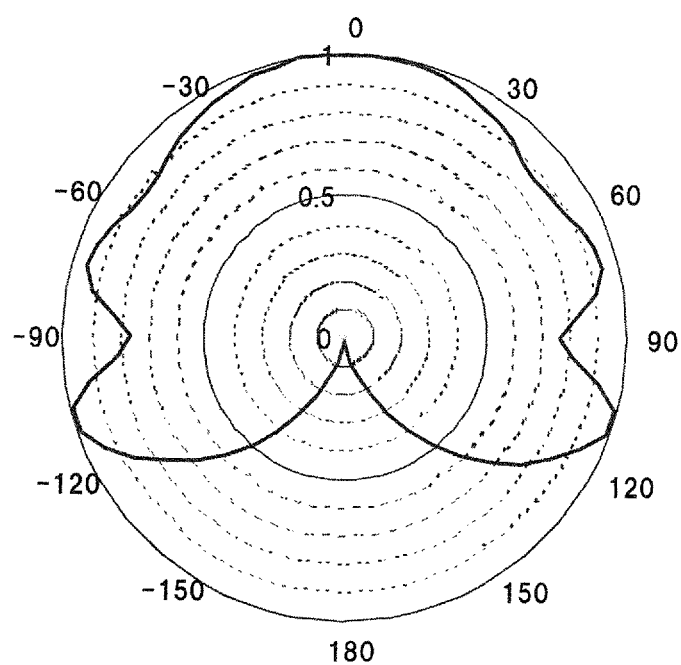
FIG. 68 is a graph illustrating the light distribution characteristics of the illumination device according to Embodiment 18 when optical reflectance of the transflective film is 80%.

FIGS. 65 to 68 are graphs illustrating the light distribution characteristics of illumination device 1 according to Embodiment 18 . FIG. 65 is a graph illustrating the light distribution characteristics of illumination device 1 when the optical reflectance of transflective film 13 is 50%. FIG. 66 is a graph illustrating the light distribution characteristics of illumination device 1 when the optical reflectance of transflective film 13 is 60%. FIG. 67 is a graph illustrating the light distribution characteristics of illumination device 1 when the optical reflectance of transflective film 13 is 70%. FIG. 68 is a graph illustrating the light distribution characteristics of illumination device 1 when the optical reflectance of transflective film 13 is 80%.

As shown in FIGS. 65 to 68, illumination device 1 according to Embodiment 18 exhibits almost the same light distribution characteristics as the light distribution characteristics (see FIGS. 34 to 37) of illumination device 1 according to Embodiment 13 and it is thus possible to obtain the same advantages as those of illumination device 1 according to Embodiment 13.

(Embodiment 19)

Configuration of Illumination Device

Figure 69A:
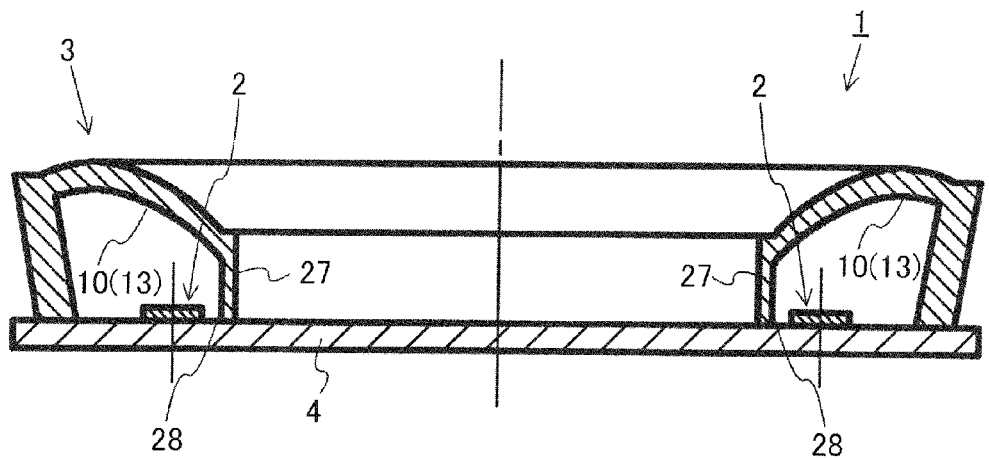
FIG. 69A is a cross-sectional view of the illumination device according to Embodiment 19 taken along a second direction and FIG. 69B is a plan view of a board on which plural light emitting elements are mounted.
Figure 69B:
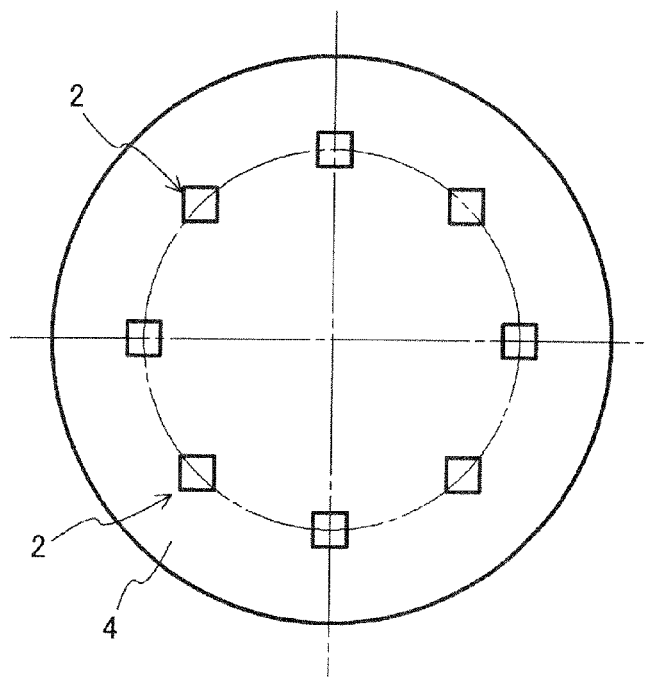

FIG. 69A is a cross-sectional view (transverse cross-section) of illumination device 1 according to Embodiment 19 taken along the second direction. FIG. 69B is a plan view of board 4 on which plural light emitting elements 2 are mounted.

As shown in FIGS. 69A and 69B, illumination device 1 includes light emitting elements 2, light flux control member 3, and board 4. In the description of Embodiment 19, the peripheral direction of ring-shaped board 4 is defined as a first direction and the diameter direction of ring-shaped board 4 is defined as a second direction. The first direction and the second direction are perpendicular to each other.

Illumination device 1 is used instead of a circular fluorescent lamp. As shown in FIGS. 69A and 69B, illumination device 1 emits light from plural light emitting elements 2 arranged in a line in the first direction (the peripheral direction) through light flux controlling member 3. One end 5 of light flux controlling member 3 is fixed to board 4 on which plural light emitting elements 2 are mounted with an adhesive.

Configuration of Light Flux Controlling Member

Figure 70A:
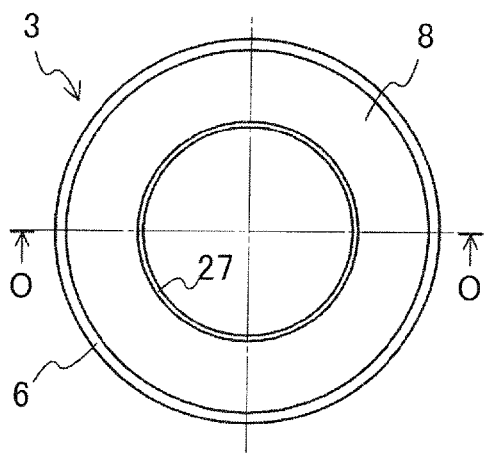
FIG. 70A is a plan view of a light flux controlling member of the illumination device according to Embodiment 19.
Figure 70B:
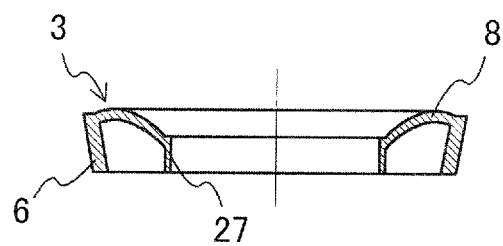
FIG. 70B is a cross-sectional view taken along line O-O of FIG. 70A.
Figure 70C:
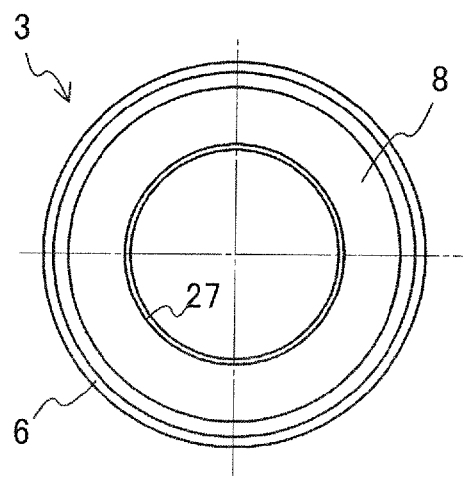
FIG. 70C is a bottom view of the light flux controlling member of the illumination device according to Embodiment 19.

FIG. 70A is a plan view of light flux controlling member 3, FIG. 70B is a cross-sectional view (a cross-sectional view in the second direction; corresponding to FIG. 69A) taken along line O-O of FIG. 70A, and FIG. 70C is a bottom view of light flux controlling member 3.

As shown in FIGS. 70A to 70C, light flux controlling member 3 has a shape obtained by connecting ends in the long-axis direction of light flux controlling member 3 according to Embodiment 17 to each other to form a ring shape. Inner surface 10 and outer surface 14 of cap 8 does not have curvature in the first direction (the peripheral direction). That is, inner surface 10 and outer surface 14 of cap 8 do not affect the light distribution characteristics of emitted light of light emitting elements 2 in the first direction (the peripheral direction). On the other hand, inner surface 10 and outer surface 14 of cap 8 have curvature in the second direction (the diameter direction). Therefore, inner surface 10 of cap 8 can change the light distribution characteristics of emitted light of light emitting elements 2 to desired light distribution characteristics in the second direction (the diameter direction) by controlling the reflecting direction of light from light emitting elements 2.

Figure 71:
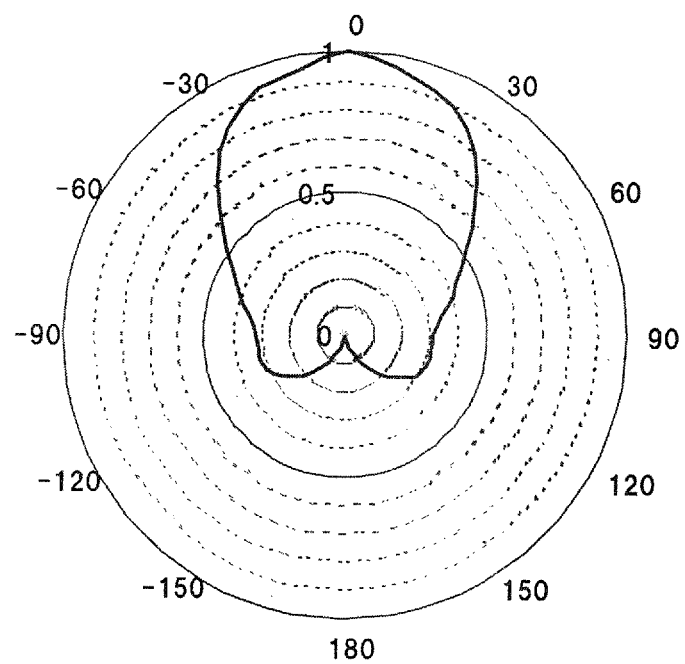
FIG. 71 is a graph illustrating the light distribution characteristics of the illumination device according to Embodiment 19 when optical reflectance of the transflective film is 50%.
Figure 72:
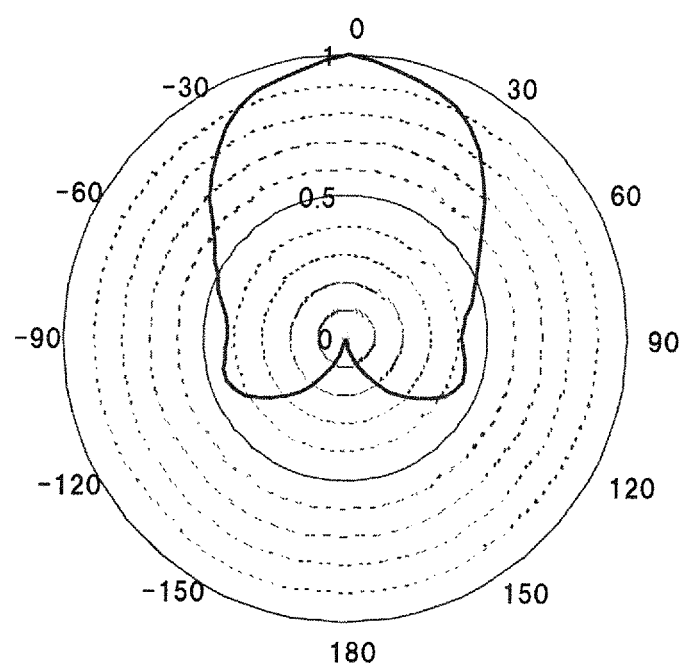
FIG. 72 is a graph illustrating the light distribution characteristics of the illumination device according to Embodiment 19 when optical reflectance of the transflective film is 60%.
Figure 73:
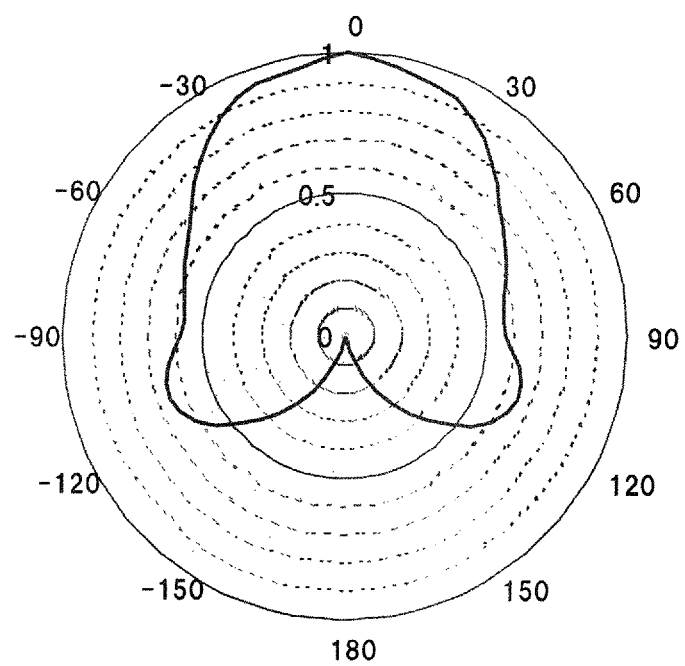
FIG. 73 is a graph illustrating the light distribution characteristics of the illumination device according to Embodiment 19 when optical reflectance of the transflective film is 70%.
Figure 74:
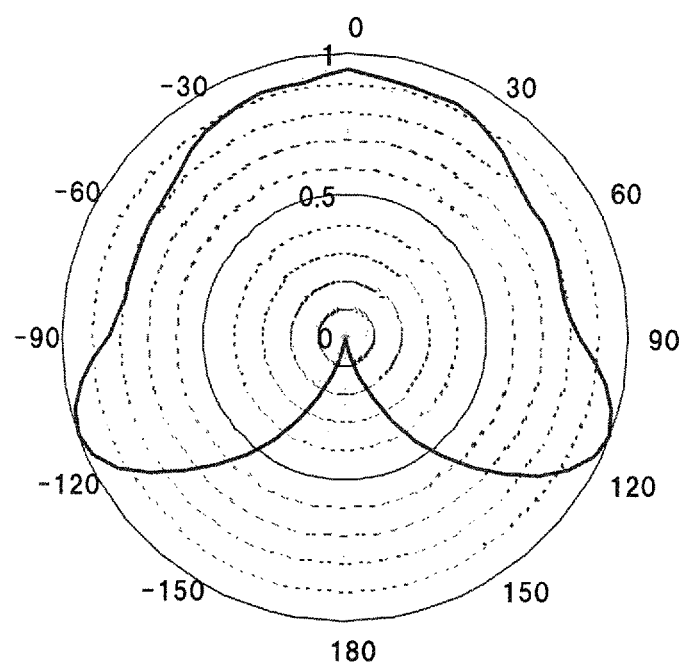
FIG. 74 is a graph illustrating the light distribution characteristics of the illumination device according to Embodiment 19 when optical reflectance of the transflective film is 80%.

FIGS. 71 to 74 are graphs illustrating the light distribution characteristics of illumination device 1 according to Embodiment 19 . FIG. 71 is a graph illustrating the light distribution characteristics of illumination device 1 when the optical reflectance of transflective film 13 is 50%. FIG. 72 is a graph illustrating the light distribution characteristics of illumination device 1 when the optical reflectance of transflective film 13 is 60%. FIG. 73 is a graph illustrating the light distribution characteristics of illumination device 1 when the optical reflectance of transflective film 13 is 70%. FIG. 74 is a graph illustrating the light distribution characteristics of illumination device 1 when the optical reflectance of transflective film 13 is 80%.

As shown in FIGS. 71 to 74, illumination device 1 according to Embodiment 19 exhibits almost the same light distribution characteristics as the light distribution characteristics (see FIGS. 34 to 37) of illumination device 1 according to Embodiment 13 and it is thus possible to obtain the same advantages as those of illumination device 1 according to Embodiment 13.

(Modified Example)

In the above-mentioned embodiments, transflective film 13 is formed on inner surface 10 of light flux controlling member 3. However, the invention is not limited to the embodiments, but transflective film 13 may be formed on outer surface 14 of light flux controlling member 3. That is, transflective film 13 of light flux controlling member 3 according to the invention can be formed on the surface (any one of inner surface 10 and outer surface 14) intersecting a part of emitted light out of emitted light of light emitting element 2, whereby it is possible to obtain desired light distribution characteristics. Here, in order to reduce the interface in an optical path of reflected light to suppress optical loss, it is preferable that transflective film 13 be formed on inner surface 10 of light flux controlling member 3. Transflective film 13 formed on inner surface 10 can be suppressed from damage and stripping due to handling of light flux controlling member 3 or the like.

The disclosures of Japanese Patent Application No. 2010-155745, filed on Jul. 8, 2010, Japanese Patent Application No. 2011-047704, filed on Mar. 4, 2011, Japanese Patent Application No. 2011-083719, filed on Apr. 5, 2011, and Japanese Patent Application No. 2011-129749, filed on Jun. 10, 2011, including the specification, drawings, and abstract, are incorporated herein by reference in its entirety.

Industrial Applicability

The light flux controlling member and the illumination device having the light flux controlling member according to the invention are not limited to the case where they are used instead of an incandescent lamp or a fluorescent lamp, but can be widely used as a part of a chandelier or an indirect illumination device, by determining the reflectance of the transflective film of the light flux controlling member to obtain desired light distribution characteristics.

Reference Signs List
1 Illumination device
2 Light emitting element (for example, LED)
3 Light flux controlling member
4 Board
5 One end
6 Sidewall (transmissive part)
7 The other end
8: cap (transflective part)
10 Inner surface
11 Central part
12 Outer circumference
13 Transflective film
14 Outer surface
17 Inner surface (inner peripheral surface)
18 Outer surface (outer peripheral surface)
21 Cover
22 Opening end
27 Supporting part
27a End face (bottom end face)
28 Mirror surface
100 LED
101 Light direction converting element
102B surface
103E surface
104D surface
105C surface
L Optical axis (center of light flux)
L1 Central axis or central line

The invention claimed is:

1. A light flux controlling member comprising:
a cap that is to be disposed over one or two or more light emitting elements disposed on a board with an air layer interposed between the cap and the one or two or more light emitting elements, the cap being configured to intersect an optical axis of the light-emitting element; and
a sidewall configured to extend from an outer rim of the cap to the board,
wherein:
an inner surface of the cap is a curved surface of which a central part is located closer to the light emitting element than an outer circumference of the curved surface is;
the inner surface of the cap is covered with a transflective film;
the transflective film is configured to reflect a part of light from the light emitting element to the sidewall and transmit the other part of the light from the light emitting element;
an outer surface of the cap is configured to emit light incident through the transflective film to the outside;
the sidewall is configured to emit light reflected by the transflective film and arriving at the inner surface of the sidewall and light directly arriving at the inner surface of the sidewall from the light emitting element from the outer surface of the sidewall to the outside; and
the inner surface of the sidewall is not covered with the transflective film.

2. The light flux controlling member according to claim 1, wherein:
the cap is to be disposed so that the central axis thereof is located coaxial with the center of a light flux of the one or two or more light emitting elements.

3. The light flux controlling member according to claim 2, wherein:
the inner surface of the cap is aspheric.

4. The light flux controlling member according to claim 1, wherein:
the outer surface of the sidewall is a light diffusing surface.

5. The light flux controlling member according to claim 1, wherein:
the outer surface of the cap is a light diffusing surface.

6. The light flux controlling member according to claim 1, wherein:
the cap and the sidewall are formed of a material having a light scattering function.

7. The light flux controlling member according to claim 1, wherein:
the light flux controlling member is rotationally symmetric.

8. The light flux controlling member according to claim 7, wherein:
the sidewall is formed of a different member from the cap.

9. An illumination device comprising:
a light emitting element; and
the light flux controlling member according to claim 1 for controlling a distribution of light emitted from the light emitting element.

* * * * *